US005501744A

United States Patent [19]
Albright et al.

[11] Patent Number: 5,501,744
[45] Date of Patent: Mar. 26, 1996

[54] PHOTOVOLTAIC CELL HAVING A P-TYPE POLYCRYSTALLINE LAYER WITH LARGE CRYSTALS

[75] Inventors: Scot P. Albright, Lakewood, Colo.; Rhodes R. Chamberlin, El Paso, Tex.

[73] Assignee: Photon Energy, Inc., Golden, Colo.

[21] Appl. No.: 274,574

[22] Filed: Jul. 12, 1994

Related U.S. Application Data

[63] Continuation of Ser. No. 95,599, Jul. 21, 1993, abandoned, which is a continuation-in-part of Ser. No. 819,882, Jan. 13, 1992, Pat. No. 5,279,678.

[51] Int. Cl.⁶ .................... H01L 31/072; H01L 31/0368; H01L 31/0392
[52] U.S. Cl. .......................... 136/258; 136/244; 136/260; 136/264; 437/4; 437/5; 257/51; 257/64; 257/75; 257/184
[58] Field of Search ............................. 136/244, 258 PC, 136/260, 264; 257/51, 64, 75, 184

[56] References Cited

U.S. PATENT DOCUMENTS

| | | | |
|---|---|---|---|
| 4,035,197 | 7/1977 | Raychaudhuri | 136/255 |
| 4,207,119 | 6/1980 | Tyan | 136/258 PC |
| 4,243,432 | 1/1981 | Jordan et al. | 136/244 |
| 4,251,286 | 2/1981 | Barnett | 136/260 |
| 4,260,427 | 4/1981 | Fulop et al. | 136/255 |
| 4,313,022 | 1/1982 | Jordan et al. | 136/244 |
| 4,315,096 | 2/1982 | Tyan et al. | 136/244 |
| 4,345,107 | 8/1982 | Fulop et al. | 136/255 |
| 4,362,896 | 12/1982 | Singh | 136/258 |
| 4,518,815 | 5/1985 | Yamazaki | 136/244 |
| 4,532,372 | 7/1985 | Nath et al. | 136/256 |
| 4,544,797 | 10/1985 | Hewig | 136/249 |
| 4,598,306 | 7/1986 | Nath et al. | 357/30 |
| 4,611,091 | 9/1986 | Choudary et al. | 136/260 |

(List continued on next page.)

OTHER PUBLICATIONS

A. E. Tsurkan et al, *Solar Energy Materials*, vol. 18, pp. 61–64 (Dec. 1988).
A. Rohatgi et al, *Solar Cells*, vol. 30, pp. 109–122 (May 1991).
"CdS/CdTe Solar Cells by the Screen-Printing-Sintering Technique: Fabrication, Photovoltaic Properties and Applications", Solar Cells, pp. 89–105, 1988, Ikegami.
"Large-Area CdS/CdTe Photovoltaic Cells", Solar Cells, vol. 23, pp. 107–113, 1988, Jordan et al.
"Properties of Screen-Printed and Sintered CdTe Film Formed on a CdS Sintered Film", Technical Digest of the International PVSEC-3, pp. 695–698, 1987, Matsumoto et al.
"Preparation of Low Resistance Contact Electrode in Screen Printed CdS/CdTe Solar Cell", Japanese Journal of Applied Physics, pp. 1828–1831, Dec., 1983, Kuribayashi et al.
"Analysis of Post Deposition Processing for CdTe/CdS Thin Film Solar Cells", Solar Cells, pp. 527–535, 1991, McCandless et al.
"Screen Printed Thin Film CdS/CdTe Solar Cell", Japanese Journal of Applied Physics, pp. 703–712, Apr., 1980, Nakayama et al.
"Effect of Oxygen on Thin-Film CdS/CdTe Solar Cells", IEEE, pp. 840–845, Oct., 1984, by Tyan et al.
"All Screen Printed CdS/CdTe Solar Cell", IEEE, pp. 801–804, 1982, by Uda et al.
"Effect of Resistivity of CdS Sintered Film on Photovoltaic Properties of Screen-Printed CdS/CdTe Solar Cell", Japanese Journal of Applied Physics, pp. 1832–1836, Dec., 1983, by Uda et al.

*Primary Examiner*—Aaron Weisstuch
*Attorney, Agent, or Firm*—Sheridan Ross & McIntosh

[57] ABSTRACT

A photovoltaic cell has an n-type polycrystalline layer and a p-type polycrystalline layer adjoining the n-type polycrystalline layer to form a photovoltaic junction. The p-type polycrystalline layer comprises a substantially planar layer portion having relatively large crystals adjoining the n-type polycrystalline layer. The planar layer portion includes oxidized impurities which contribute to obtainment of p-type electrical properties in the planar layer portion.

15 Claims, 22 Drawing Sheets

U.S. PATENT DOCUMENTS

| | | | |
|---|---|---|---|
| 4,705,911 | 11/1987 | Nakano et al. | 136/251 |
| 4,709,466 | 12/1987 | McCandless et al. | 437/5 |
| 4,735,909 | 4/1988 | Albright et al. | 437/4 |
| 4,759,951 | 7/1988 | Itoh et al. | 427/76 |
| 4,937,651 | 1/1990 | Yamazaki et al. | 357/52 |
| 5,022,930 | 6/1991 | Ackerman et al. | 136/251 |
| 5,078,803 | 1/1992 | Pier et al. | 136/256 |
| 5,078,804 | 1/1992 | Chen et al. | 136/260 |
| 5,112,410 | 5/1992 | Chen | 136/260 |
| 5,248,349 | 9/1993 | Foote et al. | 136/260 |
| 5,261,968 | 11/1993 | Jordan | 136/244 |
| 5,279,678 | 1/1994 | Jordan et al. | 136/244 |
| 5,290,366 | 3/1994 | Riermeier et al. | 136/244 |

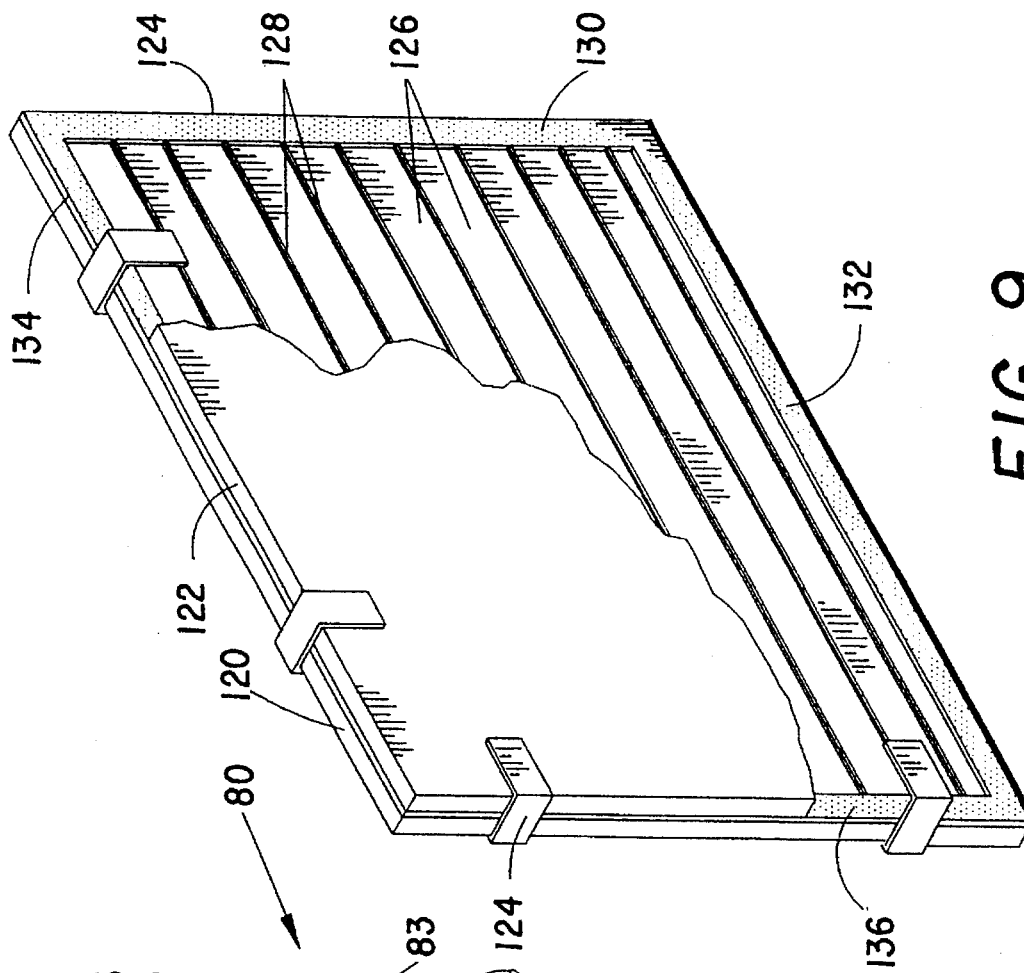
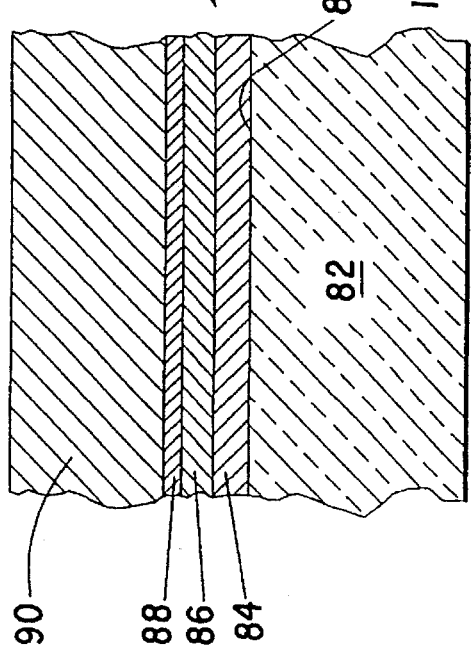
FIG. 9
FIG. 5

PHOTOVOLTAIC CELL HAVING A P-TYPE POLYCRYSTALLINE LAYER WITH LARGE CRYSTALS

CROSS-REFERENCE TO RELATED APPLICATIONS

This application is a continuation of application Ser. No. 08/095,599 by Jordan et al. filed Jul. 21, 1993, and now abandoned, which is a continuation-in-part of International Application No. PCT/US93/00231 by Jordan et al. filed Jan. 13, 1993 and which designated the United States, which is a continuation-in-part of U.S. patent application No. 07/819,882 by Jordan et al. filed Jan. 13, 1992, which issued as U.S. Pat. No. 5,279,678 on Jan. 18, 1994.

FIELD OF THE INVENTION

The present invention relates to low cost photovoltaic devices and, more particularly, relates to improvements in photovoltaic modules and methods of manufacturing the same.

BACKGROUND OF THE INVENTION

It has long been known that solar energy can be converted to electricity in photovoltaic cells. Although several different types of photovoltaic cells, using a variety of materials, have been proposed, most cells have a similar construction. A cell has a photoactive area typically consisting of one or more semiconductor layers sandwiched between two electrodes. These semiconductor and electrode layers are often in the form of film layers deposited on a rigid base substrate, such as glass. Electricity is generated in a semiconductor layer and is collected at the electrodes. A base substrate and all film layers thereon is generally referred to as a substrate, although substrate is sometimes also used to refer only to the base substrate, such as a glass plate. A substrate may contain more than one photovoltaic cell, and often contains many cells, formed on a common base substrate. A substrate that has been completed with one or more photovoltaic cells and which has means for conducting electricity away from the substrate is often referred to as a module.

A typical process for making photovoltaic modules includes: 1) providing a rigid substrate, 2) placing a conductive film on top of the substrate as a bottom electrode, 3) placing one or more semiconducting layers on top of the bottom electrode, 4) placing a conductive layer on top of the semiconducting layer or layers as the top electrode, 5) separating the photoactive area into a plurality of separate cells and interconnecting the cells in series, 6) providing means for conducting electricity away from the electrodes, and 7) encapsulating the panel to protect the active layers from detrimental effects of exposure to weather during use.

Most of the research work performed in the past has been performed in a laboratory environment and has been focused on improving the efficiency of converting solar energy to electricity. Little attention has been given to developing inexpensive and efficient manufacturing techniques that would be required for large-scale production of photovoltaic devices. Such a commercial manufacturing process must be simple and reliable and must include adequate means for handling waste materials. Also, in the research quest for improved cell efficiency, insufficient attention has been given to producing photovoltaic devices that are inexpensive and that are also reliable over extended periods. Although attaining higher cell efficiencies is desirable and should be pursued, higher cell efficiencies should not come at the expense of reasonable manufacturing costs.

A need exists for inexpensive photovoltaic devices that are reliable and durable. A need also exists for efficient manufacturing techniques suited for industrial applications for production of high efficiency photovoltaic modules in commercial quantities.

SUMMARY OF THE INVENTION

In one aspect, the present invention provides a process for manufacturing photovoltaic devices, and particularly for manufacturing those based on forming a heterojunction between an n-type semiconductor, such as one comprising a cadmium sulfide, and a p-type semiconductor, such as one comprising cadmium telluride. The process provides a practical method for manufacturing photovoltaic cells that is useful for commercial production of reliable, high efficiency photovoltaic modules at a reasonable cost.

In one embodiment, the present invention provides a method for manufacturing photovoltaic modules reliably and cost effectively and which results in photovoltaic modules having cell efficiencies suitable for most applications. A base substrate, such as glass, is provided on which a bottom electrode film layer of conductive material, such as high conductivity tin oxide, is formed. Alternatively, a glass base substrate can be purchased directly from a glass manufacturer already coated with such a bottom electrode film layer. Narrow strips, called pre-pre-resist lines, may be placed on the glass substrate prior to formation of the bottom electrode film layer. Preferably, the pre-preresist material, after heating if required for curing, has low or no permeability, is of low density, and is friable, such as is the case for titanium dioxide powder loosely held by a binder. Such binders may include cellulosic materials such as ethyl cellulose and other organic or inorganic binders.

On top of the high conductivity film layer may be formed a secondary n-type film layer of a material having lower conductivity than the bottom electrode material. One material useful for such a secondary n-type film layer is low conductivity tin oxide. Narrow strips, called preresist lines, of a material may be placed on the bottom electrode film layer prior to formation of the secondary n-type film layer. Like the pre-pre-resist material, the pre-resist material, after heating if required for curing, preferably has low or no permeability, is of low density, and is friable, such as a titanium dioxide film loosely held by a suitable binder, such as a cellulosic or other organic or inorganic binder.

On top of the secondary n-type film layer may be formed a primary n-type film layer of semiconducting material, such as n-type cadmium sulfide semiconductor material, which may be doped to attain a desired carrier concentration. If the primary n-type material comprises cadmium sulfide, it may be subjected to an anneal following deposition.

On top of the primary n-type semiconductor film layer is formed a p-type film layer of a semiconducting material, such as a p-type cadmium telluride semiconducting material, which may be doped to attain a desired carrier concentration if desired. The p-type film layer may comprise Group II–VI compounds other than cadmium telluride, may comprise Group I–III–VI compounds such as copper indium diselenide, or may comprise Group III–V compounds such as gallium arsenide. If the p-type material comprises cadmium telluride, it may be subjected to high temperature impurity gettering and oxidation in an oxidizing atmosphere.

Although a photovoltaic panel could be made having only one of either the secondary n-type film layer or the primary n-type film layer, having both is preferred. The secondary n-type film layer acts as a back-up heterojunction partner to the p-type film layer and thereby significantly reduces the possibility of detrimental shorts through defects in the primary n-type film layer. This is particularly desirable in the case of a primary n-type semiconductor comprising cadmium sulfide since cell efficiency is improved by making that film layer as thin as possible to prevent significant absorption losses prior to solar radiation reaching the p-type film layer, which acts as an absorber-generator layer. With a primary n-type film layer of a cadmium sulfide semiconducting material, a secondary n-type film layer of a low conductivity tin oxide layer is preferred.

The p-type film layer may be compressed to partially densify the film. If the p-type film layer comprises a cadmium telluride semiconductor, it may be subjected to a high temperature recrystallization, or regrowth step. Also, pinholes in the p-type film layer may be filled with an inert material, if necessary.

In preparation for making ohmic contact with a top electrode film layer, an exposed p-type film layer may be treated to remove oxides on or near the exposed surface while substantially leaving oxides along the grain boundaries of the p-type material for passivation. An ohmic contact layer, such as a layer comprising graphite, may then be formed on top of the p-type film layer to further enhance ohmic contact to a top electrode layer.

The photoactive area of a substrate may be divided into a plurality of cells, which may be connected in series to increase voltage. A narrow linear cut, such as by sandblasting, may be made longitudinally on the substrate and through the active layers, preferably at least to the top of the primary n-type film layer, and to substantially remove lines of pre-pre-resist and pre-resist materials. If pre-pre-resist lines had not been used, then a second, narrow, linear, longitudinal cut is made, such as with a laser, through part of the exposed secondary n-type film layer down to the glass substrate to effect cell division. A strip of insulating material, denoted a permanent resist line, may then be formed to cover the exposed conductive parts of the adjacent strip to avoid shorting that might otherwise occur during operation of a completed module. The substrate may then be subjected to heat treatment. The area in the vicinity of and including the cuts through the film layers is referred to as a cell interconnection area or region.

A heat treatment may be used before or after formation of the top electrode film layer and is useful for curing material of the permanent resist lines, if necessary. A top electrode film layer of a conductive material, such as a conductive metal, for example sequential layers of a nichrome alloy and tin, is then placed on top of the ohmic contact film layer and across cell interconnection regions. In one embodiment, the top electrode film layer comprises multiple sublayers with the first sublayer forming a barrier to oxygen depletion from a tin oxide bottom electrode layer. A cut, such as by sandblasting, may then be made through the top electrode film layer in the interconnection region and typically down to at least the primary n-type film layer, but in any event substantially through the top electrode film layer, thereby effecting series interconnection of individual cells on a substrate.

A photoactive area of a substrate can be electrically isolated from the external periphery of the substrate by making one or more isolation cuts, such as by sandblasting, around a perimeter area of the panel to separate the panel into a photoactive interior area and a border area. Film layers in the border area are typically removed down into at least the secondary n-type semiconductor film layer, either before or after making the isolation cut. The border area provides a surface for sealing of a module during encapsulation.

A bus bar may be connected to the outermost cells on either side of a substrate and electrical leads can be connected to the bus bars to allow connection of the panel to an electrical collection system.

The panel may be encapsulated by various methods. If encapsulated using a back cover, a junction box fitted to the top side of the back cover on the outside face of the inside volume of a module can be used to cover a hole through which electrical leads may exit the encapsulated area of a substrate or module. The junction box may have a flange portion under which pottant may be placed or extruded to fill a space between the flange area and the back cover, thereby enhancing the integrity of a seal of the hole and improving adherence of the junction box to the back cover.

In one aspect, the present invention provides a method for providing access below a secondary n-type film layer to the top of a bottom electrode film layer having higher conductivity than the secondary n-type film layer, thereby providing an advantage in improved cell division and interconnection using a relatively simple and inexpensive technique. The bottom electrode film layer and the secondary n-type film layer are preferably both transparent layers comprising tin oxide. This is particularly useful when the secondary n-type film layer comprises a low conductivity tin oxide material because that material is hard to remove without damaging the underlying bottom electrode layer, and generally requires expensive ablation techniques such as laser cutting. In one embodiment, pre-resist lines are placed on top of a bottom electrode layer and prior to formation of a secondary n-type film layer. In one embodiment, material of the pre-resist lines may be substantially removed to provide access below the secondary n-type film layer to the surface of the bottom electrode film layer. In one embodiment, the pre-resist strips comprise a material which, after heat treatment curing, if required, has low or no permeability, is friable, and has low density. One such material is titanium dioxide powder loosely held with a binder. Binders include cellulosic material such as ethyl cellulose as well as other organic and inorganic binders. In one embodiment, pre-resist lines are removed using relatively simple and inexpensive sandblasting technique.

In one aspect, the present invention provides a method for adjusting the resistivity of a film layer of low conductivity tin oxide, such as may be used as a secondary n-type film layer. The method is advantageous in that desired resistivities, or conversely desired conductivities can be obtained without the expense, limitations or complexity of using dopants. Alternatively, a dopant may be used with the benefit of requiring a reduced quantity of dopant. In one embodiment, a desired conductivity and, therefore, a desired carrier concentration, is attained in a low conductivity tin oxide layer with or without doping, by subjecting the tin oxide layer to an elevated temperature, either at the time of or following deposition.

In one aspect, the present invention provides a method for depositing a cadmium sulfide semiconductor film layer, such as might be used as a primary n-type film layer. The method is advantageous in that cadmium sulfide morphology can be improved and a resulting heterojunction with a p-type layer may also be improved, thereby resulting is improved cell efficiencies without significant added expense. In one embodiment, cadmium sulfide is deposited by spray pyrolysis using multiple spray deposition steps, with each deposition step followed by an anneal step at a higher temperature than the preceding temperature of deposition. Such multiple deposition and anneal sequences have, surprisingly, been found to provide morphological advantages for the cadmium sulfide layer and to provide for better control of residual chlorides in the layer. In another embodiment, the cadmium sulfide layer, following all of the deposition steps, is subjected to a final anneal. The final anneal is useful for inexpensively and effectively reducing and, particularly, for leveling the residual chlorides concentration really over the cadmium sulfide film layer and for ensuring repeatability and consistency of residual chlorides in the process among processed substrates.

In another aspect, the present invention provides an effective and inexpensive method for removing and disposing of cadmium from soluble cadmium salts in rinse water. In one embodiment, an ion exchange resin is used to capture cadmium ions from a solution having dissolved cadmium salts. In another embodiment, such an ion exchange resin loaded with cadmium can be disposed of in a landfill, thereby avoiding the substantial expense of disposal as a hazardous waste.

In one aspect, the present invention provides an apparatus and a method for spray deposition, and particularly for spray pyrolysis deposition of film layers such as tin oxide and cadmium sulfide film layers, to provide for better control of deposition quality at minimal or no added expense. In one embodiment, a spray nozzle assembly may be used through which fluid of a spray mixture may be communicated to the point of expulsion from a spray nozzle without the fluid contacting metal parts inside the nozzle that could corrode the fluid to be sprayed. This is of particular benefit for spray pyrolysis of tin oxide and cadmium sulfide layers which involve the handling and spraying of corrosive fluids. Corrosion can introduce detrimental impurities into the spray fluid stream which can affect electronic characteristics of the resulting layer. In one embodiment, a plastic conduit is provided, such as a plastic delivery needle or tube, through the spray nozzle. The plastic conduit may be attached to non-metallic fluid supply lines, thereby avoiding contact with metal parts. The plastic conduit may be in the form of a plastic nozzle insert that may be inserted inside a conventional metal spray nozzle, which preferably has been machined in some simple manner to properly accept the insert. One embodiment provides a process for delivering fluid to the tip of the spray nozzle without contacting that fluid with metal surfaces. In one embodiment, the average droplet size from a spray nozzle may be easily adjusted by changing the size of a plastic conduit through a plastic nozzle insert to provide a desired inner diameter at the point of expulsion to result in spray droplets of a desired size and/or size distribution. Such ability to alter droplet size and/or size distribution provides significant advantages of versatility and allows easy changes to be made without the expense of purchasing a different nozzle for a modified operation.

In one aspect, the present invention provides a method for the handling of raw materials used to prepare tin oxide layers by spray pyrolysis. The method enhances cell efficiency through inexpensive control of raw materials quality. In one embodiment, a stannous chloride salt solution is used during spray pyrolysis. In one embodiment, commercially available anhydrous stannous chloride is qualified for use by checking the clarity of a sample solution having a high solute concentration in deionized water. Such a check for clarity provides an easy method for determining if a batch of anhydrous stannous chloride contains excessive stannic chloride or other metallic impurities detrimental to high performance films of tin oxide. In another embodiment, anhydrous stannous chloride is stored in the presence of a desiccant, particularly following the opening of a commercial container of anhydrous stannous chloride, to limit exposure to a humid, oxidizing environment.

In one aspect, the present invention provides a temperature controlled spray nozzle used for spray deposition of materials and a method for controlling the temperature of a nozzle during spray deposition. Such temperature control is particularly beneficial for use with spray pyrolysis deposition on a transparent substrate to avoid excessive heating of a nozzle due to heating by radiant energy passing through a substrate. In one embodiment, the temperature of a spray nozzle is controlled, such as by adding or removing heat from the spray nozzle and/or from the spray mixture, using a circulating heat transfer fluid. In one embodiment, a cooling fluid circuit is used to cool a spray nozzle and thereby control the temperature at which a nozzle operates during deposition.

In one aspect, the present invention provides a method for reducing problems that can be created by fluid pulsation at the nozzle during spray deposition of a film layer and thereby allowing for even deposition of a film layer without the significant expense of using non-pulsating metering pumps. In one embodiment, a pressure compliance is placed in a fluid feed line to a spray nozzle and at least a threshold level pressure drop is maintained prior to the exiting of fluid from the nozzle. Various means can be used, including a cloistered air space and/or resilient tubing to absorb the shock of fluid pulsations. It has been found that such a method avoids the use of expensive non-pulsating metering pumps, such as double-sided diaphragm pumps.

In one aspect, the present invention provides a method for preparing solid cadmium telluride particles for use in forming a cadmium telluride layer on a substrate providing a low cost and effective method for making a high performance cadmium telluride semiconductor film layer. In one embodiment, oxides in the cadmium telluride particles are reduced to less than about 0.15 weight percent prior to deposition, which may be by spray deposition or by other deposition processes. In one embodiment, cadmium telluride particles are treated with a reducing gas, such as hydrogen gas, to reduce the concentration of oxides to an acceptable level for deposition to form a high performance cadmium telluride film layer. In one embodiment, reduction of the concentration of oxides is performed in a reducing environment at an elevated temperature, preferably greater than about 450° C., more preferably from about 550° C. to about 650° C. and most preferably at about 600° C. In one embodiment, cadmium telluride feed material, which may contain non-stoichiometric amounts of cadmium or tellurium is heated, preferably to a temperature of from about 550° C. to about 650° C., and more preferably about 600° C., in an inert or reducing environment to volatilize and drive off excess tellurium or cadmium, thereby allowing for preparation of a suitable cadmium telluride feed material, even if starting with a variable grade of commercial cadmium telluride. Such a process is particularly useful for minimizing and/or leveling the concentration of oxides and/or cadmium and tellurium within a batch of feed material and for providing consistency by leveling between batches. As used herein, leveling refers to making a parameter consistent, such as a concentration spacially over a film layer or to make some parameter consistent between batches or runs. In one embodiment, cadmium and tellurium are present in cadmium telluride in feed material within approximately 0.01 atomic percentage of each other.

In one embodiment, prior to reducing oxides concentration, the average size of cadmium telluride particles is reduced to a size of no larger than the average size of cadmium-containing and tellurium-containing particles from which the cadmium telluride was originally made. In one embodiment, cadmium telluride particles are reduced to an average size smaller than about 2 mils (approximately 50 microns). In one embodiment, cadmium telluride particles are reduced to a size smaller than about 7.5 microns. In one embodiment, cadmium telluride particles are subjected to a chemically reducing environment, such as in a fluidized bed reactor. In one embodiment, cadmium telluride particle size is reduced by wet ball milling, such as using alumina cylinders. In one embodiment, a cadmium telluride film layer and/or a graphite film layer may be deposited by a less solvent intensive method than spray deposition, thereby improving deposition economics and efficiency. Such low solvent deposition methods include roller coating, screen printing, offset printing, and doctor blading, and especially roller coating.

In one aspect, the present invention provides a method for gettering impurities within a cadmium telluride layer and for oxidizing a cadmium telluride layer that is useful for economically improving performance of a resulting cadmium telluride semiconductor layer. In one embodiment, gettering and oxidation occur prior to recrystallization of a cadmium telluride layer. In one embodiment, a cadmium telluride layer is subjected to an oxidizing environment at a first temperature for a first time and to a second temperature, which is preferably a higher temperature for a second time. The method provides the advantage of enhancing through independent control both the impurity gettering and the gradient of oxidation in a cadmium telluride film layer to allow for improved grain morphology to be attained, especially when the cadmium telluride layer is subsequently recrystallized.

In one aspect, the present invention provides a method for recrystallizing, or regrowing, a cadmium telluride layer that is advantageous for improving morphology and thereby enhancing photovoltaic cell performance. In one embodiment, substrates are subjected to an elevated temperature with substrates paired so that the cadmium telluride layers on the paired substrates are arranged in a face-to-face configuration. In one embodiment, substrates having cadmium telluride layers thereon are subjected to elevated temperature with the substrates positioned vertically on end, thereby providing the advantage that the substrates have a reduced tendency to sag or otherwise deform during heating. In one embodiment, substrates are positioned vertically and pairs of substrates are located in space using lateral spacers having a saw-tooth, or serrated, cross-section for positioning and holding secure pairs of substrates. In one embodiment, panels are positioned vertically, with pairs of substrates being held together with clips that extend over substantially the entire mated perimeter of paired substrates.

In one aspect, the present invention provides a method for reducing detrimental shorts or shunts through pinholes in a semiconductor layer, such as a cadmium telluride layer. In one embodiment, pinholes are filled with an electrically insulating material. In one embodiment, pinholes are filled with an electrically insulating polymer, such as a polystyrene polymer.

In one aspect, the present invention provides a method for improving ohmic contact between a p-type film layer, such as a p-type layer having cadmium telluride semiconducting material, and an electrode film layer by treating the surface of the p-type film layer. In one embodiment, the p-type film layer is subjected to a surface treatment with a treating fluid to remove surface oxides from the p-type film layer without removing significant amounts of the semiconductor material. In one embodiment, the p-type semiconductor, following treatment, is not significantly more conductive near the treated surface than in the interior of the p-type film layer. In one embodiment, the treating fluid comprises propylene glycol, or a similar high viscosity fluid. In one embodiment, the treating fluid results in a substantially planar treatment, without significant penetration below the surface of the film layer, such as along grain boundaries. In one embodiment, the treating fluid has a high viscosity relative to water. In one embodiment, the treating fluid does not remove significant amounts of oxides from the interior of the p-type film layer, and particularly does not remove significant amounts of oxides from the vicinity of interior grain boundaries. In one embodiment, the treating fluid removes oxides down to a depth of about ten molecules into the contacted surface of a p-type grain in the p-type film layer. In one embodiment, the p-type film layer surface is 1) soaked in treating fluid, 2) rinsed with water, 3) dried, such as by blowing with a compressed gas, 4) treated with a water-displacing fluid to displace at least a portion of capillary water adhering to or adsorbed onto the surface, and 5) dried, such as by blowing with a compressed gas.

In one aspect, the present invention provides a method for reducing the potentially detrimental impact of a pinhole through a semiconductor layer by placing a material in the pinhole that will form a Schottky barrier with an underlying n-type film layer. In one embodiment, graphite particles are placed in pinholes to contact with an underlying n-type film layer. In one embodiment, graphite particles contact to an n-type film layer underlying a p-type cadmium telluride film layer. In one embodiment, graphite particles contact to an underlying n-type low conductivity tin oxide film layer or to an underlying n-type cadmium sulfide film layer.

In one aspect, the present invention provides for the use of an ohmic contact film layer, such as a graphite layer, between a semiconductor film layer and a conductive electrode film layer to improve ohmic contact. In one embodiment, an ohmic contact film layer comprising graphite is placed between a p-type film layer, such as one comprising cadmium telluride, and a top electrode film layer. In one embodiment, an ohmic contact film layer comprising intercalated graphite is formed on top of a semiconductor layer, and particularly on top of a p-type film layer comprising cadmium telluride. In one embodiment, the graphite film layer comprises intercalated graphite placed on top of a cadmium telluride film layer and which is heated to a temperature sufficient to release at least some intercalated molecules from the graphite crystalline framework, thereby permitting such molecules to diffuse into the underlying cadmium telluride layer. In one embodiment, the diffusion of an intercalated atom and/or molecule from the graphite film layer improves conductivity of at least a portion of an adjacent cadmium telluride film layer, thereby improving ohmic contact to and through the graphite to an overlying top electrode film layer. In one embodiment, intercalated molecules within the graphite crystalline framework of a graphite film layer, improves ohmic contact to a p-type film layer, particularly to a p-type cadmium telluride layer, due to a change in the Fermi level of graphite grains in the graphite film layer. In one embodiment, graphite with an intercalated inorganic copper-containing molecule, such as copper chloride or other copper salts, is formed on top of a p-type cadmium telluride film layer. In another embodiment intercalated species may comprise a Group V atom such as antimony or bismuth.

In one embodiment, graphite is formed on top of a semiconductor layer, and particularly a p-type layer such as of cadmium telluride, by applying a paste having greater than about 20 weight percent solids before drying, preferably greater than about 30 weight percent solids, and most preferably greater than about 40 weight percent solids, thereby providing a thick layer of graphite paste that will tend to bridge rather than fill pinholes in the p-type semiconductor film layer, and especially those smaller than about 0.5 mm in diameter. In one embodiment, at least about 0.5 weight percent of the graphite film layer, as deposited, is comprised of interrelated molecules. In one embodiment, graphite is applied to the p-type semiconductor film layer by roller coating a graphite paste. In one embodiment, the graphite film layer isolates defects in an underlying p-type film layer, thereby reducing possible detrimental effects of shunting through such defects. In one embodiment, the size and/or size distribution of graphite particles used to form a graphite film layer allows for improved isolation of defects and shunt paths. In one embodiment, a graphite film layer is formed by spray deposition. In one embodiment, the specific resistivity of graphite is selected for improved isolation of defects and shunt paths.

In one aspect, the present invention provides a method for removing resist materials to facilitate efficient and cost effective series interconnection of individual cells on a panel. In one embodiment, pre-resist lines are substantially removed by sandblasting, thereby providing access to an underlying bottom electrode film layer, such as a high conductivity tin oxide film layer, for simple and efficient cell division and series interconnection.

In one aspect, the present invention involves forming multiple individual cells on a common substrate and interconnecting the same in series. In one embodiment, a process for forming and interconnecting individual cells comprises: 1) forming pre-resist lines across a substrate and on top of an bottom electrode film layer, such as a high conductivity tin oxide film layer, 2) forming at least two semiconductor film layers on top of a bottom electrode layer including either a secondary n-type film layer or a primary n-type film layer, or both and a p-type cadmium telluride film layer, 3) compressing a cadmium telluride film layer except in areas designated for interconnection, 4) performing a first division sandblast to substantially remove pre-resist material thereby exposing a bottom electrode layer, 5) performing a first division laser cut through a bottom electrode film layer, 6) applying permanent resist lines covering the exposed conductive area on the negative side of a first division laser cut, 7) forming a top electrode film layer and 8) performing a second division sandblast through the top electrode film layer and at least into the cadmium telluride layer.

In one embodiment, pre-pre-resist, pre-resist, and/or permanent resist lines are applied by deposition from one or more processing tools such as small inner diameter needles, delivery tubes, or other conduits, or by ink-related high-speed printing methods for processing narrow, linear, elongate areas. The processing tools are capable of movement in directions both longitudinally and laterally across a spacially fixed substrate, thereby allowing multiple longitudinal passes, with each longitudinal pass at a different lateral position over the substrate to deposit all desired longitudinal strips at all desired lateral positions across the substrate. In one embodiment, a bank of multiple processing tools small inner diameter conduits is moved laterally across a fixed substrate following a longitudinal application of linear strips of material using the bank of processing tools, thereby providing for simultaneous deposition of multiple longitudinal strips with each longitudinal pass. In one embodiment, a series of such longitudinal passes may be made as required until the entire substrate has been traversed to deposit all desired longitudinal strips at all desired lateral positions across the substrate.

In one embodiment, sandblast cuts and/or laser cuts for cell division and interconnection are accomplished by sandblasting or laser cutting from one or more processing tools capable of movement both longitudinally and laterally across a spacially fixed substrate, thereby allowing multiple longitudinal passes over the substrate to make all the desired longitudinal cuts at all desired lateral positions across the substrate. In one embodiment, a bank of such multiple processing tools is moved laterally across the substrate following a longitudinal processing using such a bank of multiple processing tools, thereby providing for simultaneous processing to make multiple longitudinal cuts with each longitudinal pass and using a series of longitudinal passes, if required, until the entire substrate has been traversed to make all desired processing longitudinal cuts at all desired lateral positions across the substrate.

In one aspect, the present invention provides a method for sandblasting to make high quality sandblast cuts, thereby aiding in the production of high quality, cost effective, photovoltaic panels. In one embodiment, grain size distribution is carefully controlled. In one embodiment, the shape of sandblast particles is selected and monitored based on the specific sandblast application. In one embodiment, the water absorption characteristics of materials is selected and monitored. In one embodiment, the material of sandblast particles is selected and monitored.

In one aspect, the present invention provides a method for electrically isolating a photoactive area of a substrate which can be used to generate electricity from solar radiation. Such electrical isolation provides the advantage of making the panel safe during operation and reduces the risk of an electrical short to the external periphery of the substrate. In one embodiment, one or more isolation cuts are made around the perimeter of a photoactive area, some distance in from the peripheral edge of the substrate, thereby defining around the perimeter of the substrate an isolated border area between the isolation cut and the edge of the substrate. In one embodiment, there may be multiple isolation cuts, each being located at a different distance in from the edge of the substrate and completely surrounding a photoactive area. In one embodiment, an isolation cut extends through all active film layers, preferably down to a base substrate, such as glass. In one embodiment, an isolation cut is made such that one complete isolation cut, or, in the case of multiple isolation cuts, all of the isolation cuts are within the interior space of an encapsulated module. In one embodiment, the width of an isolation cut is at least about 30 mils. In one embodiment, a border area, which may extend to the edge of the substrate, is removed of one or more active film layers, preferably to below the bottom electrode. Some of this border isolation area may be contained within an enclosed space during encapsulation and therefore has an advantage of maintaining the electrical isolation area in a dry surround. Isolation cuts or border edging may be performed by carefully controlled sandblasting or using an abrasive wheel. In one embodiment, border edging and isolation may be accomplished through the use of a border resist strip of resist materials, similar to those useful for pre-pre-resist lines, pre-resist lines and permanent resist lines.

In one aspect, the present invention provides a bus bar design for collecting electricity produced by a photovoltaic panel for conduction of electricity with minimal losses and costs away from a module. In one embodiment, a strip of conductive metal is attached to a top electrode layer using a conductive or a non-conductive adhesive; and a conductive paste, such as a graphite paste, is placed along the elongate edges of the conductive metal strip to provide a low resistance conductive path for conducting electric current from the substrate to the conductive metal strip. In one embodiment, the conductive metal strip is crimped along its axis to accommodate thermal expansion of the metal strip relative to that of the substrate. In one embodiment, the conductive metal strip is made of copper. Preferred conductive pastes include those comprising graphite, nickel and/or silver, and should contain a resilient binder. In one embodiment, the metal strip is crimped laterally across the strip to provide for differences in thermal expansion between the bus bar and an underlying substrate. In one embodiment, the bus bar may be attached to a substrate in a manner that avoids a "dead" cell effect.

In one aspect, the present invention provides a method for deactivating impurities within an encapsulated module. In one embodiment, a molecular sieve, such as zeolite having predetermined pore sizes is placed in the interior space of an encapsulated photovoltaic module to absorb or adsorb impurities, such as hydrocarbon or other organic vapors, that may be emitted within or otherwise be present within the interior space during the operational life of a module. In one embodiment, at least two molecular sieves having different pore sizes are used, with one pore size preferential to adsorption of water and with a second pore size preferential to adsorption of one or more other impurities.

In one aspect, the present invention provides a method for preloading of an interior space of an encapsulated module with oxygen, thereby reducing problems that might otherwise occur either initially or over a prolonged period of operation, especially in the presence of adsorptive materials such as desiccants, and providing the advantage of reducing or avoiding problems that might occur due to the possible loss of physi-adsorbed or chemi-adsorbed oxygen from a cadmium telluride p-type semiconductor film layer during operation. In one embodiment, the molecular sieve is preloaded with oxygen.

In one embodiment, the present invention provides a junction box that is inexpensive, durable and assists in sealing the interior space of an encapsulated module. In one embodiment, a junction box has an open space, which is placed on and is open to the module, and which can be filled with pottant to assist in sealing a hole into an interior space of an encapsulated module through which electrical leads may exit from the encapsulated module. In one embodiment, the hole may be through a back cover used in encapsulation. In one embodiment, a junction box of rectangular shape is attached to a module using a strip of adhesive. In one embodiment, an open space in the junction box, having no bottom wall, provides a space for lead wires exiting a hole in a back cover to enter the junction box. The open space may be substantially filled with pottant to assist in sealing the hole and in maintaining the integrity of such a seal. In one embodiment, a junction box contains a flange-like portion extending outward from the walls surrounding the perimeter of an open space, and beneath which flange-like portion are protuberances that create an open space next to a back cover or other outer surface of an encapsulated module. Pottant can be forced under the flange-like surface to improve the seal around electrical leads exiting the module. In one embodiment, a polyisobutylene coated metal foil, such as an aluminum foil, can be placed over a hole through which electrical leads may exit a module to improve seal integrity. Preferably, the junction box is situated over the hole to protect the metal foil from the weather.

In one aspect, the present invention provides a method for screen testing photovoltaic modules in a production line for quality, preferably prior to encapsulation of the module. In one embodiment, a constant voltage is applied to the module and the current is measured and compared to an expected response. In one embodiment, a voltage near an expected maximum power point voltage of the module is applied to the module.

In one aspect, the present invention provides a method for forming film layers by spray deposition, including by spray pyrolysis. In one embodiment, feed solution is sprayed onto a moving substrate through a spray nozzle moving laterally to the direction of travel of the substrate, and the spray nozzle does not move at a constant lateral velocity across the entire substrate. In one embodiment, a spray nozzle moves in a direction lateral to the direction of movement of a substrate and the lateral velocity of the nozzle near the edges of the substrate is slower than the lateral velocity of the nozzle near the center of the substrate. Any velocity profile resulting in a uniform layer can be utilized.

One aspect of the present invention provides a high efficiency CdS/CdTe photovoltaic cell and a method useful in making the same. In one embodiment a continuous relatively thick CdS layer is initially formed on a substrate, but its thickness is reduced during regrowth of the active photovoltaic layers. At the regrowth temperature, CdS diffuses or migrates into either the space between the formed large CdTe crystals or into the crystals themselves, resulting in a continuous CdS layer, yet a CdS layer having a reduced effective thickness. The effective thickness of the resulting CdS layer may be in the range of approximately 100 Å to approximately 500 Å, so that a high percentage of optical energy less than 520 nm passes through the CdS layer to the junction, thereby increasing efficiency. The term "effective thickness," as used herein, is intended to mean the apparent thickness of the layer as defined by the layer's transmissivity of short wavelength sunlight, i.e., wavelengths below 520 nm. As an example, using an absorptivity coefficient of CdS of $10^5$/cm, a CdS layer having an actual uniform thickness of 3,500 Å may pass less than approximately 3% of sunlight having a wavelength less than 520 nm, while a CdS layer having an actual thickness of approximately 200 Å may pass more than 92% of this low wavelength energy.

Special precautions are taken to ensure that the CdTe layer does not provide a significant shunting path to the conductive layer adjoining the CdS layer, while at the same time ensuring that the conductive layer is highly transmissive of light. This conductive layer preferably comprises one highly-conductive layer of tin oxide (approximately $10^{20}$ carrier per $cm^3$), and another substantially lower conductivity layer adjoining the CdS layer. This second lower conductivity tin oxide layer has its carrier concentration adjusted so that when in contact with CdTe (where there are flaws in the CdS layer), a voltage and current are produced and shunting is avoided. The highly conductive tin oxide layer provides the desired low resistance path for the transmission of electrical energy within and between cells. High continuity of the low conductivity tin oxide layer is essential if there are a significant number of flaws in the CdS layer, and the desired uniformity of this tin oxide layer may be obtained by spraying a low molarity tin oxide solution for a long enough time so that a large number of droplets provide uniform statistical coverage of the high conductivity tin oxide layer. The conductivity of tin oxide may be easily varied on the range of at least seven orders of magnitude.

According to one embodiment of the present invention, a high efficiency CdS/CdTe backwall photovoltaic panel is formed by first spraying a high conductivity tin oxide layer on a glass substrate utilizing spray pyrolysis to obtain a layer with a specific conductivity in the range of from 1000 to 5000 mho/cm. The low conductivity second tin oxide layer is then applied by the same technique using a low molarity solution suitably doped to obtain a desired carrier concentration in the resulting film. In an exemplary case, a conductivity of approximately 0.10 mho/cm with a carrier concentration of $4 \times 10^{17}$ carriers/cm$^3$ is used, with a CdTe layer having a carrier concentration of $5 \times 10^{15}$ carriers/cm$^3$ to produce a satisfactory photovoltaic cell. In this case, cadmium was used as the tin oxide dopant, but zinc or other metals may be used. It should be pointed out that the carrier concentration, while related to conductivity, is not a direct function of it but is related in part to the dopant used and resulting mobility. Conductivity measurements are expressed in this application because carrier concentration is difficult to measure. The CdS layer may then be applied by spray pyrolysis (or other suitable technique) to an initial thickness in the range of from 2,000 to 12,000 Å, and a substantially thick CdTe layer applied by an atmospheric temperature spraying and compression technique (or similar method). The panel is then heat treated and the active photovoltaic layers regrown at approximately 540° C. to form large CdTe crystals, while the CdS diffuses or migrates between or into these crystals and forms a layer having an effective thickness in the range of approximately 1/20th of its initial thickness. The panel is then divided into cells and the cells series interconnected, and the completed panel encapsulated. The active areas of a photovoltaic panel have a comparatively high efficiency up to 18% over a long cell life, in large part due to the increased efficiency attributable to the effectively thin CdS layer. The quantum efficiency of the cell in the spectral band at wavelengths shorter than 520 nm may surprisingly be approximately 90%. The tin oxide layer, with an appropriate carrier concentration, in combination with a suitable p-type material layer, will produce voltage and current when exposed to sunlight where there are flaws in the CdS layer.

According to the present invention, a two-step process is utilized to achieve the desired electrical and crystal morphology (through control of nucleation) of the p-type layer of a photovoltaic cell, while overcoming the problems of the prior art. In the first step, an impurity gettering step, the p-type material is heat treated in an oxidizing environment to adjust the electronic properties of the material. The terms "oxidation" or "oxidize" as used herein have a chemical definition, and traditionally mean the loss of electrons by atomic or molecular species, including the formation of another species with a different oxidation state and/or the formation of a new compound. If a donor species is oxidized or passivated by forming an oxidized or chemically stable species by compounding with an oxidant, then electronic changes can occur by chemical means. As used herein, a "donor" is a species which has additional available electrons compared to a number of electrons which the host semiconductor matrix can easily accept. As used herein, "oxidant" refers to any chemical compound that oxidizes a material. Oxidants include, without limitation, oxygen, sulfates, phosphates, oxides such as sulfur dioxide and carbon monoxide, and peroxides.

The impurity gettering step controls the desired semiconductor characteristics of the material by deactivating donor impurities which otherwise cause the p-type material to be either n-type or poorly p-type. As used herein, a "donor impurity" refers to excess donor species, including without limitation impurities or native defects, present within a material rendering the material less p-type, insulating, or n-type, depending on the concentration of the excess donor species. Oxidation by heat treatment in the impurity gettering step has the general effect of rendering the oxidized species non-donating which would tend to make a semiconductor more p-type after the heat treating step. The ratio of holes to electrons thus partly defines the semiconductor characteristics of the material.

The remaining acceptors take over to make the material desirably p-type. Oxygen itself may also act as an acceptor in the p-type layers. The impurity gettering step may occur either before, during, or after deposition of the p-type material on the substrate. In either case, in the p-type layer donor impurities are deactivated by oxidation and the acceptor concentration forced to dominate. Significant crystal growth during this step is not required.

During the second step, or the recrystallization step, the p-type film layer is recrystallized in an environment substantially free of oxidants to obtain proper crystal growth. As used herein, an "inert substance" is any substance that does not cause oxidation of the film layer components. The term "recrystallization" as used herein refers to any process wherein a number of relatively small diameter crystals are converted into fewer crystals of a larger size. Recrystallization occurs at elevated temperatures, and preferably is flux actuated or flux accelerated to produce crystals having a large mean diameter. The film layers are preferably arranged face-to-face during the second recrystallization step to increase the concentration of flux vapors from a dopant added to the deposited film layers. By separately adjusting the electrical properties and the morphology of the crystals in the p-type layer, reproducible and uniform film layers may be reliably obtained for highly efficient photovoltaic cells.

In an exemplary embodiment, the techniques of the invention may be used for achieving an improved CdS/CdTe photovoltaic cell. The CdTe layer desirably has an excellent uniformity and good manufacturing reproducibility. By having the ability to separately control the p-type material electrical properties and the size and morphology of crystals in this layer, a high degree of process reliability is obtained. The CdTe film may be deposited on the CdS film, which was previously deposited on a transparent electrically conductive film on a glass substrate. During the impurity gettering step, CdTe film layers are positioned in an oven maintained at a temperature of from about 380° C. to 500° C. for a relatively short period of time, e.g., from about 5 seconds to 30 minutes. The substrate panels are arranged so that the CdTe films are open faced to obtain uniform oxidation over the length and width of each panel. An oxidation gradient through the p-type film thickness desirably may be established to achieve the final morphology desired and to achieve a good n-type/p-type metallurgical interface with the window material. In the preferred embodiment, crystals adjacent the opposing or upper surface of the CdTe layer will thus have a thicker oxidized coating than the lower crystals adjacent the CdS layer, thereby forming an oxidation gradient through the film thickness.

The panels after the impurity gettering step may then be annealed in the recrystallization step with the CdTe layers arranged face-to-face within a substantially inert atmosphere. Any substantially inert gas will suffice including nitrogen, argon, methane, and helium. Preferably, the inert atmosphere is substantially composed of nitrogen. The temperature during the recrystallization step may be maintained within the range of from about 400° C. to about 700° C., more preferably from about 480° C. to 560° C., and occurs for a sufficient time of from about 10 minutes to 60 minutes to obtain the desired crystal growth and morphology. Due to the oxidation gradient through the film thickness obtained during the impurity gettering step, the recrystallization flux is variably retarded within the film and does not act uniformly on all crystals spaced throughout the film thickness during the recrystallization step, so that large CdTe crystals are formed adjacent the top CdS surface. The flux may be any halide, including without limitation, $CdCl_2$, $CdI$, $CdBr$, $HCl$, and $NH_4Cl$. Preferably, the flux is $CdCl_2$. The resulting size of the crystals and the size distribution through the p-type film thickness may be modified to form an optimum metallurgical interface by varying the magnitude and/or the slope of the oxidation gradient, by adjusting the temperature and temperature rise rate of the recrystallization step, and by varying the amount or type of flux, porosity of the p-type layer, and the substrate orientation and placement in the recrystallization step.

According to these improved techniques, excessive crystal growth is prevented, and the desired crystal grain volume to grain surface area is obtainable. By controlling the oxidation gradient through the film layer in the impurity gettering step, the flux released during the recrystallization step is retarded in its efficacy to induce recrystallization as a function of oxidation coating thickness, thereby causing nucleation sites to be initiated at or closely adjacent the interface between the p-type layer and the window material. The result can be a high performance metallurgical interface between the p-type layer and the n-type window layer primarily attributable to large p-type crystals each having a base surface substantially planar with the n-type material surface. If this high performance metallurgical interface is not formed, (e.g., the lower surfaces of crystals do not form a planar interface with the n-type window layer), the reflectivity of this interface due to air n-type layer or air p-type layer reflection would significantly diminish photovoltaic efficiency. Alternatively, a monolayer of p-type material crystals could be formed in the recrystallization step from a p-type material which previously had been gettered in an oxidizing heat treatment step to obtain desired p-type properties. The oxidized coating will be left on or removed along with the impurity. Again, the lower surfaces of the crystals within this monolayer could form a planar interface with the n-type layer.

The techniques of the present invention recognize that a small excess of one of the p-type layer components, such as, for example, an excess of either Cd or Te in a CdTe layer as a result of non-equivalent Cd and Te metal ratios, change the susceptibility of the material to oxidation. Since the final morphology of the recrystallized CdTe film is primarily affected by the oxidation gradient through the film thickness, precaution is taken to assure a desired ratio of Cd to Te in the deposited CdTe film layer. Cd and Te may be thoroughly mixed and the mixture heated in an inert atmosphere until nearly complete reaction has occurred to form CdTe. If this mixture is then heated in an inert atmosphere in an open system, the Cd or Te will separate from the reacted material to a desired extent due to its higher volatility. Use of a CdTe material with consistent Cd and Te ratios is practically required if the improved electrical properties and desired oxidation gradient through the CdTe layer is to be obtained as a result of the above described two-step process. The optimum performance might be achieved in a CdTe starting material having non-equivalent Cd and Te ratios to enhance the growth of oxide at grain surfaces without over oxidizing the CdTe bulk grain.

It is an object of the present invention to provide an efficient and cost effective method for manufacturing photovoltaic modules, and particularly those including CdS/CdTe heterojunctions.

It is an object of the present invention to provide a substantially high efficiency polycrystalline photovoltaic cell, wherein the n-type material layer of the photovoltaic junction is made highly transmissive to short wavelength energy by reducing the effective thickness of the n-type material layer by diffusing or interdiffusing into or with the p-type layer a substantial portion of this layer.

It is a further object of the present invention to reduce the effective thickness of the n-type material layer in a photovoltaic cell to approximately 1/20th of its applied effective thickness, thereby forming a substantially continuous, reduced thickness layer for increased short wavelength light transmissivity.

A major object of this invention is to provide a polycrystalline cell with a relatively thin yet continuous n-type material layer, and with a relatively low conductivity and doped layer adjacent the n-type material layer, and a high conductivity conductor layer adjacent to the low conductivity layer and formed from substantially the same base material as the low conductivity layer, such that any flaws in the n-type material layer do not allow a short between the p-type material layer and the low conductivity layer, but rather actually produce energy in the area of any flaws in the n-type layer by the proper adjustment of tile relative carrier density of the low conductivity layer and the p-type material layer.

It is a feature of the present invention to provide a high efficiency CdS/CdTe photovoltaic cell, wherein the effective thickness of the applied CdS layer is significantly reduced by diffusion or migration into the CdTe layer, thereby reducing the effective thickness of the CdS layer to allow a high percentage of short wavelength light to reach the CdS/CdTe junction.

It is a further feature of this invention to utilize low cost techniques to apply a uniform and continuous CdS layer, and to substantially reduce the thickness of the applied layer to obtain a desired relatively thin CdS layer.

Yet another feature of the present invention is to regrow the CdS/CdTe photovoltaic layers at a temperature in excess of approximately 400° C., such that relatively large CdTe crystals are obtained while a significant portion of the CdS layer migrates or diffuses between or into the CdTe crystals to substantially reduce the effective thickness of the CdS layer.

Still another feature of this invention is to provide a CdS/CdTe photovoltaic cell with a tin oxide conductive layer comprising a relatively low conductivity tin oxide layer adjoining the CdS layer, and a high conductivity tin oxide layer adjoining the low conductivity layer.

It is still another feature of the invention that the carrier density of the high resistivity tin oxide layer is adjusted to be compatible with the CdTe layer to form an energy producing junction in areas where the CdS layer contains flaws.

It is a significant feature of the present invention that the material and equipment costs of applying the required layers of the photovoltaic cell are substantially reduced compared to prior art manufacturing techniques resulting in high efficiency photovoltaic devices.

It is an advantage of the present invention that the techniques for effectively reducing the desired effective thickness of the CdS layer and for minimizing or avoiding shunts and/or dead areas between the CdTe layer and the conductive layer adjoining the CdS layer may be used for various photovoltaic cell arrangements.

It is a further advantage of the present invention that various techniques may be used for applying the layers of the photovoltaic cell according to the present invention, thereby rendering the present invention suitable to spray pyrolysis, dip coating, gas deposition, and similar processes for applying relatively thin polycrystalline layers.

It is a significant advantage of the present invention that improved techniques are provided for modifying both the electrical properties and the morphology of the CdTe layer for a photovoltaic cell without a significant increase in equipment or material cost. The techniques of the present invention are particularly well suited for reliably controlling and enhancing the regrowth of crystals and the electrical properties of the polycrystalline p-type layer, e.g., the CdTe layer of a cadmium sulfide/cadmium telluride photovoltaic panel. The present invention also maintains highly controlled local stoichiometry of the materials forming the p-type layer. A photovoltaic panel comprising a plurality of cells formed according to the techniques of the present invention has the desired benefit of low material and manufacturing costs, yet produces relatively high photovoltaic conversion efficiency at a low overall cost per watt of output power. The techniques of the present invention will make a significant contribution to the manufacture of comparatively high efficiency photovoltaic devices having a relatively low manufacturing cost, and should be readily adaptable to photovoltaic products of various material constructions.

These and further objects, features, and advantages of the present invention will become apparent from the following detailed description, wherein reference is made to the figures in the accompanying drawings.

BRIEF DESCRIPTION OF THE DRAWINGS

FIG. 5 is a cross-sectional view of a portion of a photovoltaic device according to the present invention, illustrating the deposited layers on a glass substrate.

FIG. 9 is a pictorial view, partially in cross-section, of photovoltaic panels arranged face-to-face during recrystallization.

DETAILED DESCRIPTION OF PREFERRED EMBODIMENTS

Figure 1:
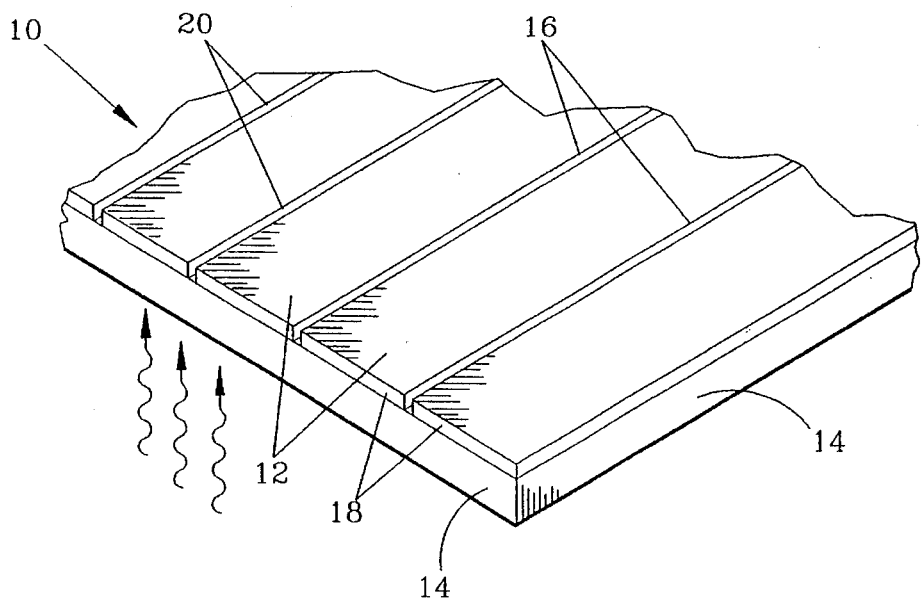
FIG. 1 is a pictorial view, partially in cross-section, of one embodiment of a photovoltaic panel formed according to the present invention which is not encapsulated.
Figures 2, 3:
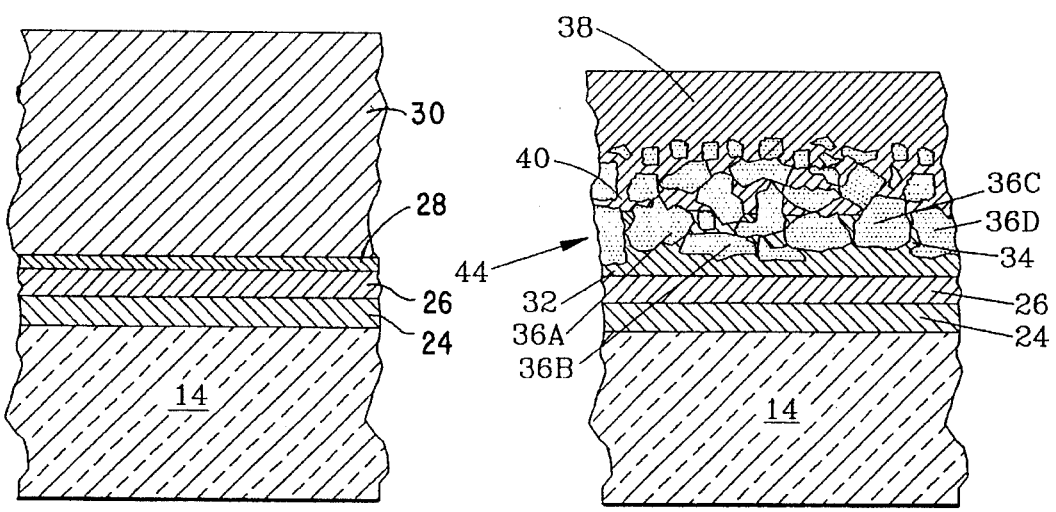
FIG. 2 is a cross-sectional view of a panel depicting various layers applied over a glass substrate according to the present invention prior to regrowth of the active photovoltaic layers.
FIG. 3 is a cross-sectional view of the panel as shown in FIG. 2 subsequent to regrowth and prior to dividing and series interconnection.

FIG. 1 generally depicts a photovoltaic panel 10 including a plurality of photovoltaic cells 12 according to the present invention. The panel consists of relatively thin chemical layers 18 formed on a common vitreous substrate 14. Glass is a preferred substrate due to its relatively low cost and its ideal flat surface for applying thin layers, and for subsequently heating those layers due to the low thermal expansion of the substrate. It should be understood that each of these applied layers, which are particularly shown in FIG. 3, are relatively thin to reduce material costs, and together will typically be less than 20 microns, so that the panel as shown in FIG. 1 visually appears to be little more than a rectangular sheet of glass with a thin painted coating. Also, it should be understood that the panel as shown in FIG. 1 may be complete in the sense that it is capable of producing electrical energy directly from sunlight. To maintain any form of reasonable efficiency, however, the panel needs to be encapsulated to prevent water vapor-related degradation of the cells.

FIG. 1 depicts a backwall cell configuration, i.e., sunlight passes first through the glass substrate and then to the junction formed by the active photovoltaic layers. The panel as shown in FIG. 1 is thus turned over during typical outdoor use, so that the glass substrate 14 is above the layers 18. Nevertheless, the panel is formed with the glass as the base or substrate, and accordingly, the terms "top" or "upper" when referring to the layers discussed subsequently should be understood with respect to the substrate being beneath these layers. The techniques of the present invention are also applicable to manufacturing front wall photovoltaic cells, wherein sunlight is absorbed by the junction formed by a cadmium telluride absorber layer on top of the CdS window layer, so that light rays do not pass through the CdS layer.

The photovoltaic panel shown in FIG. 1 may be formed by successively applying thin, continuous layers of chemicals on a glass substrate. Individual cells are formed by making a series of elongate parallel cuts 20 through at least some of these layers to divide the panel into elongate strips of cells according to the disclosure of U.S. Pat. No. 4,243,432. A layer or layers applied over the active photovoltaic layers also preferably provide the series interconnection of these cells to form the desired output voltage, and series interconnection strips 16 for accomplishing this purpose are generally depicted in FIG. 1. A suitable series interconnection configuration for electrically connecting cells is discussed subsequently. A suitable panel according to the present invention may thus be approximately 60 cm by 60 cm, and is capable of producing an output of approximately 50 watts with an incident insolation of approximately 1000 watts per square meter. For many commercial purposes, the desired electrical output is obtained by housing a plurality of panels in a module similar to the arrangement disclosed in U.S. Pat. No. 4,233,085.

FIG. 2 depicts in cross-section a panel prior to regrowth (crystallization) of the active photovoltaic layers. It should be understood that the thickness of each of the applied layers as shown in FIGS. 2 and 3 is approximately to scale with respect to the other depicted layers, but not with respect to the glass substrate 14. During the first step of constructing the photovoltaic panel, a bottom electrode may be formed on the substrate, with the electrode itself consisting of a bottom continuous electrode layer 24 having a high conductivity, and a top electrode layer 26 having a comparatively low conductivity. Each of these layers may be formed from a tin oxide solution utilizing spray pyrolysis techniques. The desired conductivity of these layers may be varied and, within reasonable limits, easily controlled by adjusting the amount of zinc or cadmium which is added to the tin oxide spray solution. Since the panel particularly described herein is of a backwall configuration, light must pass both through the glass substrate and the layers 24, 26 before reaching the junction formed by the active photovoltaic layers. High transmissivity of these tin oxide layers can nevertheless be maintained while changing the conductivity of these layers by a factor of approximately seven orders of magnitude.

The bottom tin oxide layer 24 serves the primary purpose of passing electrical energy through the cell and interconnecting the cell in a series arrangement, and thus should have a high conductivity. Preferably the layer 24 has a conductivity of more than 1000 mho/cm, and most preferably more than 2200 mho/cm. Using prior art techniques, a highly conductive yet highly transmissive tin oxide layer has been generated having a specific conductivity of 3700 mho/cm, so that obtaining a tin oxide layer with a specific conductivity of approximately 2200 mho/cm is feasible on a commercial basis. For reasons explained subsequently, the top tin oxide layer 26 must have low conductivity, should be thin, and also must have a high continuity (few pinholes or flaws in layer 26 are permissible). High continuity of this layer may be obtained utilizing a low molarity tin oxide spray solution for the spray pyrolysis process. The specific conductivity of the upper tin oxide layer preferably is in the range from approximately $1.25 \times 10^{-3}$ to 100 mho/cm. The thickness of the lower tin oxide layer is not particularly critical, but is preferably in the range 0.4 to 1.0 microns.

Specific conductivity is a parameter that may be measured and, as such, is employed simply as a means to estimate the carrier concentration of the layer. The thickness of the upper tin oxide layer may be from approximately 0.1 to approximately 1.0 microns and, as previously noted, is doped with a suitable metal such as cadmium or zinc to produce low carrier concentration.

Once the tin oxide layers have been formed, a relatively continuous layer 28 of CdS may be applied utilizing spray pyrolysis. The thickness of the deposited CdS layer may be in the range of from approximately 2,000 Å to 12,000 Å (0.2 to 1.2 microns), and this layer also has high continuity (few pinholes). A fairly thick CdTe layer 30 may then be applied on the CdS layer, with the thickness of layer 30 being substantially greater than that of the CdS layer 28. The CdTe layer may be economically formed using the atmospheric temperature spray and compression technique disclosed in U.S. Pat. No. 4,375,909. It should be understood that various techniques may be used for applying any of the layers 24, 26, 28 and 30, including spray pyrolysis, dip coating, or gas deposition. The preferred deposition technique has low cost deposition equipment and thus low manufacturing costs, and will result in continuous, thin, and thus relatively inexpensive layers.

As shown in FIG. 2, the layers 28, 30 as applied have relatively small crystals (not shown), which is undesirable for high photovoltaic efficiency. To increase the conversion efficiency, these layers are regrown at a temperature in excess of 400° C., and preferably from approximately 520° C. to approximately 550° C., to form substantially large crystals as shown in FIG. 3. Individual lower crystals 36A, 36B, 36C and 36D in the regrown CdTe layer have dimensions approximating 2 microns, while the total thickness of the regrown layer 44 is typically approximately 6 microns. The smaller CdTe crystals are generally toward the upper portion of layer 44. Alternatively, the CdTe crystals could have a thickness approximating that of the layer itself, which is likely an achievable goal. Regrowth occurs at a temperature and during a time interval sufficient to cause substantial interdiffusion between the CdS and the CdTe layers and the CdS is also believed to migrate into the CdTe layer, and particularly in the interstices between the large diameter CdTe crystals.

The photovoltaic cell formed according to the techniques of the present invention has an efficiency with respect to such short wavelength energy which would be equivalent to a device having a very thin CdS layer, and accordingly it is convenient to discuss the effective thickness of the CdS layer. As exemplified in FIG. 3, it is believed that the actual thickness of portion 32 of the CdS layer between the bottom of a CdTe crystal and the top of the low conductivity tin oxide layer 26 is substantially minimized, and it is also believed that the CdS tends to diffuse away from the tin oxide layer and partially enters the cadmium telluride crystals, occupies a portion of the voids between CdTe crystals, and deposits on CdTe grain surfaces. This diffusion or migration of the CdS is generally in the lower portion of the CdTe layer, and some voids 40 generally will still exist between CdTe crystals, with diffused CdS "surrounding" these voids and adjoining the CdTe grain boundaries. The effective thickness of the CdS layer and the tin oxide layer is substantially reduced by the interdiffusion of CdTe and CdS and the "transfer" of CdS onto CdTe grains. FIG. 3 thus represents the presumed flow of CdS material during regrowth, with some of the CdS material migrating upward to deposit on CdTe crystal surfaces or form irregular upwardly extending walls 34 of CdS material between CdTe crystals, while some of the CdS material may form a relatively thin, generally planar layer 32 between the bottom of individual CdTe crystals and the top of the layer 26. During regrowth, some of the CdS material also may diffuse into the CdTe crystals and some CdTe may likewise diffuse into the CdS material. This diffusion and/or interdiffusion also may result in the desired substantial reduction in the effective thickness of the CdS layer.

The significant reduction of the effective thickness of the CdS layer during the regrowth of the active photovoltaic layers can be exemplified by noting that the CdS layer 28 in FIG. 2 prior to regrowth has an effective thickness of from 2,000 to 10,000 Å, while the effective thickness of the CdS layer 32 after regrowth as shown in FIG. 3 is preferably in the range of from approximately 100 to approximately 500 Å. Accordingly, the effective thickness of the CdS layer has been reduced during regrowth so that its thickness subsequent to regrowth is approximately 1/20th or less of its thickness prior to regrowth. This substantial reduction in effective thickness of the CdS layer is thus a primary reason for the substantial increase in photovoltaic efficiency, since the thin CdS layer is able to pass short wavelength light (less than 520 nm) to the junction, while the comparatively thick CdS layer absorbed and wasted that short wavelength energy as heat.

In the middle of the blue response region of photovoltaic devices, e.g., 450 nm wavelength, cells using relatively thick CdS layers (with absorptivities of $10^5$/cm) may have less than 3% quantum efficiency at that wavelength. Cells according to the present invention, however, have a quantum efficiency at the same wavelength of from 60 up to 80% at that wavelength. While an extremely thin CdS layer is desired to pass this low wavelength energy, the average effective thickness of the CdS layer must be sufficient to minimize the number of pinholes or flaws in this layer, and must also be sufficient to form a reasonable junction with the CdTe crystals. According to the present invention, the effective thickness of the CdS layer may be uniformly reduced to less than 500 Å by diffusing a great deal of the material from this layer into the CdTe layer 36 during regrowth, and at least some of this material migrates to enter the gaps between the CdTe crystals.

If the CdS is deposited by spray pyrolysis, the quantum efficiency of the regrown cell decreases slightly with an increase in as-deposited CdS effective thickness greater than 2,000 Å. In one experimental program, an as-deposited CdS layer effective thickness from 5,000 to 6,000 Å nevertheless results in quantum efficiency in excess of 70% at 450 nm on a finished device. While the effective thickness of the CdS layer subsequent to regrowth may thus be reduced to approximately 1/20th of its as-applied thickness, a slightly greater or slightly less effective thickness reduction may occur. In any event, however, the effective thickness of the CdS layer will be significantly reduced during regrowth, and preferably will be reduced to an effective thickness less than approximately 10% of its as-applied thickness, and most preferably will be reduced to approximately 500 Å or less. The addition of cadmium chloride as a flux in the CdTe layer during regrowth may be important for large diameter crystal formation. It is also noted that generation of hot halogen-containing gases during regrowth is important for acceleration of the interdiffusion of the CdS and CdTe.

Due in large part to the substantially reduced effective thickness of the CdS layer, it is possible that some pinholes or other flaws in the applied CdS layer may occur. If a conventional conductor layer adjoins the CdS layer, a pinhole in the CdS layer will result in a short between the CdTe layer and the conductor layer, thereby destroying the energy producing effect of the cell. According to the present invention, such shorting is avoided by applying two dissimilar tin oxide layers, with the layer adjoining the CdS layer being the relatively low conductivity layer. Due to the special nature of this layer, that is adjustment of the layer's carrier concentration as a function of the carrier concentration of the p-type layer, a pinhole in the CdS layer will not result in shorting of the cell, but rather, it will actually produce power due to the heterojunction formed between the cadmium telluride and the low conductivity tin oxide. Since this low conductivity (high resistivity) tin oxide layer is thin, preferably less than about 8000 Å, and since current passes in a direction normal or perpendicular to the plane of this layer, the low conductivity of this layer adds little series resistance to the overall panel. Current flow in the high conductivity tin oxide layer moves in a direction generally parallel to the plane of this layer, and high conductivity for the bottom tin oxide layer is essential to achieve high efficiency.

It has been determined that, by properly doping the top tin oxide layer with zinc or other suitable metal, the electron carrier density of this level may be adjusted to be compatible with the presumed electron carrier density of the p-type layer, in this case the CdTe layer. Adjusting the electron carrier density of the upper tin oxide layer by adding a suitable metal also affects the resistivity of this layer, and to a much lesser amount affects transmissivity. Accordingly, a reasonable tradeoff must be made between the desire to achieve the desired carrier density for this layer, at the same time ensuring that this layer has high transmissivity and is less than a maximum allowable resistivity. Nevertheless, it is possible to obtain high transmissivity for this layer, achieve the desired specific conductivity in the range of from $1.25 \times 10^3$ to 100 mho/cm, and simultaneously obtain an electron carrier density for this layer which preferably is adjusted to be within the range of approximately two to three orders of magnitude of the known or presumed hole carrier density for the CdTe layer. By making the carrier density of the top tin oxide layer compatible with the p-type layer (within at least two or three orders of magnitude), any reasonable flaws in the CdS layer would not result in short-circuiting of the cell for reasons previously noted, but rather an energy-producing junction is formed by the CdTe layer and the top tin oxide layer. If the adjusted electron carrier density of the top tin oxide layer is too low relative to the carrier density of the CdTe layer, the junction formed with the tin oxide layer is undesirably shallow within the CdTe crystals, thereby resulting in low open-circuit voltage for that small contact area between the CdTe and the high resistivity tin oxide layer. On the other hand, if the electron carrier density of the tin oxide layer is undesirably high relative to that of the CdS layer, the junction formed in the CdTe crystals is too deep, thereby resulting in low short circuit current and an unsatisfactory junction. Nevertheless, a reasonably efficient junction may be obtained between the CdTe layer and a tin oxide layer doped with a suitable metal. While it is preferred to form a cell according to the present invention so that a very thin CdS layer capable of passing low wavelength sunlight is obtained, flaws in such a CdS layer will not destroy the cell for the reasons noted above, and accordingly extreme quality control procedures for applying and for regrowing crystals in this layer are not required. Also, it should be understood that it is possible to entirely eliminate the CdS layer and form a suitable photovoltaic cell, so that the bottom tin oxide layer acts as a conductor, the top tin oxide layer acts as the n-type layer (heterojunction partner), and cadmium telluride or other suitable material acts as the p-type layer.

As a further explanation of the latter embodiment described above, it is recognized that the cost of producing photovoltaic modules has been a major limitation to large-scale terrestrial use of photovoltaics as an energy source. The low-cost production of photovoltaics is primarily a function of reducing the cost of materials used, reducing the cost of deposition equipment for applying the active film layers, the simplicity of design of the active layers and the module itself, and a lack of sensitivity to process variations as a function of the materials and the design utilized. Each additional material present in the photovoltaic device adds to the complexity and therefore the cost of the device. A number of materials can conceivably be matched to a given absorber layer (typically the p-type layer) by adjusting the relative ratio of electron or hole carrier concentration contained in each of the p-type and n-type layers. The function of practically adjusting the carrier density of the junction partner layer (typically the n-type layer) often includes complexities which add significantly to the cost of the deposition.

According to this invention, the method of adjusting the carrier concentration of a tin oxide layer is disclosed. The carrier concentration is related to the specific resistivity which may be adjusted by over seven orders in magnitude by changing the amount and type of dopant added to the tin oxide solution, which may be sprayed on top of the heated substrate (glass). The reliability of manufacturing according to this technique is simplified since the base material for each of the various tin oxide layers need not be significantly changed and the deposition technique need not change. The carrier concentration of the tin oxide layer may thus be matched to any of various p-type absorber layers, thus eliminating the requirement of a separate CdS layer, and thus reducing the cost of the photovoltaic modules.

Figure 4:
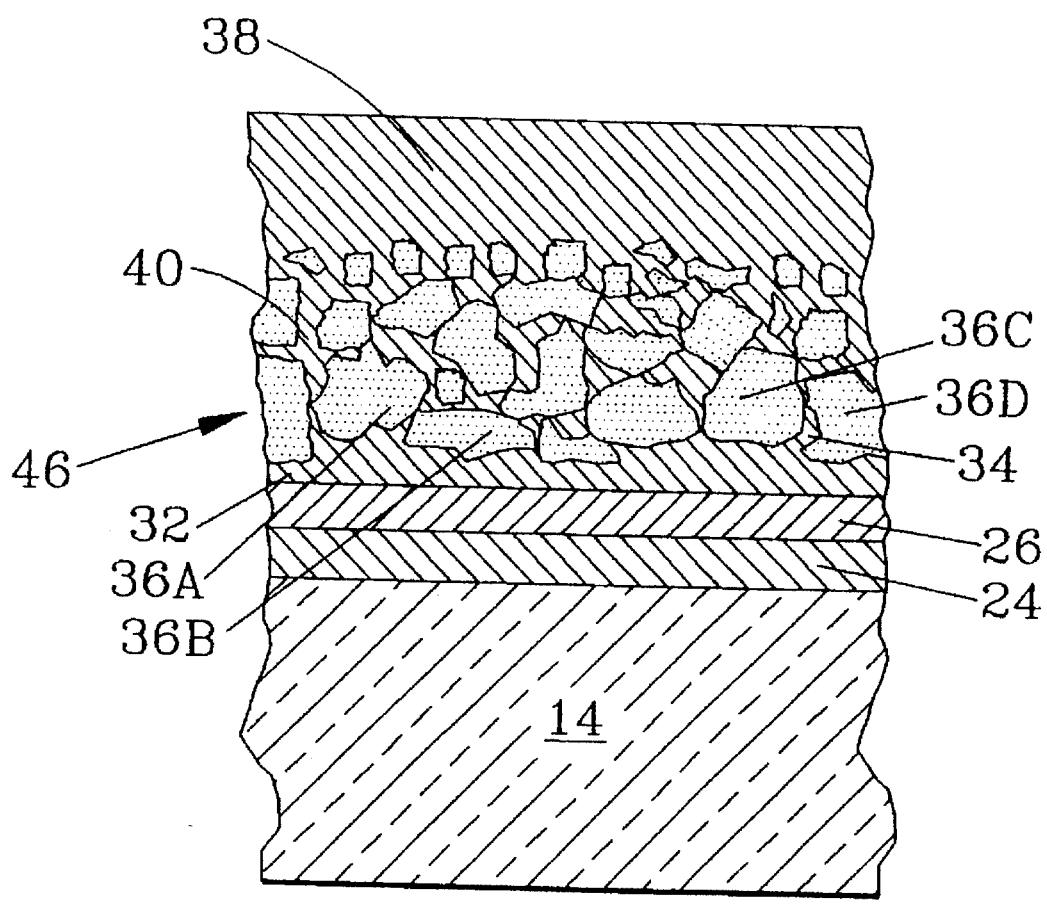
FIG. 4 is a cross-sectional view of an alternate embodiment photovoltaic panel subsequent to regrowth and prior to dividing and series interconnection.

FIG. 4 illustrates in cross-section of a photovoltaic cell according to this latter invention. The glass substrate and conductive layers 24 and 26 are as previously described. Preferably substantially the same conductive material composition is used to form both layers 24 and 26, with the selected material forming a transparent, conducting layer with suitable characteristics, and preferably being from a group consisting of tin oxide, zinc oxide, indium tin oxide, and cadmium stannate. More particularly, this selected material for the layer 24 should be highly conductive, while at the same time this material can be doped to form a layer 26 which acts as a heterojunction partner and a window layer for the photovoltaic cell. For purposes of explanation, this discussion assumes that the material for the p-type layer will be cadmium telluride, although various compounds may be used to form the p-type layer, and exemplary alternatives are discussed below. Also for purposes of explanation, the layer 26 may be doped with cadmium or zinc to reduce the conductivity of this layer and result in the desired n-type material, although lead, mercury, selenium, sulfur, sodium, cesium, mercury, boron, and chromium may be alternative doping materials. Preferably, substantially all of the dopants in the conductive layer 24 differ from substantially all of the dopants in the conductive layer 26.

The photovoltaic panel as shown in FIG. 4 thus comprises a substantially continuous conductive layer 24 of tin oxide for electrically interconnecting the plurality of cells, and a polycrystalline tin oxide layer 26 being applied on layer 24 and doped with a selected amount of a desired dopant. A polycrystalline p-type layer 46 is then formed on the layer 26 with the cadmium telluride crystals of layer 46 being of the form and size previously described. The top electrode layer 38 as shown in FIG. 3 is applied over the cadmium telluride layer, and may migrate down into the porous CdTe layer 26 with no significant adverse affect. A spacing between the lowermost migrated material of layer 38 and the uppermost migrated n-type material is preferred, as shown in FIG. 3, with this spacing being occupied by CdTe crystals and voids between the crystals. For the embodiment as shown in FIG. 4, the migrating material of layer 38 does not contact the tin oxide layer 26, and again voids occur between the CdTe crystals and between this migrating material and the tin oxide layer 26. Sunlight thus passes through the substrate 14 and the layer 24 to reach the junction formed by the n-type layer 26 and the p-type layer 46. Preferably both the layers 24 and 26 are deposited by the same process to reduce manufacturing costs and improve quality control, and spray pyrolysis is one suitable process for depositing both the conductive tin oxide layer 24 and the doped tin oxide layer 26. Gas deposition is clearly envisioned as an economical and controllable deposition process.

According to the method of this invention, a photovoltaic panel including a plurality of photovoltaic cells may be formed on a common substrate by selecting material for the conductive polycrystalline film layer 24, then depositing this selected material by spray pyrolysis or another technique onto the substrate to form a substantially continuous optically transmissive conductive layer for electrically interconnecting the plurality of photovoltaic cells. The p-type material for forming the photovoltaic heterojunction is selected, and the presumed carrier density or approximate carrier density of the p-type layer is known. Substantially the same material used to form the layer 24 may then be selectively doped to form the n-type layer, with, the amount of dopant being a function of the presumed carrier density of the p-type photovoltaic layer. The high conductivity layer 24 may consist of tin oxide and a small amount of fluorine, which may be added to the tin oxide material for layer 24 to enhance conductivity. Although a different dopant is added to the tin oxide material for layer 26, the material for forming both layers 24 and 26 prior to adding the dopant is substantially the same, e.g., tin oxide. In many deposition techniques, temperature also affects the carrier concentration and conductivity of the resulting film. This doped material may then be deposited by spray pyrolysis on the conductive thin film layer 24 to form an n-type polycrystalline thin film layer for the photovoltaic cells, and finally the selected p-type material may be deposited on the n-type material to form a p-type photovoltaic layer and the junction with the n-type layer. Once a panel as shown in FIG. 4 is formed by this technique, the large photovoltaic cell may be divided to form a plurality of photovoltaic cells.

Tin oxide is a preferred material for achieving the above purposes due to its high transparency and dopability to achieve a wide range of resistivity. Other materials may, however, be used. Zinc oxide is one alternative and, although its extinction coefficient is smaller than that for tin oxide, its specific resistivity is considerably higher. The large electron density of tin oxide, generally greater than about $10^{20}/cm^3$, prevents its use as a junction material with every potential semiconductor partner layer. Cadmium telluride may form the p-type layer for such a photovoltaic cell, since its carrier density can be approximately $10^{16}/cm^3$. The cell formed from these layers can thus be expected to have a low open-circuit voltage and/or unsatisfactory short-circuit current. By doping the tin oxide layer, however, a junction may be produced with the cadmium telluride layer which results in a reasonable voltage, current, and fill factor. The uniform continuity of the low carrier concentration density tin oxide layer is necessary to avoid shorts, while at the same time this tin oxide layer must remain thin, and preferably less than about 8,000 Å, to prevent unnecessary optical absorption. These objectives can be achieved by applying this layer with spray pyrolysis utilizing a large number of low molarity droplets to consistently and completely cover the low resistance tin oxide layer and thereby prevent low resistance shunt paths.

It should also be understood that the p-material layer may be formed from materials other than CdTe. According to the above technique, an inexpensive copper indium diselenide cell may be formed with the n-type material being a doped tin oxide layer formed by spray pyrolysis. A similar cell may be formed utilizing copper sulfide, copper indium disulfide or copper indium diselenide as the p-type material. Other cells which may be formed according to this invention include cells having a p-type semiconductor layer of either polycrystalline silicon, aluminum antimonide, gallium arsenide, or indium phosphide.

According to the method of the present invention, the effective thickness of the n-type material layer is reduced so that at least a substantial amount of sunlight, i.e., at least 25%, and preferably at least 50%, having a wavelength with an energy higher than the bandgap of the n-type material for this layer (short wavelength light) passes through this reduced effective thickness n-type layer to be absorbed by the photovoltaic heterojunction. Since the n-type layer must be physically thin, flaws or holes in this otherwise continuous layer can be expected. According to a preferred embodiment of this invention, the p-type layer forms a desired photovoltaic junction with this thin n-type layer, and also forms a photovoltaic junction with the conductive layer 26 where flaws occur in the n-type layer. This latter junction has a reasonably high efficiency due to the doping at this layer 26, so that its electron carrier density is within at least three orders of magnitude of the known or presumed carrier density of the p-type material. In order to prevent shorts in the cell, the specific conductivity of this layer 26 is also maintained within the range previously described.

Once a panel has been regrown in a manner which results in layers 24, 26, 32 and 36 as shown in FIG. 3, or 24, 26, and 46 as shown in FIG. 4, the panel may be divided and series interconnected. Using a mechanical cutter, a sandblaster, a laser, or other suitable means, a thin strip of applied layers may be removed down to the glass substrate, and a portion of the thin elongate gap formed by this operation filled with a suitable insulating film to cut the electrical connection between the bottom electrode layers 24 of adjacent cells. A desired electrode strip may be formed on an edge portion of the bottom tin oxide layer. Either prior or subsequent to this operation, a top electrode layer 38 as shown in FIG. 3 may be deposited over the CdTe layer, with some of this layer 38 optionally filling the upper portion of gaps between the CdTe crystals. Accordingly, the top electrode layer 38 may include downwardly projecting walls 40 which preferably do not come into contact with the upwardly projecting walls 34 of the CdS layer. Various materials may be used for the layer 38, and it is presently preferred that the layer be formed by a graphite paste process, thereby achieving relatively low material and deposition cost. The series interconnection of the cells may then be formed by depositing a conductive electrode layer on top of layer 38, with the conductive electrode layer filling part of the gap formed by the cell division technique and forming a reliable electrical connection between the top electrode of one cell and the bottom electrode of an adjacent cell. The completed cell may then be encapsulated. Any of the layers 24, 26, or 46 may thus include a narrow elongate cut to divide the panel into individual cells and to series interconnect the cells. Each of these layers is nevertheless deposited as and remains a substantially continuous layer, thereby resulting in comparatively low manufacturing costs.

While tin oxide is a preferred material for each of the high conductivity and low conductivity layers of a cell according to the present invention due to its high transmissivity and ability to easily adjust its carrier concentration, other materials may be used to form this bottom electrode. A zinc oxide layer may form this conductor layer, and is particularly well suited for forming the low conductivity layer. The material used to dope the conductor and adjust its carrier density and resistivity should not substantially affect the high transmissivity of this layer, and zinc, indium, gallium, and aluminum are a suitable doping metal for this purpose. Other dopants may also be used. While the tin oxide layers may be formed according to spray pyrolysis techniques, the invention is not limited to using spray pyrolysis to form the conductor layers. Also, it should be understood that while the bottom conductor layer as described herein consists of the bottom high conductivity tin oxide layer and a substantially increased resistivity top tin oxide layer, the conductivity of the conductor layer may change gradually from the bottom to the top of the conductor layer, so that two distinct layers are not formed but rather a gradual change in conductivity of the tin oxide layer occurs as one moves up through the thickness of the layer. The prospect of gradually changing the conductivity of this layer is not difficult to obtain when panels are formed on a mass production basis, since the glass substrate may be moved over a series of deposition areas each having an increasing or decreasing amount of added metal as a dopant.

As previously noted, high continuity of the tin oxide layer adjoining the CdS layer is essential, and this high continuity can be obtained by reducing the molarity of the tin oxide solution which form this upper layer, and increasing the deposition time and thus the number of droplets reaching the substrate. While no precise molarity for forming this uppermost tin oxide layer is critical, the molarity of the solution forming the uppermost tin oxide layer typically will be less than 0.5 moles/liter, and frequently in the range of about 0.2 moles/liter or less. While the techniques of the present invention are particularly well-suited for forming a high efficiency CdS/CdTe photovoltaic cell, it should be understood that the concepts of the present invention are not limited to use of these chemical layers for either the p-type or the n-type material. In particular, it should be understood that substantially increased efficiency of a photovoltaic device is formed according to the present invention by obtaining an n-type material layer which has a substantially reduced effective thickness compared to its as-deposited thickness, and that this n-type layer is obtained by simultaneously heating the p-type material and the n-type material layer to substantially increase the size of the crystals in each of these layers while simultaneously diffusing and interdiffusing the n-type and the p-type layers.

A complete understanding of the mechanical and chemical functions occurring during the substantial reduction in the effective thickness of the CdS layer (or other n-type layer highly transmissive of sunlight) is not yet fully understood. This reduction in effective thickness is primarily believed to be due to diffusion, interdiffusion, and/or migration of CdS material into the CdTe (or other p-type material) layer, with CdS material entering the voids between the regrown CdTe crystals and depositing on the available CdTe surfaces. The term "diffusion" as used herein with respect to the action occurring during the reduction in the effective thickness of the n-type layer should be understood to encompass conventional diffusion, as well as interdiffusion and migration into the p-type layer. Also, those skilled in the, art will appreciate that while diffusion of the n-type layer into the p-type layer will reduce the effective thickness of the n-type layer, as explained above, this action can also be similarly described as diffusion of the p-type layer into the n-type layer. The key is the desired effective reduction in the thickness of the n-type layer which occurs during heating, not the specific mechanical and/or chemical function which causes this reduction. Another benefit of this CdS "diffusion" action is that the n-type material tends to cover a substantially higher portion of the CdTe grain surfaces than would occur during a planar interface of two layers. Also, it should be understood that the benefit of passing short wavelength light to the junction will occur regardless of the selected n-type material, and that the earlier reference to passing light less than 520 nm is based on the bandgap of CdS, which is approximately 520 nm. The bandgap of various materials suitable for forming the n-type layer is well known, and energy bandgaps for various materials can be easily calculated from minimum room temperature energy gap values published in available handbooks, such as *CRC HANDBOOK OF CHEMISTRY & PHYSICS*, 58th Edition. The present invention thus envisions the significant reduction in the effective thickness of the n-type material layer by "diffusion" into the p-type layer, such that a majority of sunlight energy having a wavelength with an energy higher than the bandgap of the selected n-type material passes through the reduced thickness n-type layer to react with the photovoltaic junction.

FIG. 5 depicts in cross-section components of a photovoltaic cell 80 according to the present invention. The depicted cell comprises film layers 84, 86, 88, and 90 each formed successively on a glass substrate 82. Those skilled in the art will appreciate that the relative thickness of film layers with respect to each other is shown, but that the glass substrate 82 is in reality much thicker than that depicted with respect to the film layers. Also, those skilled in the art will appreciate that the cell shown in FIG. 5 has not yet been encapsulated or series interconnected, and that these operations may occur in the manner as explained in the prior art in order to produce a useful photovoltaic panel comprised of a plurality of series connected photovoltaic cells.

The cell depicted in FIG. 5 is of a back wall configuration, so that sun light passes first through the glass substrate and then to the junction formed by the active photovoltaic layers. A panel formed according to the FIG. 5 construction is thus turned over during typical outdoor use, so that the glass substrate 82 is above the active layers discussed subsequently. Nevertheless, the cell is formed with the glass as a base or substrate, and accordingly the terms "top" or "upper" when referring to the layers discussed subsequently should be understood with respect to the substrate being beneath these layers. It should be understood that the techniques of the present invention may also be applicable to manufacturing frontwall photovoltaic cells, wherein sun light is absorbed by the junction formed by a p-type layer on top of an n-type layer, so that light rays do not pass through the n-type layer, and to photovoltaic devices structures having layers deposited on an opaque rather than a transparent substrate.

The vitreous substrate 82 has a substantially flat upper surface 83 on which is formed an electrode layer. The electrode may be any electrically conductive material that has a high transmissivity to maintain reasonably high photovoltaic efficiency since sun light must pass through these layers to reach the photovoltaic heterojunction discussed subsequently. The electrode may be composed of tin oxide, zinc oxide, indium tin oxide, cadmium stannate or metal containing grid. For the embodiment depicted in FIG. 5, this electrode layer consists of a bottom tin oxide layer 84 and an optional top tin oxide layer 86. The bottom electrode layer 84 has a comparatively high conductivity for transmitting energy between interconnected cells with low current flow resistance. The top electrode layer 86 has a comparatively low conductivity and has high continuity and sees as a backup n-type heterojunction material to produce energy in an area where pin-holes appear in the n-type layer 88. The lower tin oxide layer 84 will typically have a thickness in the range of from about 0.4 to 1.0 microns, and the thickness of the upper tin oxide layer 86 will typically be in the range of from about 0.1 to 1.0 microns. Deposited on top of the tin oxide layer 86 is a continuous or semicontinuous layer 88 of an n-type material. For the embodiment discussed below, the n-type layer 88 is a cadmium sulfide layer which forms a photovoltaic heterojunction with the p-type layer 90, which may be cadmium telluride. The CdS layer 88 has an effective thickness subsequent to regrowth which is preferably in the range of from approximately 100 Å to approximately 500 Å, and its effective thickness may have been substantially reduced during regrowth. In one aspect, the present invention is concerned with improved techniques for forming the p-type layer 90 and, for the embodiment discussed below and shown in FIG. 5, the p-type material will be cadmium telluride.

Some semiconductor materials, such as CdTe, achieve desired conduction characteristics due to a combination of residual impurities in the material and/or non-equivalence of the ratios of the material components. Accordingly, such impurities or non-equivalence conditions are necessary for certain semiconductor applications. On the other hand, semiconductor materials may form insulators or low or very low conductivity semiconductors if prepared such that components are equivalent. The desired properties of a semiconductor material forming a layer of a thin film photovoltaic cell can be markedly different than the properties desired for numerous other semiconductor applications. The active layers of a thin film cell are desirably p-type. These film layers are polycrystalline, and generally film layers are recrystallized at elevated temperatures thereby increasing the size of crystals and modifying their morphology to enhance the photovoltaic conversion efficiency.

A low cost and highly reproducible technique for forming a uniform layer 90 having high photovoltaic efficiency will now be described. A key feature of this technique is the separation of steps involving heat treating of this p-type material in an oxidizing environment to adjust and improve its electronic properties, and the subsequent regrowth of the p-type crystals during recrystallization in a substantially inert environment. While both steps are in a sense "heat treating" or "annealing" steps, it is preferable for purposes of this explanation to refer to the first step as an impurity gettering step, and the second step as a recrystallization step, thereby allowing the steps to be more easily distinguished. The technique of this invention allows for forming a p-type film of a desired thickness and morphology, with this film layer having desired electronic properties and crystal dimensions and morphology which will effectively result in a reproducible and highly efficient cell.

Figure 8:
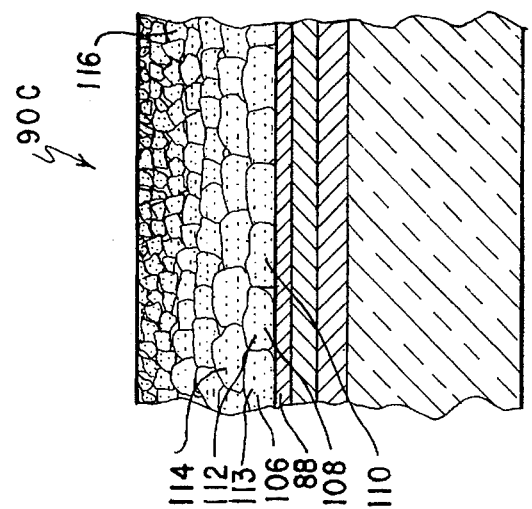
FIG. 8 is a cross-sectional view of a conceptualized CdTe layer after the impurity gettering and recrystallization steps to enhance crystal growth.
Figure 7:
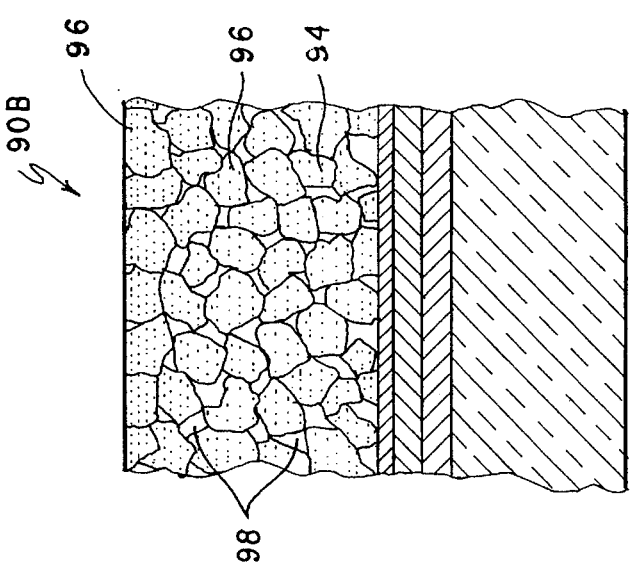
FIG. 7 is a cross-sectional view of a conceptualized CdTe layer after compression.
Figure 6:
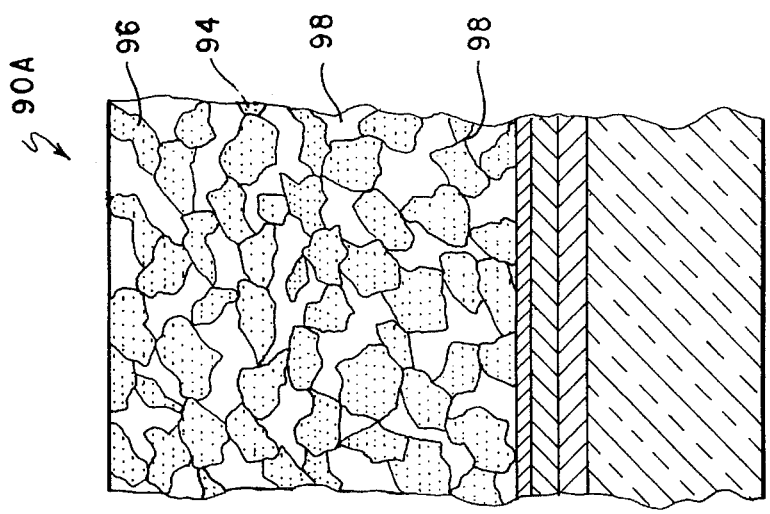
FIG. 6 is a cross-sectional view of a conceptualized CdTe layer subsequent to oxidation and prior to compression.

The CdTe film may be deposited at substantially ambient or room temperature by spraying a cadmium telluride powder mixed with a suitable carrier, such as propylene glycol or terpineol, to form a slurry. The sprayed layer may be dried at room temperature or at a slightly elevated temperature of less than about 250° C. to evaporate the carrier. The formed layer at this stage will be similar to layer 90A depicted conceptually in FIG. 6. The individual crystals 94, 96 within this layer have a mean diameter in the range of less than about 0.6 microns, and the total thickness of a typical layer 90A may be approximately 68 microns. Once the carrier has evaporated, substantial voids 98 are present between crystals, and the volume of the crystals within the layer 90A compared to the total volume of the layer 90A will be about 25% (75% porous). FIG. 6 depicts a conceptualized CdTe layer at this stage. Although edge surfaces of crystals are in contact with each other, this contact is not completely apparent in cross-section in view of the high porosity of this layer. Also, many of the apparently smaller crystals shown in FIG. 6 will have a larger mean diameter than depicted, since the cross-section of some crystals is through a corner portion of the crystal. Similarly, the edge surfaces of the crystals subsequently described and shown in FIG. 7 and 8 are in contact with neighboring crystals, and some of the crystals shown in these figures also have a larger diameter than is shown in the cross-sectional views.

The cell construction substantially as shown in FIG. 6 may then be subjected to an impurity gettering step which is a heat treating process in an oxidizing environment. The preferred oxidizing environment for low cost processing is air. The impurity gettering step may occur in a belt oven maintained at a temperature of from about 300° C. to 500° C., and typically requires a relatively short time period of from about 5 seconds to 30 minutes, and preferably from about 2 minutes to 10 minutes at oxidizing temperatures.

During this impurity gettering step, the CdTe layer 90A as shown in FIG. 6 is open faced, so that both oxidants and heat are uniformly available over the entire CdTe layer surface on the panel, thereby achieving high uniformity. Water content affects oxidation rate, and the water vapor in the air during this step should be controlled, preferably to less than 50 grains per pound of dry air or at least to a reproducible value. Preferably, the oxidizing environment contains at least 1.0% by volume oxidants and more preferably at least 20% by volume oxidants. The oxidants may include halogens, oxygen, sulphate, phosphates, oxides such as sulfur dioxide and carbon monoxide, and peroxides. The preferred oxidants are oxygen, sulfur dioxide, and carbon monoxide, with the most preferred oxidant being oxygen.

The impurity gettering step achieves the desired uniform electrical properties of the CdTe film, in that donor impurities in the film layer, which otherwise render the film layer 90A n-type or poorly p-type, are "bound-up" or deactivated, so that residual acceptors are dominant and cause the CdTe film to be desirably p-type in its electronic characteristics. It may also be that oxygen acts as an impurity acceptor to further enhance the p-type character of the CdTe. Regardless of the actual mechanism, the result is that a p-type CdTe is formed with satisfactory p-type characterization. It is not believed that any morphological changes occur during the impurity gettering step, though some chemical changes and physical property changes presumably do occur. Since the heat treated film is open faced, oxidation of the crystals is highly uniform at different spaced planar locations of the CdTe film. Even though layer 90A is highly porous at this stage, an oxidation gradient through the thickness of the CdTe layer is established during this impurity gettering step, so that crystals in the lower portion of this layer (adjacent the CdS layer 88) are less oxidized than crystals in the upper portion of the layer 90A. In a hypothetical embodiment, for example, crystals adjacent the top of the layer 90A may have an oxidized coating about 70 Angstroms thick on the exterior surface of each crystal, while CdTe crystals spaced approximately in the center of the CdTe film thickness may have an oxidized coating approximately 10 Angstroms thick on the crystal exterior surfaces. The preferred oxidized coating is formed of oxides. The bottom crystals closely adjacent the CdS layer will be the least oxidized, with an exemplary average of about 2 Angstroms of an oxidized coating thickness on the exterior surface of these crystals.

The degree of oxidation and slope of the oxidation gradient is a function of the concentration of oxidants in the oxidizing environment, the relative concentrations of the p-layer components, and the temperature and duration of the impurity gettering step at oxidizing temperatures. The sharpest oxidation gradient may be obtained by heating the cell in an inert atmosphere and, when the system is at the desired temperature, purging oxidant(s) into the atmosphere for a controlled time period. The magnitude of the oxidation gradient is increased over other techniques as the cell is not heated in an oxidizing atmosphere to the desired temperature level. In other words, the time for oxidation in the purged system is substantially less than that for the other techniques.

Once the desired electrical properties have been obtained to render the layer 90A properly p-type and the desired oxidation gradient has been established through the thickness of this layer, the CdTe layer may be compressed in a compression step by the application of a substantial mechanical force to reduce the porosity of the layer. The layer is about 75% void space and 25% solids before compression and about 60% void space and 40% solids after compression. This application of mechanical force may occur utilizing equipment and techniques disclosed in U.S. Pat. No. 4,735,909, hereby incorporated by reference. During this compressive step, the CdTe film thickness is preferably reduced to approximately 65% of its original thickness, and accordingly the exemplary compressed layer 90B as shown in FIG. 7 has a thickness of about 12 microns. During this compression step, no chemical or electrical changes in the CdTe crystals occur, and compression serves to reduce the air spaces between crystals to enhance the efficacy of the flux resulting in the desired crystal growth during the subsequent recrystallization step.

Subsequent to the compression step, the CdTe film layer may be annealed in an inert atmosphere in a recrystallization step to obtain desired crystal growth. During the recrystallization step, the CdTe layers deposited on a pair of panels are preferably arranged in a face-to-face relationship, or at least against a noncontaminating barrier material to restrict flux movement to a desired area. Any other arrangement resulting in a controlled confinement of the flux may be utilized. The oxidant content of the annealing atmosphere is maintained at less than 5% by volume, and preferably less than about 0.05% by volume to minimize or avoid nonuniformity which may occur, even if the face-to-face configuration is used due to excessive oxidation at the edges. Preferably, the oxidant is oxygen and the annealing atmosphere has less than 3% oxygen by weight and more preferably less than 0.5% by weight. The temperature of the annealing oven is preferably maintained in the range of from about 400° C. to about 700° C., more preferably from about 480° C. to 560° C., and during a time interval of from about 10 minutes to 60 minutes, and preferably between about 40 and 60 minutes. This recrystallization process further reduces the CdTe film thickness to a typical range of from about 4 to 8 microns. The benefit of the establishment of an oxidation gradient during the heat treating step, as described above, relates to the ability to form a desired metallurgical interface between the CdS layer and the CdTe layer, and the related formation of substantially large crystals having substantially planar interfaces adjacent the CdS layer and smaller crystals above these large crystals.

The rate of temperature rise during the recrystallization step in the temperature range where the flux is active (e.g., above 450° C. and preferably less than 600° C.), affects the result and is an important factor. Preferably, the temperature rise rate is above 3° C./min in the active flux range, and preferably less than about 25° C./min. If the temperature rise rate is too high, there may be too much crystal growth due to a high flux density; if too low, there may be too little crystal growth due to a low flux density.

If the CdTe layer is annealed in a face-to-face manner but an oxidized coating variation and/or gradient has not been properly established through the thickness of the CdTe layer and the surfaces of CdTe crystals adjacent the CdS layer are either not oxidized or oxidized to substantially the same extent as the CdTe crystals adjacent the top of the CdTe layer or if the layer is not oxidized in an impurity gettering step, annealing in the recrystallization step may result in more uniformly sized CdTe crystals throughout the thickness of the layer. This morphology still may be satisfactory with respect to electronic characteristics since the crystal grain boundary surface area to crystal grain volume is minimized. Formation of such crystals in this manner, however, results in a poor metallurgical interface between CdS layer and the CdTe layer. Large crystals throughout the CdTe layer result in substantial interstitial voids between crystals, and accordingly there is poor planar coverage between the top of the CdS layer and the bottom surface of adjoining CdTe crystals. Since the contact area between the CdS crystals and the CdTe crystals is poor, and since the CdS-air and CdTe-air interfaces are reflective, the reflective losses to cell performance can be significant if there is poor planar coverage. This reflective loss can be as high as 10% or even 30% depending on the severity of the interface condition, and this reflective loss inherently reduces the photovoltaic efficiency of the cell since reflected light cannot be absorbed in the CdTe layer.

By establishing the oxidation gradient through the thickness of the CdTe layer as described above, the size and morphology of the CdTe crystal grains through the layer may be controlled or adjusted. The CdTe crystals adjacent the CdS layer are only slightly oxidized compared to the top CdTe crystals. Since the thicker oxidized layer on the crystals toward the top of the CdTe film retards the effect of the flux, which is preferably cadmium chloride, recrystallization will necessarily be initiated in the lower planar portion of the CdTe layer during the recrystallization step. In this manner, nucleation sites are initiated (and growth is more rapid) near the top of the CdS film, thus resulting in substantially large crystals 106, 108, 110, 112, and 113 as shown in FIG. 8 which properly grow in a manner such that the lowermost surface of these crystals obtain substantially desired planar metallurgical interface with the top surface of the CdS film. More particularly, recrystallization is initiated at sites within the CdTe layer within roughly 1 micron of the top CdS surface, and preferably within roughly ½ micron of the CdS surface. This lower planar layer consists essentially of relatively large crystals having a mean diameter of about 1.5 to 3 microns, and this layer has a residual porosity of less than 30%, and preferably about 15% or less. The relatively large crystals are preferably 2 to 1,000 times, more preferably, 3 to 30 times, and most preferably 10 times their as deposited crystal size.

The crystals 114, 116 in the upper layer portion of the regrown CdTe film layer 90C are significantly smaller than the lower crystals, but this is not significant to photovoltaic efficiency, since only the lower crystals are critical to both establishing the desired metallurgical interface for high efficiency devices and minimizing surface recombination to insure good electronic properties The and exhibiting satisfactory diffusion lengths. crystals in the upper planar portion of the CdTe layer (above the lower large crystal layers) may have a mean diameter of from about 0.5 to 2 microns, and typically the majority of crystals in this upper planar portion will have a mean diameter of about 1 micron or less. The porosity of this upper layer portion is substantially greater, and typically in the range of about 20% to 45%. The overall porosity of the regrown CdTe layer will thus be in the range of from about 15% to 30%, and typically about 25%.

While not wishing to be bound by any theory, it must be noted that the porous layer (the top 2–4 microns of the CdTe layer) is non-essential for proper device function. It is only the result of insuring that an improved interface exists at the CdTe/window layer metallurgical interface. As a variation, a multiple film deposition may be utilized to allow both the metallurgical interface to be satisfactory and the porous CdTe layer to be further modified in order to achieve its optimal morphological and electronic characteristics.

FIG. 9 depicts two panels 120, 122 arranged in a face-to-face relationship for the recrystallization step. These panels are maintained in the desired relationship by channel-shape clips 124. During the compression step as referred to above, very thin gaps of about 0.03 inches are intentionally formed between elongate areas 126 each compressed by a roller and having a width of about 0.40 inches. These gaps result in slightly raised and uncompressed portions 128, which do not form active areas of the photovoltaic cells, and instead are subsequently removed to form the series interconnection. Similarly, the edges of each of the panels are not compressed, thereby establishing a non-compressed border around each panel comprising raised border portions 130, 132, 134, and 136. By intentionally not compressing these portions, the panels 120, 122 may be placed in a face-to-face relationship, with the opposing non-compressed portions contacting each other to slightly space the active compressed areas apart (typically at least 10 to 20 microns) during the recrystallization step and to form a "seal" around the periphery.

As an alternative to using non-compressed areas to provide the desired spacing between the active film layers during this regrowth, corner spacers of a desired uniform thickness may be used between the panels to separate the films during this face-to-face regrowth operation. The spacers may be placed about the perimeter of the face-to-face panels, and may be sufficiently solid to substantially seal the interior spacing between the opposing CdTe layers. Alternatively, if so desired, the spacers may have one or more holes uniformly or randomly spaced therethrough, so that the interior space is in greater fluid communication with the atmosphere in the oven exterior of the face-to-face panels. As yet another alternative, corner or intermediate space may be used to uniformly separate the CdTe layers, and elongate substantially solid clips or clips with holes may be used for establishing the desired sealing/partial "breathing" relationship during the recrystallization step.

A modification of the two-step procedure described above includes an additional impurity gettering step after the recrystallization step. The second impurity gettering step effectively results in at least three heat treatment or annealing steps, and may be added to the two-step process to further substantially minimize the number of active donor impurities in the recrystallized p-type material. Impurities bound up during the second impurity gettering step may include residual impurities which were not oxidized during the first impurity gettering step, and impurities or contaminants which were introduced as a result of or evolved from the handling or process steps subsequent to the first impurity gettering step. This second impurity gettering step preferably occurs with the substrate panels open faced in the same manner as the first impurity gettering step. This second impurity gettering step may occur in an atmosphere containing oxidants, such as air or other oxygen containing gas, and at a temperature of about 150° C. to 340° C., and preferably between about 150° C. to 250° C., and for a time interval of about 5 to 60 minutes. The second impurity gettering step may both enhance the p-type character of the CdTe film, and result in an improved CdTe surface layer for forming a better mechanical and/or electrical connection to the top electrode layer. The second impurity gettering step may occur prior to, subsequent to, or prior to and subsequent to, etching the CdTe layer for the electrode connection.

The technique described earlier establishes a lower CdTe layer comprising large mean diameter crystals adjacent and forming a planar interface with the CdS layer, and an upper, more porous CdTe layer having relatively smaller crystals. Alternative techniques may be used for forming a cell comprising two or more distinct layers which are each part of the p-type layer, with one dense layer including large crystals forming a planar interface with the n-type material layer, and a second layer or layers comprising crystals having dissimilar p-type characteristics. The first layer may be formed from a CdTe material which is heat treated to getter impurities in a manner discussed above. This first layer may be approximately 1-½ microns thick, so that the first layer, once recrystallized in an inert atmosphere, is substantially a monolayer of large CdTe crystals with desired electrical properties attributable to oxidation. The optimal second or upper layer, which may be several microns thick, may be applied subsequent to heat treatment and may not be heat treated, or may be heat treated to form a material which is more p-type than it was prior to heat treatment, and significantly more p-type than the first layer. For a cell having high photovoltaic efficiency, the first layer should have a low conductivity (for cadmium telluride, from about 0.5 to $5\times10^{15}$ holes/cm) since this layer adjoins the n-type window layer and forms a heterojunction therewith. The second layer may have a higher conductivity for easier contactability and/or lower series resistance losses and thus a higher hole concentration than the first layer, since it is spaced from the n-type heterojunction partner. The second layer may even be an alloy of CdTe.

Another technique for forming such a CdTe layer of two dissimilar p-type layer characteristics is to utilize the additional impurity gettering step discussed above to adjust the p-type characteristics of either the second p-type layer, or both the first and second p-type layers. This second layer may be formed from a material slightly different than the first layer, or could be formed according to a slightly modified process, as described subsequently. Thus, the second layer may have substantially more carriers after recrystallization than the first layer, and post oxidizing this CdTe layer may be used to desirably achieve the p-type characteristics for both the first and second layers. The second layer may also act as a buffer layer to allow improved electrical isolation of the device electrodes, one of which is subsequently applied. The second layer may optionally be excluded, however, and the electrode layer applied directly to the 1-½ micron thick CdTe monolayer.

A significant benefit of face-to-face recrystallization procedure, and particularly one which obtains substantial sealing of the spacing between opposing CdTe layers, is that the desired cadmium chloride flux level is maintained during the recrystallization operation to enhance crystal growth. Cadmium chloride may be added to the CdS material to form a desired flux to assist the formation of large CdTe crystals or to help modify the CdTe/CdS interface. The face-to-face recrystallization as disclosed above also substantially reduces the sensitivity of the heat treated p-type layer to contamination. By providing face-to-face recrystallization, the time for exchange of gases between the opposing CdTe layers is slow, and generally the half-life of gas exchange will be of the order of at least thirty minutes. This enables the materials for construction of the recrystallization oven to be fabricated from less expensive stainless steel alloys rather than ceramic or expensive alloys, thereby reducing manufacturing costs. Once annealed, the CdTe layer may be chemically etched, a top electrode layer applied (preferably forming a series interconnection between divided cells), and the completed and interconnected cells encapsulated.

It should be understood that the CdTe raw material composition has a significant affect upon obtaining the desired CdTe layer. The desired CdTe material may be formed by placing cadmium metal and tellurium metal into evacuated quartz ampules and the mixture processed at about 1200° C. with little or no allowable contamination. For this process, the cadmium and tellurium are weighed out in equal molar quantities, and true stoichiometry requires that the cadmium and tellurium metals are present within approximately 0.01 atomic percentage of each other. Any initial metal weight that exists as an oxide will not form CdTe, or a hydroxide or other material that converts to an oxide at high temperatures and will additionally push the CdTe ratio away from true stoichiometry. Extreme care must thus be used to produce CdTe that contains a consistent amount of excess cadmium or tellurium that is not bound together as CdTe. An off-stoichiometry condition changes the susceptibility of the material to oxidation during the p-type oxidation or heat treating step, which can affect (either adversely or beneficially) achieving the desired morphology of the CdTe film. According to a second technique for forming a CdTe compound, powders of cadmium and tellurium are mixed thoroughly together, then heated in an inert atmosphere from about 500° C. to 700° C. until completely reacted. Excess amount of cadmium or tellurium will be more volatile than the reacted CdTe, and will thus evaporate to leave the desired stoichiometry. Regardless of the technique used to form the CdTe compound, it will be recognized that impurities present within the formed cadmium telluride will affect the oxidation susceptibility during the heat treating step, and that effective control of oxidized and oxidizable impurities during this step is necessary for achieving a consistent (and/or optimum) CdTe stoichiometry.

The separate impurity gettering and recrystallization steps as discussed above produce a uniform CdTe layer utilizing a reproducible process wherein the electrical properties and morphology of the CdTe may be easily adjusted. The produced result is surprising since the electronic property adjustment achieved during the impurity gettering step occurs prior to the recrystallization step, and it would be presumed that electronic characteristics of the CdTe film would change dramatically during the recrystallization step. It is also fortuitous that the oxidation gradient desirable to retard the flux and define the nucleation and growth of the CdTe during the recrystallization step may be simultaneously obtained during the impurity gettering step which achieves the adjustment of the electrical properties of the CdTe film to result in high photovoltaic efficiencies. The fact that electronic adjustment of the p-type material occurs prior to re-crystallization allows this two-step technique to be used in alternative processes wherein the electronic properties are adjusted prior to or during deposition of the CdTe film on the CdS layer.

In an alternative process, the CdTe could be oxidized during deposition by heating the substrate to a desired temperature in each zone of a multiple zone oxidation oven, while the CdTe is sprayed on the substrate as it passes through these zones. By providing multiple spray nozzles and by varying the oxidant concentration in the multiple heated zones, the desired oxidation gradient may be established as the CdTe layer is built up through spraying.

CdTe material may be heat treated in an oxidizing environment and, once its electronic properties are adjusted, the p-type oxidized film then sprayed as a slurry on the CdS layer. By pre-oxidizing the CdTe material before it is deposited on the substrate, the necessity of a belt-type furnace to heat the entire substrate is avoided, and a batch-type oven may be used for uniformly heating a relatively small amount of CdTe raw material having only a small fraction of the heat capacity of the film/substrate combination. This technique thus has an advantage of a substantial savings in utility cost compared to the previously described technique. A disadvantage of this technique, however, is that the desired oxidation gradient through the CdTe film is not established, since raw material CdTe is uniformly preoxidized then deposited on the substrate. A combination of this alternative with the previous or following methods may also be used as a viable process.

Techniques could also be used to oxidize CdTe raw material by varying amounts, then deposit the less oxidized material on the CdS layer, and more oxidized material on the previously deposited CdTe material. This alternative technique may result in a superior optimization, but also may complicate the CdTe deposition process, making it difficult to maintain high quality and uniformity. As yet another alternative, the CdTe raw material may be slightly pre-oxidized prior to being deposited on the CdS material, so that all the deposited CdTe crystals throughout the thickness of the layer were, for example, oxidized to 10% of full or complete oxidation. An impurity gettering step may then be used to establish the desired gradient throughout the film thickness, so that the top CdTe crystals were significantly more oxidized, while the crystals adjacent the CdS layer would be oxidized only to substantially the extent which the raw material was oxidized during the preoxidizing step.

Those skilled in the art will appreciate that techniques other than spraying may be used to deposit the CdTe film on the n-type layer. One alternative to the spraying technique described above is to deposit a layer of cadmium chloride having a thickness of from about 75 Å to 200 Å on top of the CdS layer. As noted in the prior art section, subsequent layers of tellurium, cadmium, and tellurium may be deposited on the cadmium chloride layer. The disadvantage of this alternative technique is the difficulty with maintaining the desired true stoichiometry between the Cd and Te, particularly on a local basis. Electrode position or screen printing techniques could also be used to deposit the p-type layer.

The techniques of the present invention will be applicable to forming p-type photovoltaic layers from various semiconductor materials. When cadmium telluride is the semiconductor material, aluminum, indium, and cadmium ions are all donor species which can be oxidized during the heat treating step so that they no longer act as a donor to the matrix, thereby causing the CdTe semiconductor material to become more p-type. Cadmium telluride is typically an n-type material due to naturally occurring impurities or, in some cases is, "intrinsic" with the number of holes approximating the number of electrons. The desired reduction in the number of donors to render the material desirably p-type will thus depend on the condition of the material prior to the heat treating step. Cadmium telluride has theoretically about $1.5 \times 10^{22}$ CdTe molecules/cm$^3$, and an excess of about $1 \times 10^{14}$ holes/cm$^3$ is generally required to render this material desirably p-type. Hole concentration more optimally is from about $5 \times 10^{14}$/cm$^3$ to $5 \times 10^{16}$/cm$^3$ for a desirable p-type CdTe material. A 1 ppm, 100% active donor impurity level corresponds to approximately $1.5 \times 10^{16}$ holes/cm$^3$. If the hole concentration level is $1 \times 10^{15}$/cm$^3$, then a reduction of donors by more than 15 times is required during the heat treating step to obtain the desired result.

The techniques of this invention can be used with other semiconductor materials to enhance their p-type properties and the desired crystal growth and morphology of the p-type layer. If copper indium diselenide ("CIS") is used as the p-type material, for example, indium$^{++}$ ions can be converted to indium$^{+++}$ ions through oxidation in an air heat treatment, thereby resulting in a conversion from an n-type, insulating, or poorly p-type material to a quality p-type material. In this CIS cell construction, copper species may also be neutralized by oxidation, resulting in a more p-type material compared to the material prior to the heat treating step. If gallium arsenide is the semiconductor material, gallium, and to a larger extent, arsenic, may exist in other oxidation states. Heat treating and annealing according to the present invention should also improve the p-type characteristics of this cell and thus enhance the photovoltaic efficiency of such a cell construction. The techniques of the present invention are thus applicable to various photovoltaic devices based on polycrystalline II-VI, I-III-VI, or III-V P-type semiconductor materials given certain sequences of processing.

While a back wall photovoltaic cell construction on a glass substrate has been described in detail above, it should be understood that the concepts of the present invention are applicable to back wall and front wall cells formed on either a vitreous or opaque substrate. The techniques of the present invention may thus be used to form a cell construction comprising a conductive substrate, a first CdTe layer heat treated in an oxidizing environment to oxidize impurities, and a second CdTe layer which is not heat treated or heat treated to oxidize fewer impurities than in the first CdTe layer. The two CdTe layers at this stage may be recrystallized in an inert environment to substantially increase crystal size and, depending on the manner in which the CdTe layers is applied, this recrystallization step may be preceded by a compression step. Subsequent to recrystallization of the CdTe layers, an n-type material such as CdS may then be deposited on the CdTe layer, and finally a conductive transparent layer applied on the n-type material layer. The concepts of the present may be particularly well suited for forming this type of cell construction on an opaque substrate.

Figure 10:
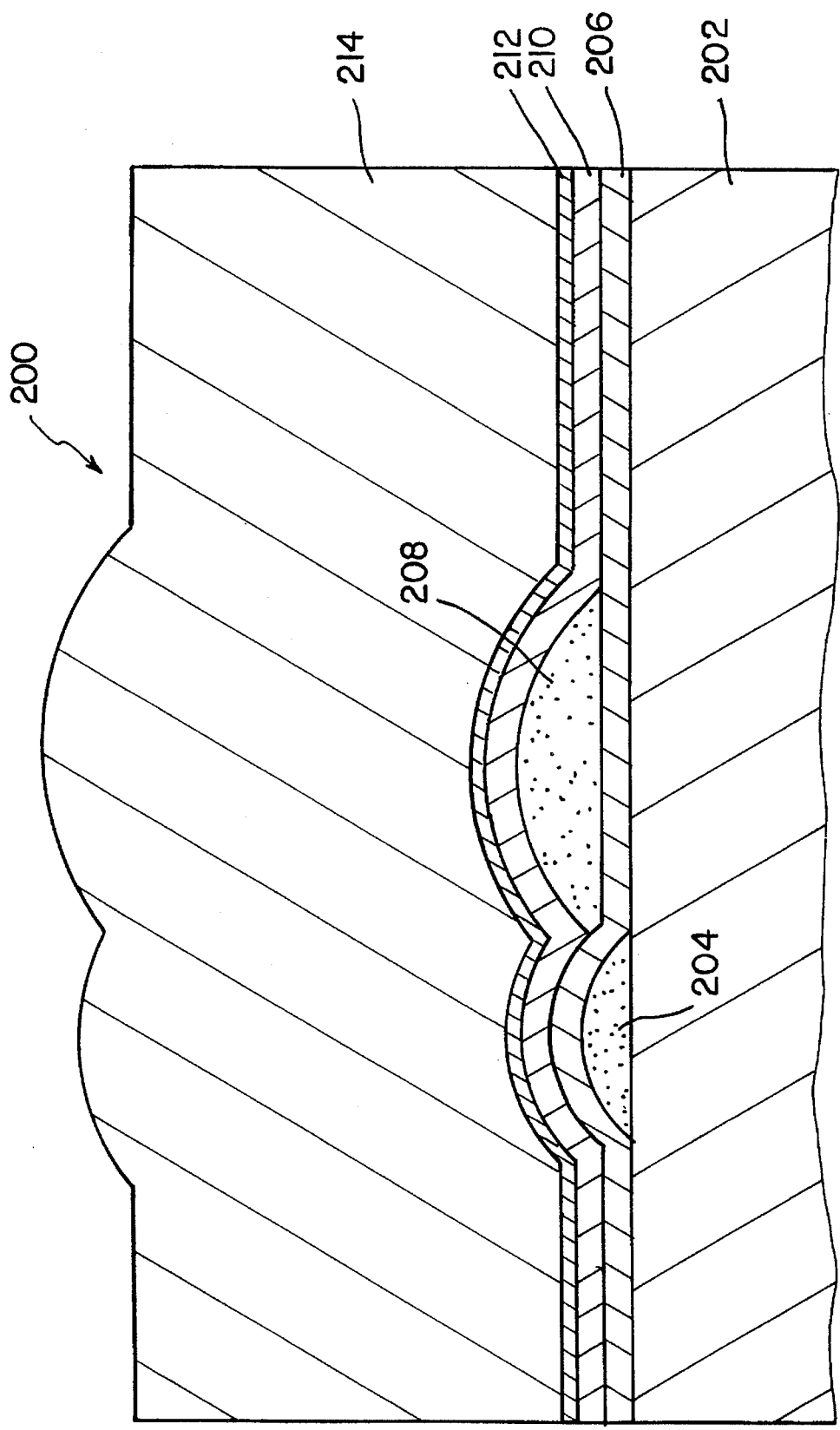
FIGS. 10–17 show partial cross-sections of a substrate during various stages of manufacture of a photovoltaic device.

In one aspect, the process of the present invention provides a process for manufacturing photovoltaic modules, various embodiments of which will now be described. FIGS. 10–17 show partial cross-sections of a photovoltaic substrate 200 under manufacture according to the present invention. Referring to FIG. 10, the process begins with a base substrate 202, which may be a sheet of ordinary float glass, such as a one-eighth inch thick square sheet measuring approximately two feet on each side, 202 on which film layers for an active photovoltaic device are formed.

To prepare a base substrate 202 of glass, the edges are first chamfered, such as with a belt sander or suitable grinder, to remove sharp edges around the base substrate 202 where stress fractures are prone to occur during processing. The base substrate 202 is then washed to prepare the surface for formation of film layers thereon. Surprisingly, it has been found that a mild soap, such an innocuous biodegradable soap, for example, a soap sold under the name "ALCONOX" by Alconox, Inc., can be used to adequately wash a glass surface in preparation for formation of a film layer thereon. It is not necessary to use etching washes, such as using dilute hydrofluoric acid, as has been proposed. Following washing, the base substrate 202 is rinsed using water, which preferably contains less than about 100 ppm dissolved solids, corresponding to a rinse water resistivity of greater than about 6000 ohm-cm. The glass substrate is then dried by any appropriate means, such as by heating the substrate to evaporate residual water or blowing residual water off with clean air.

A barrier layer (not shown) to prevent contaminants, such as sodium and/or calcium, from diffusing out of the glass and into subsequently deposited film layers, is then deposited on the cleaned and dried surface of the base substrate 202, when glass is used. Preferably, the barrier layer is a thin film of silica, which can be applied to the surface of the base substrate 202 by a number of methods applicable to sol-gel technology. One sol-gel that can be used contains organometallic silica compounds and which upon application, drying, and heating becomes a useful barrier to mobile salts. One method for applying a silica-containing sol-gel is to dip the substrate into a bath of the same. Following evaporation of volatile components of the sol-gel, a partially cross-linked silica coating will remain on the glass to provide a start for a proper barrier coating. Heating of the base substrate 202 in subsequent process steps will result in a cross-linking of the silica coating, providing a good barrier layer to diffusion of possible contaminants.

Narrow strips, or lines, of pre-pre-resist material 204 can then be placed at various locations on the substrate in areas that will be used for dividing the panel into a plurality of cells and for interconnecting individual cells in series. The pre-pre-resist lines 204 preferably extend from one edge of the base substrate 202 to the opposite edge of the base substrate 202 and are substantially parallel with the other two edges of the base substrate 202. In one embodiment, the pre-pre-resist lines 204 are approximately 0.012 inches wide. In one embodiment, a total of 59 pre-pre-resist lines 204 are made on the base substrate 202, thereby providing for subsequent division of the panel into 58 individual cells.

Material useful for the pre-pre-resist lines 204 should be inert and non-diffusing and should have low permeability and preferably negligible or no permeability, especially to other materials used later in the process. Pre-pre-resist materials are also preferably, following heating and curing of the same if required, of low density and friable. One material that has been found useful in this application is a mixture of titanium dioxide powder loosely held with a binder. The binder can a be cellulosic binder or another organic or inorganic binder, including a glass frit based binder. One binder that works well is ethyl cellulose. Similar titanium dioxide compositions using similar binders can also be used for pre-resist and pre-pre-resist materials, as discussed below.

The titanium dioxide powder and binder may be mixed with a carrier fluid, such as hexanol, for deposition. The carrier fluid will evaporate leaving the proper pre-pre-resist material The material sets up, or "cures", into a relatively impermeable, low density, friable material upon heating during subsequent processing steps. The pre-pre-resist lines 204 can be deposited onto the substrate using a small diameter tube or needle, such as an intervenous delivery tube or a hypodermic needle, or using other delivery systems that are known for applying resists or resist-like materials.

Following deposition of the pre-pre-resist lines 204, a substantially continuous bottom electrode film layer 206 can be formed on the substrate. This layer is preferably a transparent high conductivity tin oxide layer, as has been previously discussed, and preferably has a thickness of approximately 0.8 microns. The first bottom electrode layer can be deposited by any suitable means, such as by spray pyrolysis of a tin-containing solution, such as a solution of stannous chloride, which can be sprayed in a spray minx with methanol or water. If desired, the high conductivity film layer can be doped, such as using fluorine, as previously discussed, by adding ammonium bifluoride or other fluoride containing salts or materials to the spray mix. A small amount of an acid, such as hydrochloric acid, can also be added to the spray mix to enhance solubility and stability. Spray pyrolysis may be performed at a temperature of approximately 500° C.

Alternatively, it is possible to purchase commercial float glass for base substrate 202, which already has deposited thereon a high conductivity tin oxide layer as the bottom electrode layer 206 useful for the present invention. In such case, pre-pre-resist lines 204 are not used. The absence of such pre-pre-resist lines 204 will affect the procedure for cell division and interconnection, as discussed below.

On top of the bottom electrode layer 206, narrow pre-resist strips, or lines, 208, are formed in a manner similar to pre-pre-resist lines 204. Similar materials can be used as those used for pre-pre-resist lines 204. Preferably, there are approximately 59 pre-resist lines 208 formed on and spaced across the substrate, to allow for division of the panel into 58 individual cells that can be interconnected in series. Preferably, the pre-resist lines 208 are approximately 0.018 inches wide. Pre-resist material, preferably has the characteristics as described previously for pre-pre-resist material. One material that has been used is titanium dioxide powder loosely held with a cellulosic or other binder, as previously discussed.

Next is formed a substantially continuous secondary n-type film layer 210 having a lower conductivity than the bottom electrode film layer 206. Preferably, the secondary n-type film layer is a transparent low conductivity tin oxide, which may or may not be doped, as previously discussed, of a film thickness of about 0.8 microns. A low conductivity tin oxide film layer can be formed by any appropriate means, such as by spray pyrolysis of stannous chloride in an aqueous solution which may also include a dopant and a small amount of acid, such as hydrochloric acid. Spray pyrolysis may be performed at a temperature of about 430° C. The secondary n-type film layer 210 should be an n-type semiconductor material, as has been previously discussed concerning low conductivity tin oxide. Following deposition, the secondary n-type film layer 210 may be washed with appropriate rinse water, as previously described, and dried by any appropriate means.

In one embodiment, anhydrous stannous chloride, which is used to make tin chloride spray mixtures, is handled and qualified to prevent undesirable contaminants in the spray mixture used to make tin oxide layers. If exposed to an oxidizing environment, including prolonged exposure to water, stannous chloride will tend to oxidize to stannic chloride. To prevent that problem, when a container of commercially packaged anhydrous stannous chloride is opened, any unused material is repackaged in tightly sealed smaller containers including a desiccant, to thereby inhibit oxidation to stannic chloride.

In one embodiment, prior to using any batch of anhydrous stannous chloride, a test solution of the material in deionized water is prepared and checked for clarity. A lack of clarity indicates excessive impurities, which may be in the form of stannic chloride or other impurities. Any molarity of solution can be chosen as the standard, so long as all tests are performed on the same standard. Clarity can be checked against a standard stannous chloride solution such as by visual comparison or by spectrographic comparison.

On the back side of a glass base substrate 202 may be placed an identification decal, including a serial number for the device. The decal is preferably permanent, indelible and is preferably attached to the back of the base substrate 202 using a glass frit, which upon heating forms a readable, permanent, indelible marking.

On top of the secondary n-type film layer 210 is formed a substantially continuous primary n-type semiconductor film layer 212, which preferably comprises n-type cadmium sulfide, as previously discussed. Such cadmium sulfide can be deposited, for example, by spray pyrolysis of a cadmium salt, such as cadmium chloride, and a sulfur containing compound, such as thiourea. Spray solutions are typically from about 0.02 molarity cadmium chloride to about 0.05 molarity cadmium chloride.

In one embodiment of the present invention, n-type cadmium sulfide is deposited, such as by spray pyrolysis, in multiple deposition steps, with each deposition step being at a deposition temperature followed in sequence by an anneal step at an anneal temperature that is higher than the deposition temperature of the immediately preceding deposition step. For example, a mixture of cadmium chloride and thiourea are deposited in a first spray application at a first deposition temperature. The spray mixture may also contain a dopant for the cadmium sulfide layer, such as excess cadmium chloride to result in cadmium dopant in the layer. Following the first deposition step, the deposited cadmium sulfide is subjected to a first anneal step at a first anneal temperature that is higher temperature than the first deposition temperature. One or more additional deposition steps can follow the first anneal step, with an additional anneal step following in sequence after each additional deposition step. Each deposition step can comprise one or more actual depositions, such as by the use of multiple spray booths in a single deposition step. Each deposition step should preferably deposit no more than from about 0.05 microns to about 0.15 microns of cadmium sulfide film and each anneal step should last at least from about two minutes to about five minutes to ensure that reaction is complete for the previously deposited cadmium sulfide and also to ensure proper annealing for proper morphology attainment.

In one embodiment, an anneal temperature is at a temperature that is at least about 10° C. higher than the deposition temperature of the immediately preceding deposition step, preferably at least about 20° C. higher and more preferably at least about 30° C. higher. In one embodiment, deposition is at a temperature of less than about 265° C. and preferably of less than about 255° C. In one embodiment, deposition is at a temperature from about 100° C. to about 255° C., and more preferably from about 150° C. to about 250° C. In one embodiment, anneal steps are at a temperature of greater than about 265° C., preferably from about 265° C. to about 500° C., more preferably from about 265° C. to about 300° C., and most preferably from about 275° C. to about 300° C.

As used herein, the temperature of deposition refers to the temperature, or range of temperatures, at which cadmium sulfide is forming on a substrate during the dynamics of deposition. The precise temperature of deposition is difficult to measure and other temperatures for any given process, such as the surface temperature of the substrate prior to and/or during deposition, are often used to perform actual control of the deposition process. In one embodiment, deposition temperatures and anneal temperatures are measured using a thermocouple attached with a small amount of ceramic paste to the upper surface (surface of deposition or anneal) of a glass substrate. No. 24 gauge thermocouple wire attached to the upper surface of a glass substrate using Sauereisen No. 29 low contact cement, by Sauereisen Cement of Pittsburgh, Pa., or an equivalent ceramic paste, is preferred for measuring temperatures to be sure that measured temperatures are within the desired ranges for deposition and anneal, as discussed.

In one particularly preferred embodiment, a final anneal step follows the final deposition step and the anneal temperature in the final anneal step is higher than the anneal temperature during any previous anneal step. Preferably, the final anneal step is at a temperature of greater than about 400° C. and more preferably at a temperature of from about 400° C. to about 500° C. Anneal steps other than the final anneal step are preferably at a temperature of from about 265° C. to about 400° C., more preferably from about 265° C. to about 300° C. and most preferably from about 275° C. to about 300° C. Preferably, a final anneal step lasts for longer than from about two minutes to about ten minutes. The final anneal is preferably at a higher temperature than each of the interim anneals and is designed to ensure completion of the reaction, to improve morphology, and to reduce and level the concentration of residual chloride impurities areally in the cadmium sulfide film layer and to provide for consistency of processing for all substrates. Such leveling of residual chlorides is particularly beneficial to promote proper cadmium sulfide and cadmium telluride morphologies attainable during subsequent recrystallization, as has been previously discussed. Such leveling could be performed by any technique to provide the advantage of the present invention.

In one embodiment, a cadmium sulfide film layer approximately 0.6 microns thick is deposited in six deposition steps, having five interim anneal steps and one final anneal step. Each deposition step could, however, involve multiple actual depositions to ensure uniform film thickness.

The deposition/anneal/deposition/anneal sequence of processing has been found to be particularly advantageous for improving performance of cadmium sulfide/cadmium telluride photovoltaic cells. It has been unexpectedly found that using a lower temperature for deposition and a higher temperature for annealing results in improved morphology of a cadmium sulfide layer. No single processing temperature has been found that results in as good morphology. By using the sequenced deposition and anneal procedure, each sublayer of cadmium sulfide deposited obtains the benefits of more optional heating during both deposition and annealing steps, and each deposited sublayer is ensured of completion of reaction.

Preferably, following deposition and annealing, the cadmium sulfide layer is rinsed with water having less than about one ppm dissolved solids and is dried, such as by thermal drying.

In one embodiment, cadmium in soluble cadmium salts in the rinse water can be recovered by the use of commercially available ion exchange resins, such as an ion exchange resin sold under the name Virgin 7101 by Dayton Water Systems. A non-selective resin can be utilized if the cadmium salts are substantially the only dissolved material in the rinse. A selective resin for divalent ions, or selective for cadmium only, may also be used. Use of ion exchange resins is particularly advantageous because they are efficient at removing dissolved cadmium ions from the rinse water and bonding the cadmium sufficiently tightly within the ion exchange resin that they are typically safe for landfill disposal, thereby avoiding the complications and expense of landfill disposal.

On top of the primary n-type semiconductor film layer is formed a substantially continuous p-type semiconductor film layer 214, preferably a p-type cadmium telluride layer, which may be doped with any suitable dopant. Cadmium telluride can be formed by any suitable means, including spray deposition of cadmium telluride at ambient temperature, as previously discussed, followed by heating to about 200° C. to vaporize the carrier liquid. Preferably, cadmium telluride is spray deposited using a spray mixture containing cadmium telluride particles smaller than about 0.3 microns mixed in propylene glycol, or another suitable carrier fluid. Preferably, the cadmium telluride contains little or no oxygen, such as in the form of oxides adhering to grain surfaces. The cadmium telluride as deposited is preferably about 19 microns thick and preferably has a bulk density of about 33% of theoretical for cadmium telluride. When cadmium telluride is sprayed to form the p-type semiconductor film layer, cadmium chloride may be mixed into the spray mixture and is also useful for temporarily binding the cadmium telluride film following deposition, and especially during subsequent processing prior to recrystallization of the cadmium telluride.

In one embodiment, oxides in cadmium telluride used in manufacturing the spray mixture are reduced to a low level, preferably below about 0.5 weight percent, more preferably below about 0.15 weight percent and most preferably below about 0.1 weight percent of total oxygen relative to total cadmium telluride. One particularly effective way to prepare raw feed material comprising cadmium and telluride and having some oxygen, such as commercially available cadmium telluride particles, is to subject particles in cadmium telluride raw feed material to a chemically reducing atmosphere, such as using hydrogen gas or another reducing gas, to produce a refined feed material that may be used to form a cadmium telluride film layer. Preferably, cadmium telluride particles are reduced in size, such as by grinding, to a size at least as small as and preferably smaller than the original grain size of cadmium-containing and tellurium-containing grains from which the cadmium telluride was originally manufactured. Such grain size reduction ensures that essentially all oxidized grain boundaries of the cadmium telluride particles will be subjected to the reducing gas, and thereby ensuring effective reduction of oxides concentration. In one preferred embodiment, the particles are treated with a reducing gas, preferably hydrogen gas, at a temperature of greater than about 500° C., more preferably from about 500° C. to about 700° C. and most preferably from about 575° C. to about 625° C. In one particularly preferred embodiment, treatment is with hydrogen gas at a temperature of approximately 600° C. for a sufficient time to achieve the desired oxides concentration. Oxides reduction can be carried out in any suitable apparatus, including a fluidized bed reactor.

In one embodiment, commercially available cadmium telluride particles are reduced in size to smaller than about 2 mils. For example, the particles could be ground in a ball mill without any added grinding balls so as to avoid contamination of the cadmium telluride pellets to a size smaller than about 1/8 inch, followed by crushing as with a roller crusher to a size smaller than about 2 mils. The oxide concentration of the cadmium telluride particles may then be reduced to less than about 0.1 weight percent oxides by treating the particles of cadmium telluride with hydrogen gas at approximately 600° C. for approximately 180 minutes. It has been surprisingly found that such reduction of an oxide concentration prior to spray deposition of cadmium telluride significantly improves cell efficiency, although the precise reason for such improvement is not known.

Following oxide reduction, the size of the particles is preferably reduced to an average size smaller than from about 0.2 microns to about 0.3 microns. For example, the particles could be ground using a wet ball mill in a mixture with an appropriate fluid, such as propylene glycol, and preferably in the presence of alumina cylinders. Preferably, no particles are larger than about 7.5 microns. These particles can then be used in a spray mixture for spray deposition of cadmium telluride.

In one embodiment, cadmium telluride feed material, which may contain non-stoichiometric cadmium and/or tellurium is heated, preferably to a temperature of from about 550° C. to about 650° C., and more preferably about 600° C., in an inert or reducing environment to volatilize and drive off excess tellurium or cadmium, thereby allowing for preparation of a suitable cadmium telluride feed material starting with commercial grade cadmium telluride. Such a process is particularly useful for leveling the concentration of oxides and/or cadmium and tellurium within a batch of feed material and for providing consistency and leveling between batches. In one embodiment, cadmium telluride in feed material, which may be deposited to form a cadmium telluride film layer, contains cadmium and tellurium as cadmium telluride within approximately 0.01 atomic percentage of each other.

Glycols, and particularly propylene glycol, are preferred carrier fluids. Preferably, the carrier fluid has a high viscosity to provide good carrying capability. Propylene glycol has sufficient viscosity and also provides the advantage of dissolving cadmium chloride that may be used in the spray.

Following such wet ball milling, the mixture can be strained to remove any alumina cylinders. At that time, the carrier fluid, such as propylene glycol, is added and a preformed solution having dissolved cadmium chloride and propylene glycol is added for inclusion of cadmium chloride in the spray mixture, if desired.

In one embodiment, materials from which a cadmium telluride film layer is formed should be such that there is no more than about 0.01 atomic percentage of either telluride or cadmium metal in excess of that existing as cadmium telluride. In one embodiment, excess cadmium or tellurium metals in cadmium telluride to be used for deposition to form a cadmium telluride film layer can be reduced to an acceptable level by heat treatment to a temperature of from about 500° C. to about 700° C. to volatilize cadmium and tellurium metals. Such volatilization can be in a combined heating in a chemically reducing atmosphere to also simultaneously effect oxide reduction, discussed previously.

Although a p-type semiconductor film layer, and particularly a p-type cadmium telluride layer is often applied by spray deposition of cadmium telluride particles, preferably after oxide reduction and preferably after leveling of non-stoichiometric cadmium or tellurium concentrations, it has been found that such a p-type film layer and particularly a p-type cadmium telluride layer may be deposited using less solvent intensive methods than spray deposition. In one embodiment such a p-type film layer may be deposited using commercially available roller coating equipment. Other less solvent intensive methods that may be used include screen printing, offset printing or a doctor blading method, all of which may be accomplished with commercially available equipment. Roller coating, for example, could be performed using commercially available equipment typically used for applying paint-like coatings. The use of such low solvent methods are particularly surprising due to the requirement that such p-type film layers be substantially uniform in thickness and have relatively few defects. Such low solvent methods, and particularly roller coating, may also be advantageously used for graphite deposition to form an ohmic contact film layer, as discussed below. Roller coating, however, is particularly advantageous for applying either cadmium telluride or graphite film layers. For both cadmium telluride and graphite depositions, such roller coating allows using less solvent and also the advantage of not wasting valuable materials to overspray, relative to spray deposition processes. Use of less solvent has the advantage of lower materials cost and also fewer problems associated with volatile organic components that must be handled properly and economically.

Any suitable material may be used for the p-type film layer including Groups II-VI compounds other than cadmium telluride, Groups I-III-VI compounds such as copper indium diselenide, or Groups III-V compounds such as gallium arsenide.

After deposition, the p-type semiconductor film layer, which is preferably a cadmium telluride layer as discussed previously, is subjected to an oxidizing environment at an elevated temperature to getter impurities and to establish an oxidized gradient from the top to the bottom of the CdTe layer and to improve cohesion of the cadmium telluride film and to reduce adhesion to other materials of the film. As used herein, gettering impurities refers to tying-up, or deactivating, donor impurities in the cadmium telluride film layer by converting donor impurities to oxides. The unique combination of first reducing oxides concentration in cadmium telluride prior to deposition, as discussed previously, followed by oxidizing the deposited layer has been unexpectedly found to be particularly beneficial. As used herein, oxidizing refers to increasing the amount of oxygen contained in a film layer, particularly in a cadmium telluride layer. Such oxidizing may also to be referred to as oxidating.

In one embodiment, the p-type layer 214, preferably cadmium telluride, is first subjected to an oxidizing atmosphere, such as oxygen gas, at a first temperature for efficient gettering and is then subjected to an oxidizing atmosphere at a second, higher temperature, for efficient development of a suitable oxidation gradient through the cadmium telluride layer. Preferably, the p-type layer 214 is subjected to an oxidizing atmosphere at the desired temperatures for from about four minutes to about six minutes, and more preferably for approximately five minutes total time.

In one preferred embodiment, a cadmium telluride layer is exposed to an oxidizing atmosphere, such as an atmosphere comprising oxygen gas, at a temperature of from about 300° C. to about 425° C. for from about 10 minutes to about 60 minutes. The cadmium telluride layer is then subjected to an oxidizing atmosphere, such as an atmosphere comprising oxygen gas, at a temperature of from about 450° C. to about 550° C. for from about 1 minute to about 10 minutes, and preferably for about 5 minutes. This procedure is particularly effective in fixing impurities as oxides in the gettering step at the lower temperature, and at providing a good oxygen gradient through the cadmium telluride layer caused by the higher temperature treatment.

It has been found that a single treatment at one temperature either does not getter impurities as well or does not provide as beneficial an oxygen gradient as the two temperature process just described. In addition to providing the desired oxygen gradient and impurity gettering, the two temperature process just described also results in beneficial cohesive properties within the cadmium telluride film due to sintering during the higher temperature treatment, which sintering is particularly conducive to subsequent compression of the cadmium telluride film layer, and especially if such compression is by roller compression.

Figure 11:
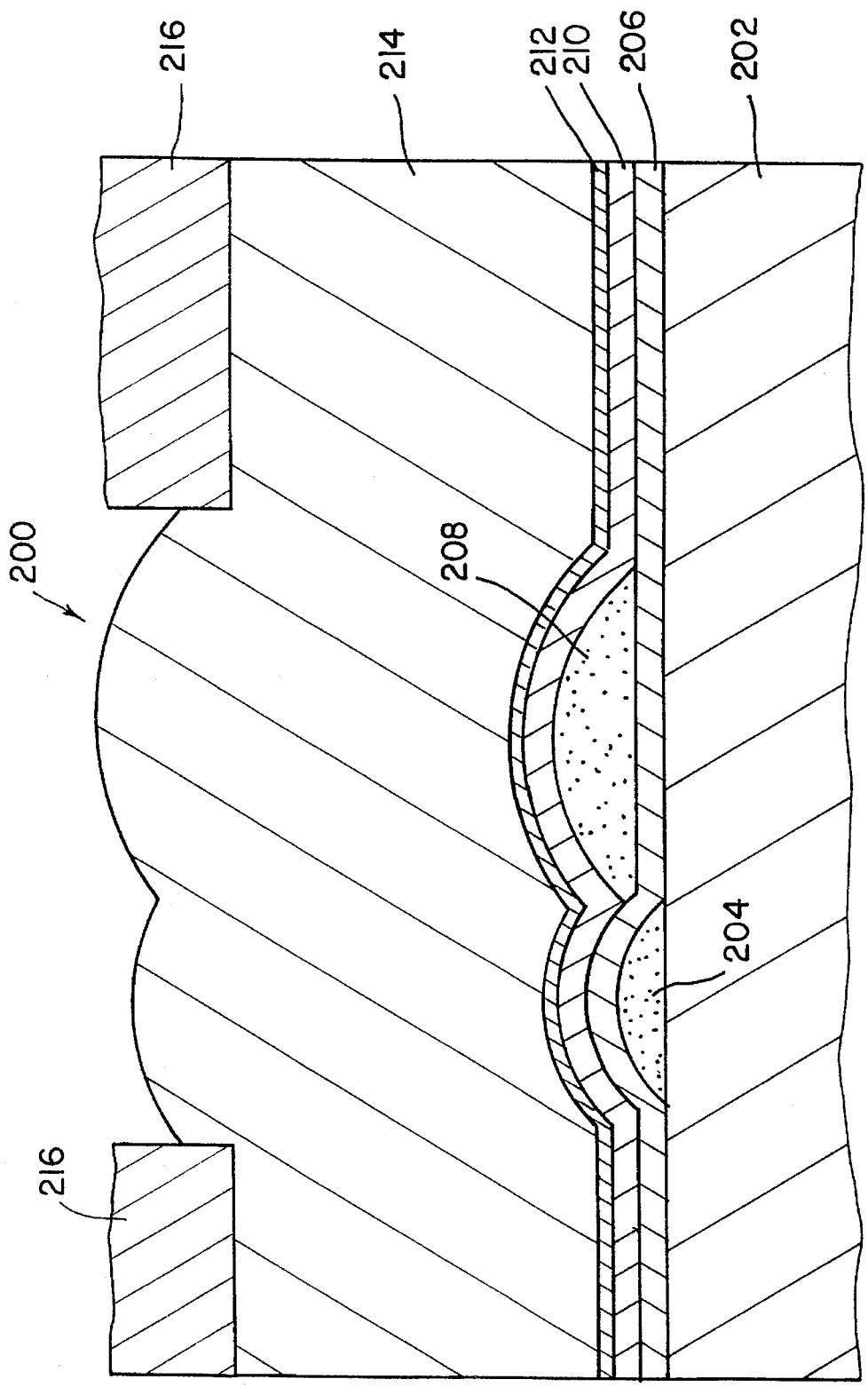

Referring now to FIG. 11, the p-type semiconductor film layer 214 is compressed, such as by the use of compression rollers 216, which have been found to be particularly useful for compressing a cadmium telluride film layer. The interconnection region comprising the area including the pre-resist and pre-pre-resist lines is preferably not compressed. For cadmium telluride, an original film thickness of 19 microns might be reduced during compression to approximately 12 microns. Preferably, compression rolling is performed by exerting a pressure of from about 5,000 psi to about 15,000 psi on the cadmium telluride layer surface.

Following compression of the p-type semiconductor film layer 214, the p-type semiconductor film layer, and particularly when cadmium telluride is used, may be subjected to a recrystallization, or regrowth, step at an elevated temperature in a substantially inert environment, as previously discussed. Preferably, multiple substrates are subjected to the recrystallization step together. Substrates are paired and positioned so that exposed cadmium telluride layers of the paired substrates are face to face, as previously discussed.

In one embodiment, substrates are positioned vertically on end in a regrowth oven. Surprisingly, it has been found that there are particular advantages to placing the substrates into the regrowth oven so that the panels are vertically positioned on end. This vertical positioning has the advantage of reducing the tendency of a glass base substrates 202 to sag or otherwise deform during the regrowth process.

Figure 18:
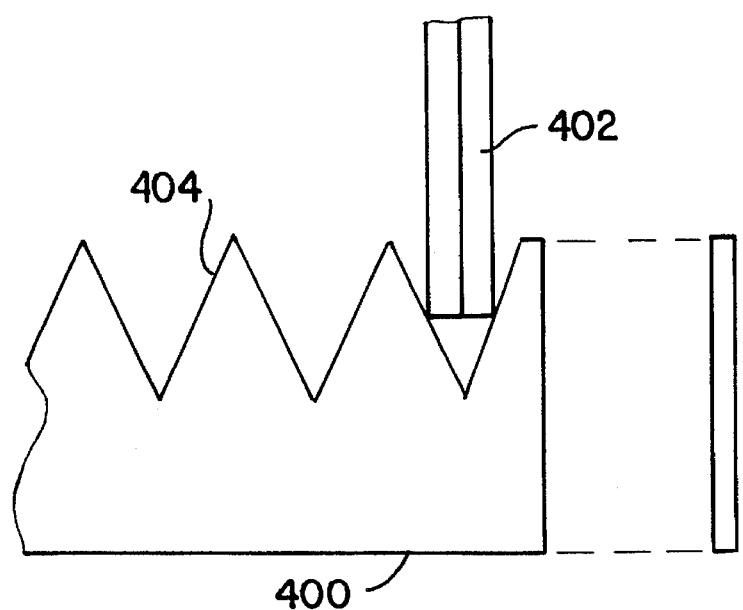
FIG. 18 is a partial cross-section and end view of a bracket that may be used for holding substrates, especially during a recrystallization procedure.

In one embodiment, saw-tooth, or serrated, shaped brackets are used to hold substrates in position during crystal regrowth. FIG. 18 shows a partial side view and an end view of such a bracket 400 for holding substrates 402 in position in a groove of bracket 400 during regrowth operations. The bracket 400 is preferably a strip of metal, more preferably a high-temperature, corrosion-resistant steel. Preferably, bracket 400 is made of a 300 series stainless steel, more preferably a 304 stainless steel and most preferably a 316 stainless steel. Bracket 400 has a serrated, or saw-tooth, pattern 404 on one side in which pairs of face-to-face substrates 402 are held during regrowth. Preferably, at least one of these brackets 400 is positioned underneath the vertically positioned face-to-face substrates in the oven to hold the panels in place. Also, preferably, at least one, and more preferably at least two, of these brackets are positioned on each of the two sides of the vertically extending substrates during regrowth to hold substrates in place from the sides. If desired, one or more brackets may also be placed on top of the substrates for additional security.

Figure 19:
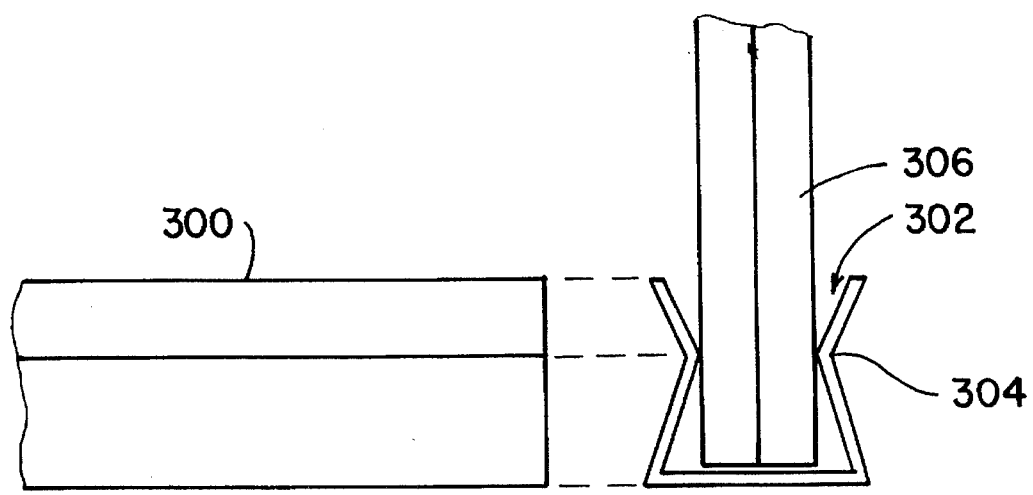
FIG. 19 is a partial cross-section and end view of a clip used for holding substrates, especially during a recrystallization procedure.

In one embodiment, a pair of substrates positioned face-to-face with substantially coextensive peripheral edges may be advantageously held together by a clip, which preferably extends over the entire vertical length of the two vertical extending edges of the paired substrates during crystal regrowth. Preferably, such clips extend over substantially the entire length of all four paired edges of face-to-face paired substrates during crystal regrowth. FIG. 19 shows a partial side view and an end view of such a clip 300, with the end view showing two substrates 306 held in the clip. The clip preferably extends over the entire length of the edges of the paired substrates 306 over which the clip 300 is placed. Such clips 300 preferably have a wide, open portion 302 through which substrates 306 can be inserted into the clip 300, and a narrower portion 304 for securely holding the substrates 306 together during regrowth and for providing substantial lateral support to reduce the tendency of panels to sag or otherwise deform during the regrowth operation. Such a full length clip is particularly advantageous for holding two substrates on their paired edges that may face a flow of heating fluid, such as a hot gas. The clip tends to deflect the heating fluid while protecting the clipped edges from deformation due to excessive heating that could otherwise occur. Such full length clips also help prevent such an impinging heating fluid from flowing between the paired substrates, thereby promoting even heating through the non-paired faces of the substrates. The clips 300 are preferably very rigid and made for a close tolerance fit to paired substrates 306. The clips are preferably made of a high strength steel alloy, such as a Hastalloy-C series steel. In one embodiment, paired substrates may be clipped around their peripheral edges, as described, and held in a saw-tooth shaped bracket, as described, with the clip on a side or on the bottom of the paired panels being inserted into a groove of the bracket.

Following regrowth, the p-type semiconductor film layer surface is washed with partially deionized water, preferably having less than about 1 ppm dissolved solids, and is then dried. Pinholes extending through the p-type semiconductor film layer can then be filled, such as by placing an insulating material into the pinholes using a small diameter needle, such as a hypodermic needle. In one embodiment, pinholes are plugged using an insulating polymer, such as a polystyrene. The polymer can be placed into the pinhole by dissolving the polymer in a suitable solvent, such as toluene, which upon vaporization leaves residual polymer in the pinhole. Preferably, the insulating material placed into pinholes is capable of surviving a one hour heat treatment of approximately 230° C. without significant structurally degrading and without becoming conductive. Preferably, pinholes larger than about 0.5 millimeter in diameter are filled with the insulating material.

Following pinhole plugging, the p-type semiconductor film layer is again rinsed with an appropriate rinse water and dried.

The p-type semiconductor film layer, and particularly when cadmium telluride is used, may then be subjected to a surface treatment to remove oxides, in the form of adsorbed oxygen or oxides (e.g., of cadmium, tellurium, or some impurity) that may exist on the surfaces of cadmium telluride grains.

In one embodiment, the surface of the p-type semiconductor film layer is treated with a fluid that removes the oxides without significantly removing any of the p-type film material from the layer, especially when cadmium telluride is used. The treatment of the present invention is substantially different from etch procedures which have been proposed by others that use strong acidic etchants or oxidizers followed by rinsing with strong basic solutions to create a tellurium rich surface for improving conductivity near the surface of the cadmium telluride layer for improved ohmic contact with a subsequent electrode layer. In a manufacturing environment, however, it is difficult to obtain repeatable quality etches using that process and it is, therefore, to be avoided. Rather, it has been unexpectedly found that good ohmic contact can be made to cadmium telluride, as discussed herein, without etching the cadmium telluride layer to produce a tellurium rich surface region.

Preferably, the fluid used to treat a cadmium telluride surface according to the present invention provides for a relatively non-intrusive, planar treatment of the surface of the cadmium telluride film layer to remove oxides adhering to the contacted surface of the cadmium telluride grains in the film layer. Oxides are removed from the near-surface region of the film layer without removing substantial amounts of oxides from the interior of the film layer. Typical native oxides formed in cadmium telluride surface may be as much as 10 to 30 angstroms thick, or about 10 molecules deep, and sitting on top of a reasonably virgin cadmium telluride layer. Mild solutions of sodium sulfite, potassium cyanide, and ammonium bifluoride in water, alcohols, and glycols are suitable for use as treating fluids. Many reducing agents, fluorides, and cyanides could be used. Preferred treating fluids, however, should have a high viscosity and perform the desired treatment in a relatively short time, thereby avoiding penetration significantly below the surface of the cadmium telluride layer. Higher viscosity alcohols, such as isobutyl alcohol, glycols, and glycerin are therefore preferred. One fluid that has been found to be particularly useful is propylene glycol.

Preferably, the treating fluid is a liquid, such as propylene glycol, which, as preferred, is more viscous than water, thereby providing the planar treatment as desired. Such high viscosity liquids tend not to travel down the grain boundaries in the cadmium telluride layer during treatment. It has been found that it is advantageous to leave some oxides coating the cadmium telluride grain boundaries below the treated surface region for passivation, and to remove only those oxides in the vicinity of the film surface to facilitate a good ohmic contact to an overlying electrode layer. Preferably, the treating liquid has a viscosity greater than about 30 millipoise, more preferably from about 30 millipoise to about 50,000 millipoise, still more preferably from about 100 millipoise to about 10,000 millipoise, and most preferably from about 200 millipoise to about 1,000 millipoise.

In one embodiment, following the surface treatment, the cadmium telluride, or other p-type material when cadmium telluride is not used, is rinsed with water, preferably deionized water, and is dried, preferably by blowing water off of the cadmium telluride surface using a compressed gas, such as compressed air exiting an air knife. In one embodiment, residual water remaining adhered to the cadmium telluride surface, such as by capillary forces, or simply adsorbed onto the surface, is removed by treating the surface with a water-displacing fluid, such as isobutyl alcohol or another substance capable of forming an azeotrope with water. The isobutyl alcohol can then be blown off using compressed gas as before, such as by the use of an air knife. Preferably, the initial fluid treatment, such as with propylene glycol, is for at least about 90 seconds to effect the proper oxide reduction without allowing substantial penetration below the surface of the cadmium telluride film layer.

Figure 12:
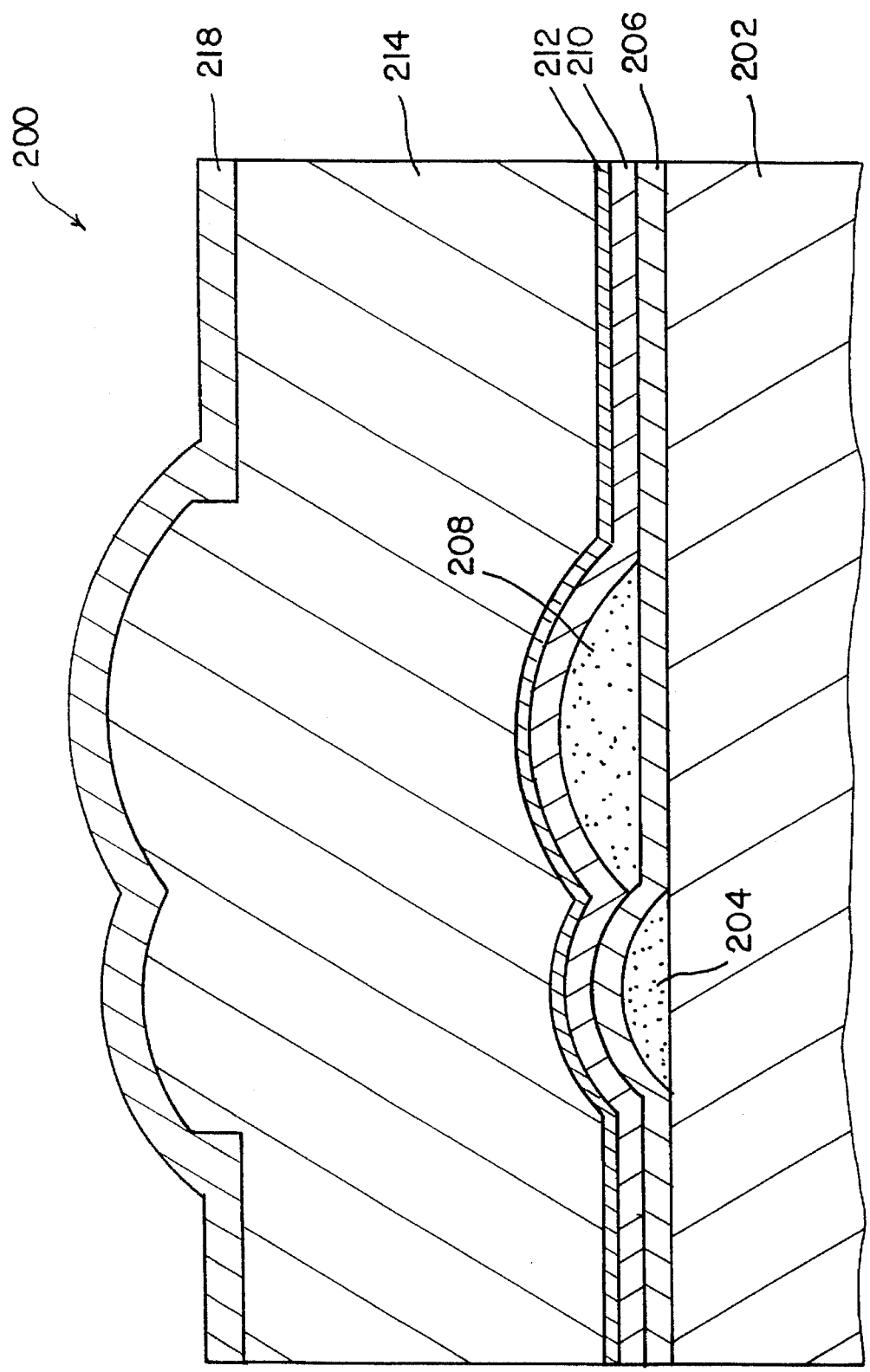

Referring now to FIG. 12, following the surface treatment of the p-type film layer 214, an ohmic contact film layer 218 of an electrode material may be formed on top of the p-type semiconductor film layer 214 to provide for electrical contact to that layer.

In one embodiment, graphite is used as the material for the ohmic contact film layer 218, which is formed on top of a p-type film layer 214, which preferably comprises p-type cadmium telluride as discussed previously. In one embodiment, the graphite layer is approximately 10 microns thick, and overlies a cadmium telluride layer that is approximately six microns thick following regrowth. Such a graphite layer can be formed, for example, by spray deposition by mixing a graphite paste in a carrier liquid such as isobutyl alcohol. Multiple spray depositions may be used to effect uniform coverage. Thickness of the deposition may also be varied between sprays. Preferably, however, the graphite is deposited in a viscous suspension having at least about 20 percent solids, more preferably greater than about 30 percent solids, and most preferably greater than about 40 percent solids. Preferably, such dense graphite suspensions are applied by roller coating, which has been found to be particularly desirable in that such deposited graphite coatings have a tendency to not penetrate into even some of the larger pinholes that may still exist in the underlying p-type film layer, and thereby tend to bridge over such pinholes so as not to contact an underlying film layer and to form a barrier to shorts and shunts through such pinholes. The bridgability of the graphite on any given film may be affected by the method of application, temperature of application, viscosity which is a function of percent solids, type of solvent or carrier liquid, the size distribution of solids and the surface area of solids. This bridging method for reducing detrimental effects of pinholes is particularly useful for pinholes smaller in diameter than about two times the thickness of the final graphite layer. The electronic characteristics of a graphite film, though affected by several things, are generally monitorable by specific resistivity of the deposited graphite film layer. Graphite material having specific resistivities preferably of from about 0.001 ohm-cm to about 1000 ohm-cm, more preferably from about 0.01 ohm-cm to about 100 ohm-cm, still more preferably from about 0.01 ohm-cm to about 10 ohm-cm, and most preferably from about 0.1 ohm-cm to about 1 ohm-cm, are used for improved formation of Schottky barriers with the underlying n-type film layers.

In one embodiment, however, electrode material of the ohmic contact film layer, and particularly deposited graphite, contains particles small enough to enter into pinholes in defect regions, and particularly into those pinholes smaller than about 0.5 millimeters in diameter, to preferably contact an underlying n-type layer, such as an underlying n-type cadmium sulfide layer or an n-type low conductivity tin oxide layer, as previously discussed. For example, a two micron diameter pinhole could be filled with graphite particles having an appropriate resistivity, as previously discussed, and being of a small size, such as of about 0.1 to about 0.2 microns. The junction formed between properly selected graphite particles and such n-type layers has been found to be particularly advantageous in treating pinholes because a Schottky-type barrier is formed at the junction, thereby reducing or preventing undesirable shunts and shorts. Graphite resistivities for forming Schottky barriers are preferably from about 0.001 ohm-cm to about 1000 ohm-cm, more preferably from about 0.01 ohm-cm to about 100 ohm-cm, and most preferably from about 0.1 ohm-cm to about 1 ohm-cm.

In one embodiment, an additional benefit of selecting the resistivity of the graphite as described is that it provides electrical isolation of shunts through pinholes even in the absence of forming a Schottky barrier. This is especially useful when a bottom electrode film layer, such as a high conductivity tin oxide layer, is exposed through a pinhole. This isolation effect is a geometrical effect that minimizes lateral current flow when both resistivity and thickness of the graphite layer relative to all underlying layer thicknesses is properly selected, as previously discussed.

In one embodiment, the ohmic contact layer comprises an electrode material, preferably graphite, intercalated within one or more intercalated molecules. At least one atom of the intercalated molecule can be subsequently diffused out of the graphite and into the underlying p-type film layer, such as a cadmium telluride layer, by heat treatment to a temperature sufficient to impart the thermal activation energy required to activate the diffusion of intercalated molecules and thereby allow their migration out of the graphite crystalline structure. Preferably, at least one atom of an intercalated species diffuses and chemically reacts with the p-type film layer. Preferably, the intercalated molecule is a copper-containing compound, and more preferably is a copper salt, such as copper chloride. Other intercalated molecules that could be used include, for example, antimony chloride, and bismuth chloride or other Group V-containing materials.

During later heat treatment of the panel, preferably to a temperature of from about 200° C. to about 300° C., the diffusion and reaction of a small amount of an intercalated molecule, copper chloride for example, appears to form a thin, controllable layer of conductive material on the surface of cadmium telluride grains. In the case of copper chloride, a layer of conductive $Cu_xTe$ appears to be formed. This increased conductivity on the grain surfaces apparently helps to improve ohmicity of the contact, particularly between cadmium telluride and graphite layers. Also, the controlled placement of $Cu_xTe$ at discrete points markedly reduces further diffusion down the grain boundaries and therefore enhances stability. Also, the existence of a significant energy of activation required to release additional copper remaining intercalated in the graphite precludes inadvertent supply of new copper from a graphite ohmic contact layer during subsequent processing or during normal operation of a completed module. Such remaining intercalated atoms remain stable and substantially non-diffusible during subsequent normal operation of a completed photovoltaic module.

The described use of an intercalated graphite followed by diffusion of a doping material into a cadmium telluride layer is particularly useful in combination with the non-penetrating surface treatment as previously described. It appears that since conductivity increase of the cadmium telluride is accomplished via diffusion from the intercalated graphite, the fluid treatment need not etch the surface to create a tellurium rich surface, but need only remove surface oxides.

One particular advantage of using intercalated graphite is that diffusion of the dopant, such as copper, into the cadmium telluride layer can be carefully controlled and self limiting due to the high activation energy for releasing intercalated molecules from the graphite crystalline framework. During operation of the cell, any undiffused intercalated molecules remain tightly bound within the graphite crystalline framework, thereby avoiding detrimental diffusion of these molecules during cell operation.

Preferably, the proper choice for the intercalated molecule in the graphite meets four requirements: 1) the additive must effectively make the semiconductor material more conductive (more p-type in the case of p-type cadmium telluride);

2) the additive must have a low propensity towards diffusion into the cadmium telluride and/or down the cadmium telluride grain boundaries, 3) the additive must disperse well throughout the graphite paste, and 4) the "binding energy" to the graphite (the tendency for it to remain in the graphite) should be high in order to reduce long-term diffusion problems.

In one embodiment, 100 parts by weight of a graphite paste having, for example, 20 percent by weight solids can be mixed with one part by weight of intercalated graphite powder having perhaps 10 percent by weight of an intercalated species such as copper chloride. Prior to diffusion, the graphite ohmic contact layer would therefore have approximately 0.5 weight percent of the intercalated species.

In one embodiment, ohmic contact to the p-type film layer, and particularly to cadmium telluride, may be improved by use of an intercalated graphite even without diffusion and reacting to form a more conductive region of the cadmium telluride layer as described. The change of the Fermi level of the graphite itself by properly choosing an intercalated species may provide for improved ohmic contact to a p-type film layer.

In one embodiment, graphite used to form the ohmic contact film layer is applied using heterogeneously sized graphite particles. Preferably, graphite particles containing intercalated molecules, such as copper chloride, are of a size generally larger than graphite particles having no intercalated molecules. The smaller graphite particles, which tend to fill defects such as pinholes in the underlying p-type semiconductor film layer, such as cadmium telluride, are preferred for forming Schottky-type barriers with exposed underlying n-type layers, as previously discussed, if their specific resistivity is properly chosen.

If the size of graphite particles are selected properly for resistance, a partial barrier results that is significantly greater in resistance across the graphite layer in the vicinity of filled pinholes due to the increased thickness of the graphite layer through thepinhole area due to filling of the pinholes with graphite. Graphite resistance and thickness should be selected to provide for limited flow of electrical current in a lateral direction along the graphite film and to provide no significant additional series resistance in the cell to current flow across the thickness of the film.

Figure 13:
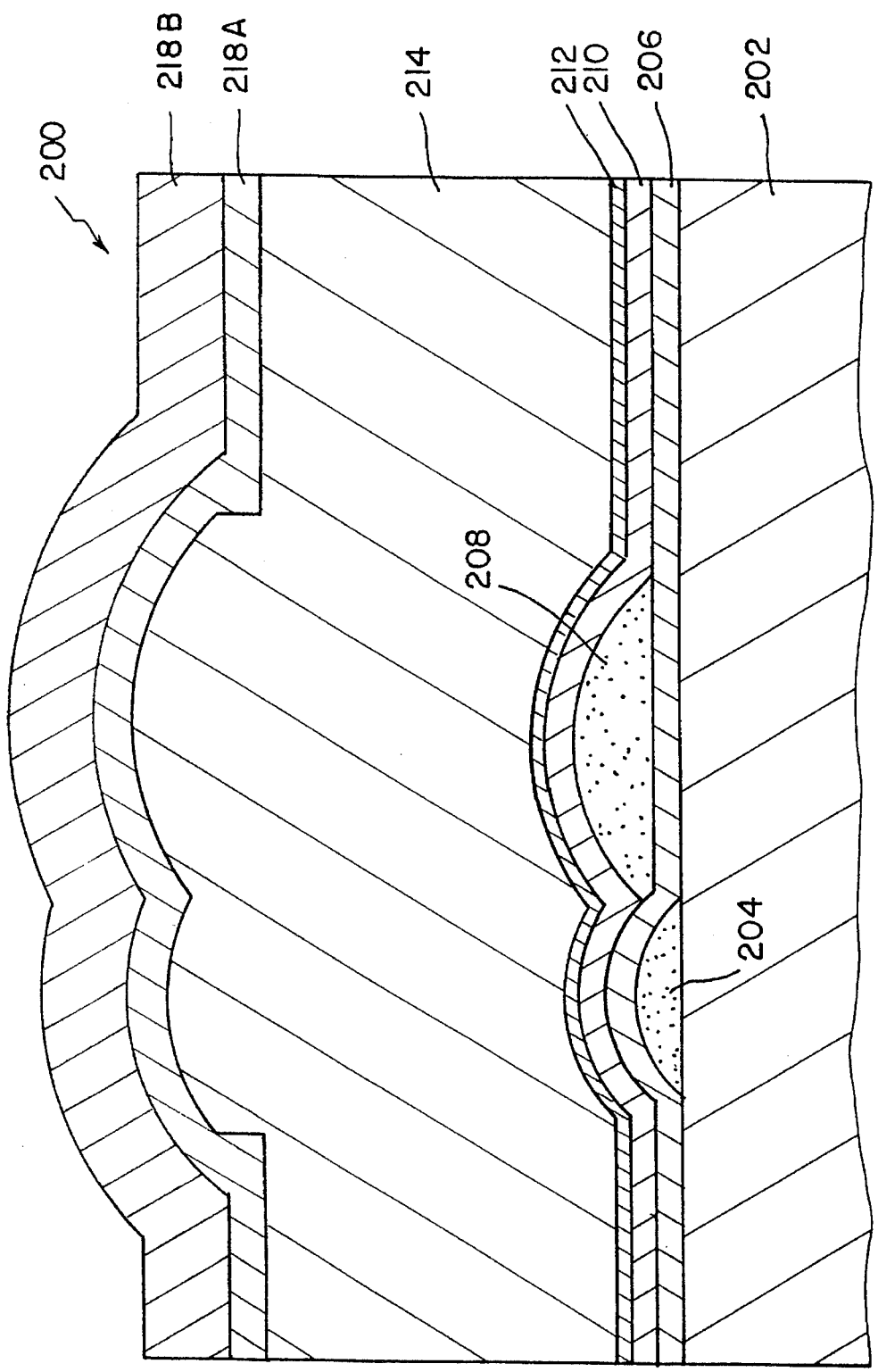

Referring now to FIG. 13, in one embodiment, the ohmic contact film layer, which is preferably graphite as described, may be deposited as two layers, referenced as 218A and 218B, to ensure substantially continuous coverage. These two layers 218A and 218B are preferably of the same material, and preferably both comprise graphite. Such a graphite ohmic contact film layer would typically be about 10 microns thick or less.

Figure 14:
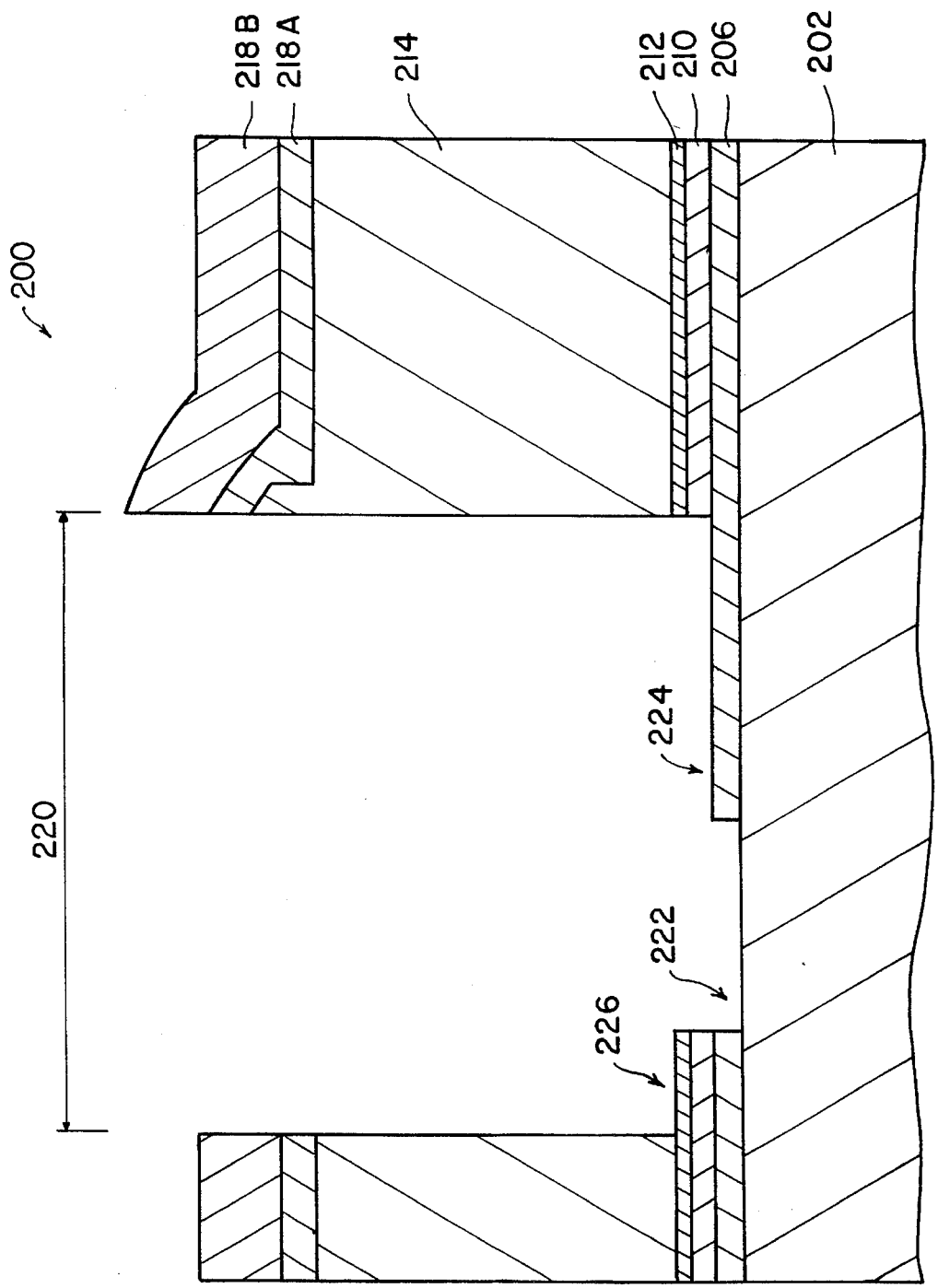

Referring now to FIG. 14, cell division can be accomplished by dividing the panel into individual cells in an interconnection region 220. A first division cut is made into interconnection area 220, preferably by sandblasting. Normally, it is difficult to sandblast through the bottom electrode film layers 206 and the secondary n-type film layer 210, particularly when those are tin oxide layers as previously discussed. Sandblasting through the primary n-type film layer, such as a cadmium sulfide layer, may also be difficult. In one embodiment, however, a pre-pre-resist line, as previously described, can be placed between the base substrate 202 and the bottom electrode film layer 206 to facilitate a sandblast cut down to base substrate 202. This is possible because of the properties of the pre-pre-resist material, including low density and friability, as previously discussed.

Therefore, due to the shock of the sandblast procedure, pre-pre-resist material will tend to structurally deteriorate and to break apart, thereby making the overlying film layers susceptible to breakage and removal by sandblasting. Likewise, in one embodiment, as previously described, a pre-resist line can be placed between the bottom electrode film layer 206 and the secondary n-type film layer 210. Again, structural deterioration of the pre-resist layer makes the overlying layers susceptible to easy removal by sandblasting, or by other mechanical means. It should be recognized that, unlike the clean cuts shown in FIG. 14, sandblast cuts will not be at perfect right angles. Also, not all of the pre-pre-resist and/or pre-resist material is removed. Sufficient material must be removed to obtain access to the underlying film layer, but typically some material will remain.

The pre-resist lines thereby provide access to the top of the bottom electrode film layer 206. Use of a pre-resist has been found to be particularly advantageous due to the difficulty and expense of otherwise obtaining an accurate cut to the top of the bottom electrode layer 206 through the secondary n-type film layer 210. Although sandblasting cuts are preferred, because of their ease and relatively low expense, such a sandblast cut would be impractical in the absence of a pre-resist material. Alternatively to using a pre-resist material 208, however, a laser ablation could be made to the surface of the bottom electrode film layer 206, but at an added expense.

As seen in FIG. 14, a first division sandblast cut using both a pre-pre-resist line and a pre-resist line can be made to cut through the first top electrode layer 218A and 218B (e.g., graphite), the p-type semiconductor film layer 214 (e.g., cadmium telluride) and to the top of or into the primary n-type semiconductor film layer 212 (e.g., cadmium sulfide) in the area 226. The area 222, formerly under the pre-pre-resist line, is open to the top of the base substrate 202 and the area 224, formerly under the pre-resist line, is open to the top of the first bottom electrode layer (e.g., high conductivity tin oxide). As noted previously, however, typically not all of the pre-pre-resist and pre-resist materials are removed from areas 222 and 224.

Interconnection area 220 may be about 39 mils wide, with area 226 being about 9 mils, area 222 being about 12 mils, and area 224 being about 18 mils wide. As discussed previously, however, in one embodiment, commercial float glass can be obtained already having deposited thereon a high conductivity tin oxide for use as a bottom electrode film layer 206. In that case, a pre-pre-resist strip will not be utilized. As mentioned, sandblasting through a tin oxide layer to provide a division area 222 down to the substrate 202 is impractical. Therefore, when pre-pre-resist lines 204 are not used, then following the first division sandblast cut, another, second cut, is required to produce the division area 222 down to substrate 202. That cut may be made, for example, by a laser.

Figure 15:
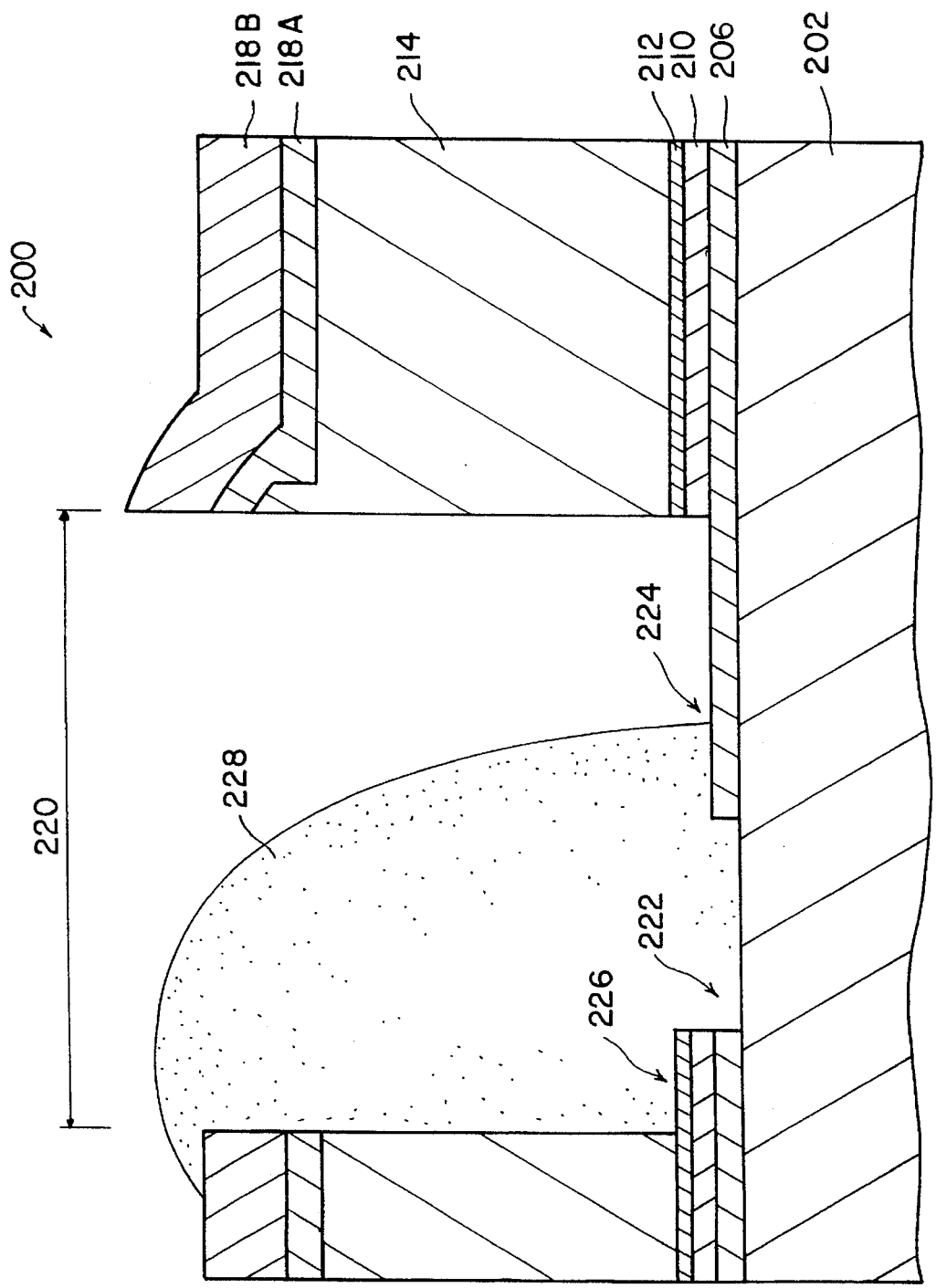

Referring to FIG. 15, following division of the panel into a plurality of individual cells, as just described, a line of permanent resist material 228 is formed in the interconnection region 220 as shown. Preferably, the permanent resist line 228 overlaps the first top electrode film layers 218A and 218B and extends into the interconnection region 220 to overlap with the exposed first bottom electrode layer 206 in region 224.

The permanent resist line 228 can be any material that will provide electrical insulation to prevent shunting paths that would interfere with proper operation of interconnected cells. In one embodiment, the permanent resist material comprises titanium dioxide powder, a binder, such as ethyl cellulose, in a proper carrier liquid for deposition, as previously discussed.

The carrier liquid should evaporate fast enough for practical use. However, it has been found that if the liquid carrier evaporates at too fast a rate, then there is a detrimental effect on low-resistance interconnection to a later-applied top electrode film layer due to microscopic cracks exiting on the resist. One carrier liquid that has been found to be particularly advantageous is hexanol, although other medium weight alcohols, such pentanol and heptanol, can also be used as carrier liquids. Any other solvent in which a suitable binder is soluble and which provides satisfactory volatility to achieve a proper drying rate would also be satisfactory. For deposition, the ethyl cellulose can be placed in solution in the hexanol and titania powder can be mixed in, and the mixture can be deposited, such as through a small diameter tube or needle, similar to deposition of pre-pre-resist and pre-resist materials, as previously discussed. Preferably, the mixture is filtered and centrifuged to remove air pockets prior to deposition. A similar procedure can also be followed for deposition of pre-pre-resist and pre-resist materials.

In one embodiment, the substrate is then heated, preferably in a substantially inert environment such as in a nitrogen atmosphere, to a temperature of from about 200° C. to about 300° C., and preferably to about 210° C. for a sufficient time, such as for about 55 minutes, to allow for diffusion of intercalated molecules out of the intercalated graphite in the ohmic contact film layer 218A and 218B, as previously discussed. In one embodiment, the rate of temperature rise is controlled for adequate curing of the permanent resist material.

Figure 16:
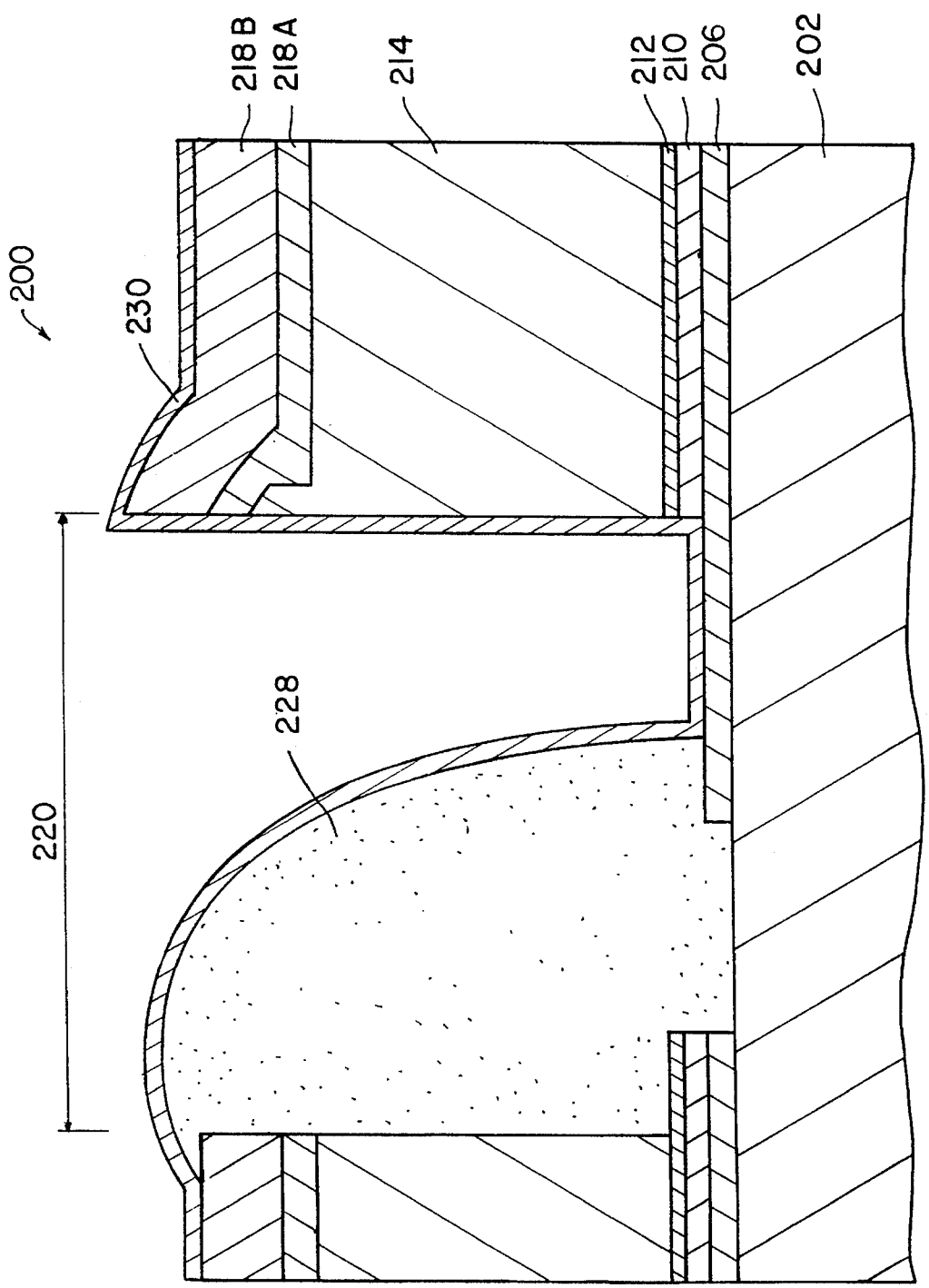

Referring now to FIG. 16, a substantially continuous top electrode layer 230 is formed over the entire panel, including over the interconnection region 220. The top electrode film layer 230 is preferably a conductive metal, and more preferably comprises multiple sublayers of conductive metal such as a sublayer of a conductive alloy, such as a nichrome alloy comprising nickel and chromium, and a layer of tin. Such materials can be placed on the panel by evaporation deposition, with nichrome being deposited first in a sublayer approximately 75 angstroms thick followed by a tin sublayer, which may be deposited in two steps, to a thickness of approximately 1 micron. When tin oxide is used for the bottom electrode film layer, the first sublayer of a top electrode film layer is preferably made of a conductive material that forms a barrier to oxygen depletion of the tin oxide layer, with which the top electrode film layer makes contact for series interconnection of cells. This oxygen depletion barrier is particularly important when materials, including aluminum and tin, that have a propensity to deplete a bottom electrode film layer of oxygen are used in a top electrode material, such as in a second sublayer, as discussed. The first sublayer also should provide good adhesion for placement of the second sublayer, which is preferably made of tin. A nichrome alloy, having nickel and chromium, has been found to provide good adhesion and a good oxygen depletion barrier. Any nickel or chromium based metal or alloy may be used for such a first sublayer of a top electrode film layer.

Figure 17:
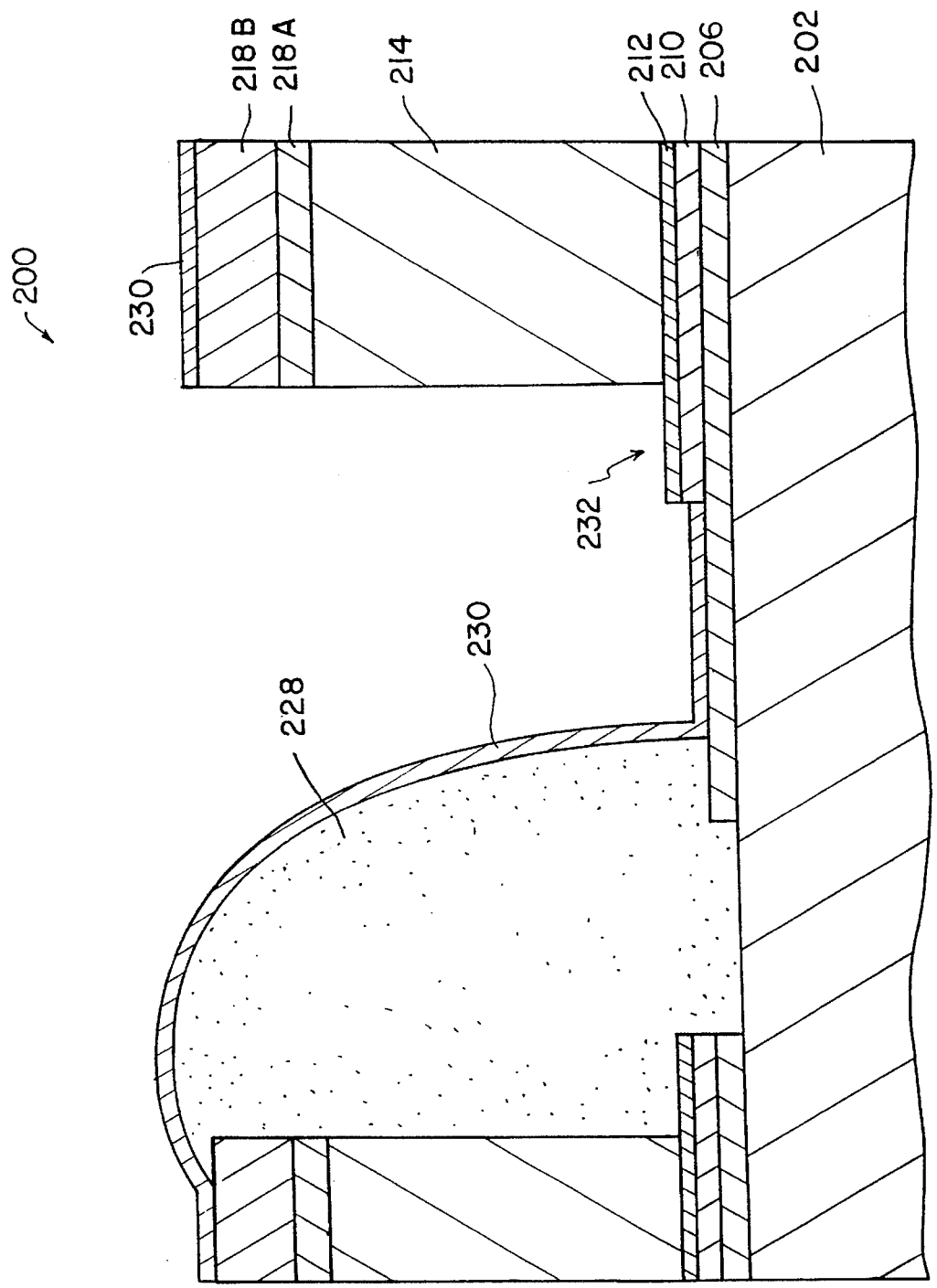

Referring now to FIG. 17, a completed interconnection region is shown. A final division cut is made in region 232 to complete the cell division and interconnection process. This final cell division and interconnection cut is preferably made using a sandblaster, which provides inexpensive and efficient isolation of the top electrode film layer and preferably down as far as the top of the primary n-type film layer 212 (e.g., cadmium sulfide) as shown, but in any event at least into the p-type film layer 214 (e.g., cadmium telluride). The cut can also be made by a laser. In a preferred embodiment, the panel has 58 series interconnected cells.

Figure 20:
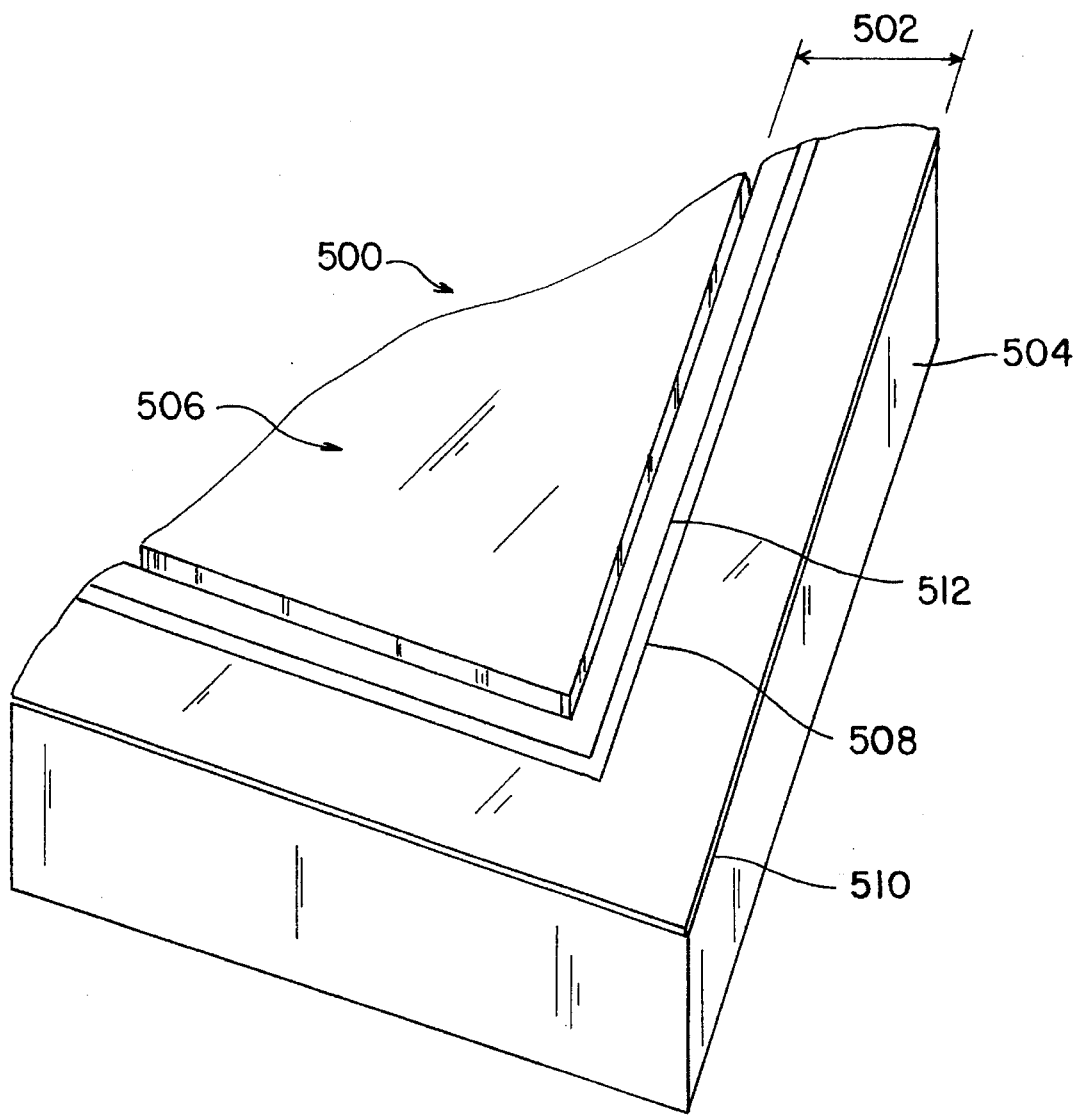
FIG. 20 is a partial perspective view of a substrate showing border edging and panel isolation.

In one embodiment, a substrate is electrically isolated from its external periphery by placing an electrical isolation area around a photoactive area on the substrate. FIG. 20 shows a partial view of one embodiment of a substrate 500 which may contain all of the film layers as previously described, on a base substrate 504. Preferably, the substrate 500 has been divided into a plurality of cells that are interconnected in series, as previously described. A border region 502 is placed around the perimeter of the entire substrate 500. In one embodiment, the entire border region 502 is an area where all film layers have been removed from the substrate 500 down to the base substrate 504, which is preferably glass. Such a border region 502 provides a surface for sealing during encapsulation, and also, preferably, electrically isolates the photoactive area of a substrate from its peripheral edge. Although border region 502 is shown extending to the edge of substrate 500, it is not necessary that a border region extend all the way to the edge of a substrate. Region 506 is an area of the substrate 500 from which film layers have not been removed and region 506 comprises at least part of what will be an operative, photoactive region of an operating photovoltaic module.

Border region 502 can be manufactured by any suitable means, such as by sandblasting or by using a high performance grinding wheel or brush. However, due to potential difficulties controlling such a grinding wheel, a presently preferred method is removing by sandblasting a secondary n-type film layer and a bottom electrode layer, which both typically comprise tin oxide, as previously discussed. In one embodiment, film layers are removed to form border region 502, except that one or more of the secondary n-type film layer and the bottom electrode film layers, as depicted as layer 510, have not been removed. This embodiment facilitates the use of relatively easy and inexpensive sandblasting or grinding to remove film layers to affect placement of border region 502 while still providing an adequate surface for sealing during encapsulation. Typically the border region 502 is approximately 0.5 inch wide, and more preferably is about 0.520 inch wide, but will vary based on the encapsulation method used. The width of a border region should be minimized to provide for maximum total active area for generating power.

In one embodiment, a border resist strip can be used to facilitate removal of film layers to form border region 502. A border strip of resist material can be placed around the perimeter of a substrate with the approximate border resist strip width being approximately that width desired for border region 502. Resist materials can comprise any suitable resist material for use as pre-pre-resist lines, pre-resist lines, or permanent resist lines, and should preferably have the properties, including friability and impermeability, as previously discussed. Preferably, the border resist strip is placed on a substrate prior to forming a bottom electrode film layer, thereby providing access through subsequent film layers to the top of base substrate 504. In such a case, a border resist strip could be formed at the same time that pre-pre-resist lines are formed. Alternatively, a first bottom electrode, such as high conductivity tin oxide, already deposited on a base substrate could be removed from the desired border region and a border resist strip could then be applied prior to subsequent film layers, thereby providing access to the base substrate 504. A border resist strip, if used, and overlying film layers are preferably removed to form border region 502 by use of a simple and inexpensive sandblast process. In one embodiment, a border resist strip could be in the form of a line, which upon removal would result in isolation lines similar to isolation cuts, as previously described.

As noted, border region 502 serves two functions. First, it provides an area where a seal may be formed for encapsulation purposes. Second, it provides for electrical isolation of the substrate. When border isolation region 502 has been removed down only to the top of a tin oxide layer, as discussed, then it is necessary to provide some additional means for electrical isolation. Such electrical isolation can be effected by making an isolation cut 508 through the remaining tin oxide layer or layers down to the glass substrate 504. Although only one isolation cut 508 is required, a second isolation cut 512 may also be made for added protection. Additional isolation cuts in excess of two could also be provided. The electrical isolation provided should be sufficient so that there is no more than 50 microamps of current leakage across all isolation cuts that are between the photoactive area and the peripheral edge of the substrate or module (e.g., 508 and 512 as shown) when a voltage of 1500 volts is applied across such isolation cuts.

Border isolation cuts 508 and 512 can be made by a laser. Surprisingly, however, it has been found that a good border isolation cut can be made by sandblasting if a hard blast media, such as silicon carbide, is used. Preferably, each isolation cut has a width of at least about 30 mils, and more preferably each isolation cut has a width of at least about 50 mils. In one embodiment, a substrate is encapsulated in the presence of a desiccant to absorb water invading the encapsulated interior space, thereby assisting in maintenance of the electrical isolation across isolation cuts 508 and/or 512. Preferably, the substrate 500 will be encapsulated in some manner such that each of border isolation cuts 508 and 512 are sealed within the interior space of an encapsulated module in a dry surround.

Figure 21A:
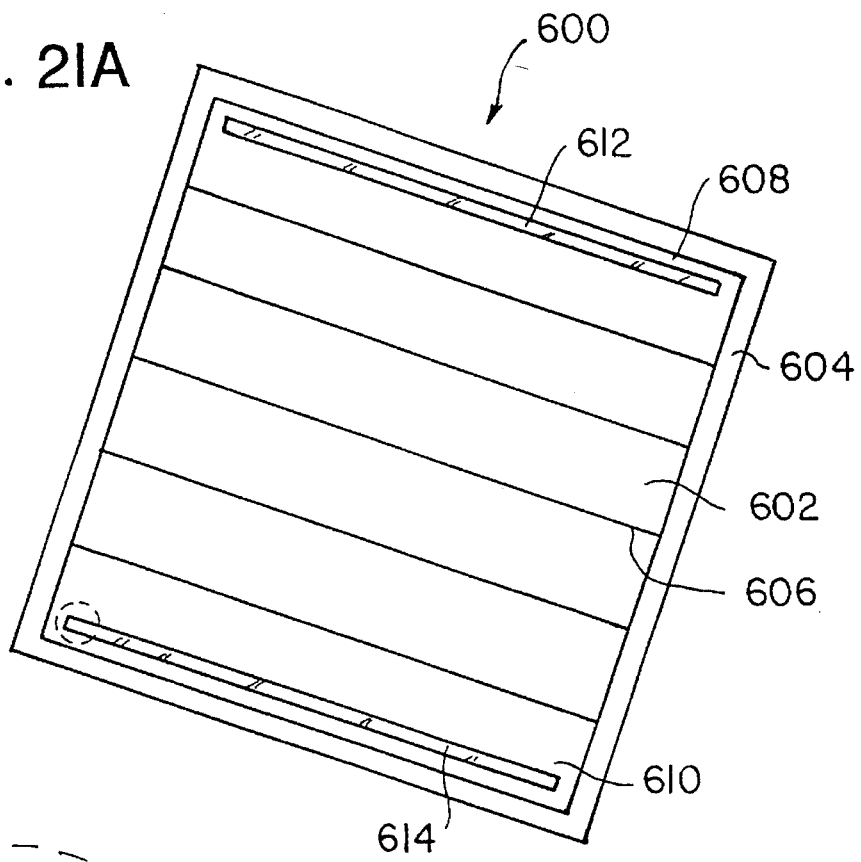
FIGS. 21A and 21B are a top view of a substrate having bus bars attached.
Figure 21B:
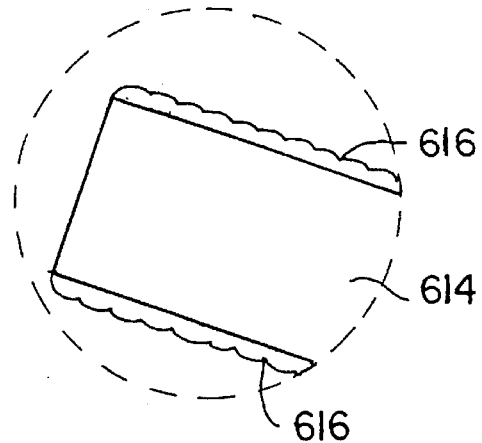

Referring now to FIGS. 21A and 21B, a substrate 600 is shown having a plurality of individual cells 602, and on which a border region 604 has been formed, that preferably would also contain one or more isolation cuts (not shown), as previously described. It will be recognized that the drawing of FIGS. 21A and 21B, as with all previous drawings, is not strictly to scale and are for illustration purposes only. Also, FIG. 21B shows only six individual cells 602 on substrate 600. A substrate according to the present invention could contain any number of cells, and preferably would contain 58 cells.

Each of the individual cells 602 is separated from the next cell and connected in series to the next cell in interconnection regions 606. The outermost cells 608 and 610, representing first and last cells in series connection, are each fitted with a bus bar, 612 and 614, respectively, which preferably are highly conductive metal strips, and more preferably are strips of copper. Often, a completed, testable, substrate fitted with contacting means such as bus bars 612 and 614 is referred to as a photovoltaic module.

Figure 30:
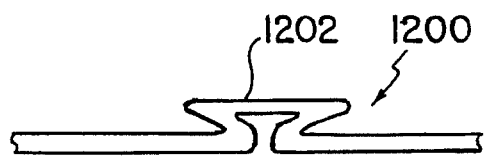
FIG. 30 is a side view of a bus bar showing a thermal expansion crimp.

In one embodiment, bus bars 612 and 614 are adhered to the surface of cells 608 and 610 using any suitable adhesive, such as resins, which may be conductive or non-conductive, and is preferably a pressure sensitive adhesive with low outgassing. Bus bars 612 and 614 may contain crimps laterally across the bus bars to accommodate thermal expansion differences between bus bars 612 and 614 and substrate 600. FIG. 30 shows a partial side view of a bus bar 1200 showing such a thermal expansion crimp 1202.

As shown in the expanded view of bus bar 614 in FIG. 21B, electrical contact between bus bar 614 and cell 610 is ensured by placing a bead 616 of material along the edge of bus bar 614 and that adheres to and contacts with both bus bar 614 and the top layer of cell 610, which is typically the top electrode film layer of cell 610. Such a bead 616 can be placed on one or on both sides of bus bar 610 as shown, and preferably on both sides extending the full length of bus bar 610. Also, bead 616 could surround the entire perimeter of bus bar 614. Although not shown in FIG. 21B, similar beads could also be placed along bus bar 612, which may be similarly adhered to cell 608.

Bead 616 must provide adequate conductivity between cell 610 and bus bar 614. Preferably, bead 616 is made of a conductive graphite. The bead can be formed by placing a graphite paste along the appropriate edge of bus bar 614, which paste will dry to give the proper bead for contacting. Bead 616 is particularly useful when bus bar 614 is fixed to cell 610 by a non-conductive adhesive, since bead 616 will be the only means for electrical conductance between bus bar 614 and cell 610.

Electrical leads can then be attached, such as by soldering, to bus bars 612 and 614, and such leads may be transmitted through a back cover placed on a finished module during encapsulation to provide for connection of the module, such as to an outside electrical grid.

In one embodiment, cell 610 comprises a bottom electrode film layer, a photoactive semiconductor film layer, and a top electrical film layer, the photoactive film layer being capable of absorbing solar energy and generating an electrical current between the top electrode film layer and the bottom electrode film layer. The bottom electrode film layer is preferably a high conductivity tin oxide layer. The top electrode film layer is preferably made of a highly conductive metal or metal alloy such as a nichrome alloy and tin. The photoactive semiconductor film layer preferably comprises a heterojunction between an n-type cadmium sulfide layer and a p-type cadmium telluride layer. Additionally, cell 610 preferably also comprises a secondary n-type film layer, such as a low conductivity tin oxide, between the bottom electrode film layer and a primary n-type film layer, such as an n-type cadmium sulfide layer in the photoactive semiconductor film layer. Cell 610 also preferably comprises an ohmic contact film layer, such as a graphite layer, between a p-type film layer, such as a p-type cadmium telluride layer, and the top electrode layer. In one embodiment, bus bar 614 is attached to the top electrode layer of cell 610. In one embodiment, the top electrode layer of cell 610 acts as a positive electrode for that cell. In such an embodiment, the top electrode layer of cell 608 (which has the most negative potential of the series connected cells) will be used as a negative electrode terminal for the series connected cells. In such a case, cell 608 would be an inactive or "dead," cell and would not contribute to power production of the interconnected cells. In such a case, cell 608 should be made as small as possible to minimize area losses to power production.

Figure 31:
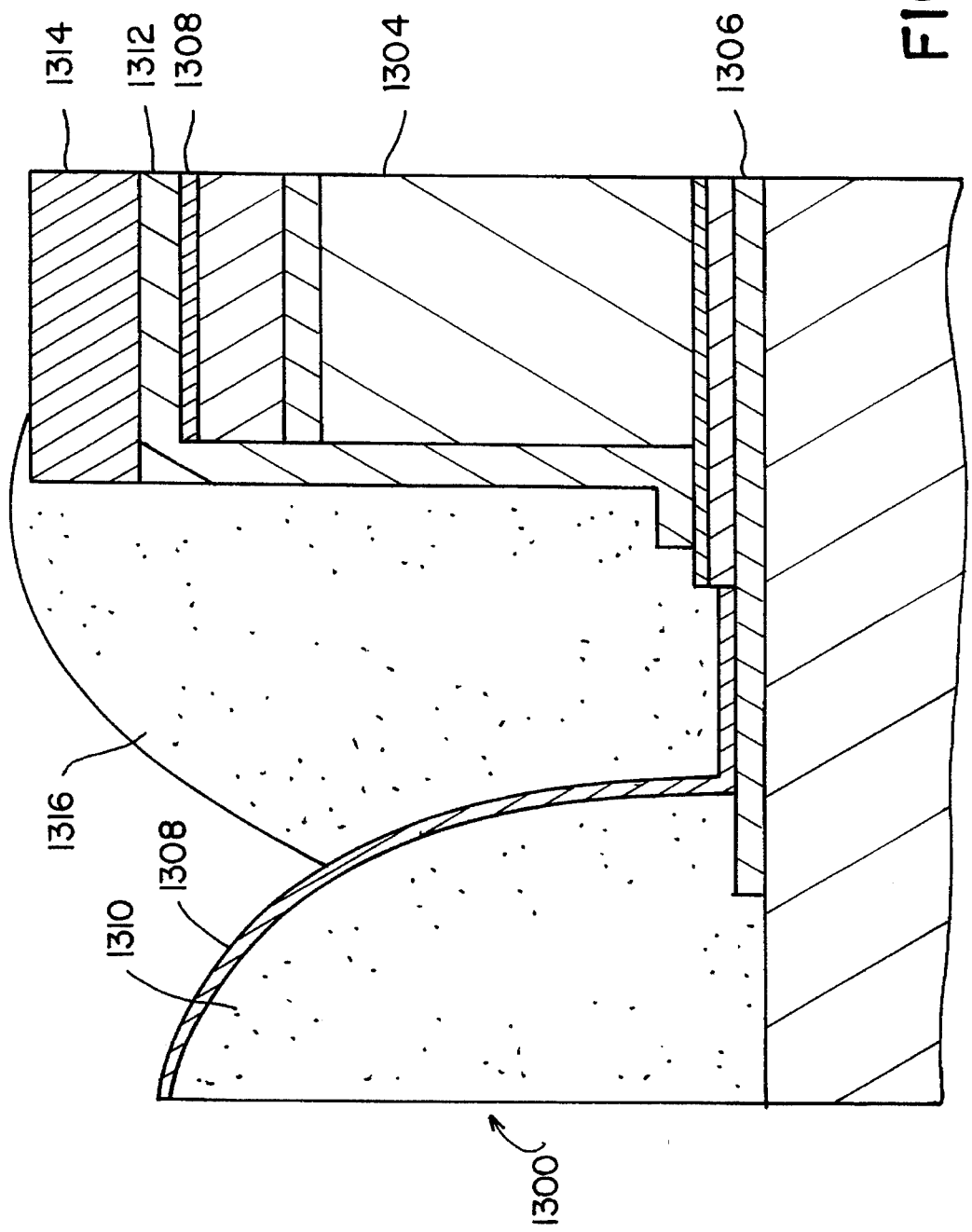
FIG. 31 is a partial cross-section of a substrate showing one method for attaching a bus bar.

In one embodiment, a bus bar can be placed on top of a cell in a manner to avoid the problem with having an inactive cell, as previously discussed. FIG. 31 shows a partial cross-section of a substrate 1300 having a terminal cell 1304 on substrate 1300 which is partially shown. Cell 1304 has the same component film layers as previously described with FIG. 17, and in particular has a top electrode film layer 1308 and a bottom electrode film layer 1306. Cell 1304 may be, for example, a first cell in series on substrate 1300. A terminal permanent resist line 1310 having a top electrode film layer 1308 deposited thereon is also shown and may have been manufactured as previously described. A layer of insulating material 1312, such as an insulating tape, coating, fabric or other insulating material, is placed on top of the top electrode film layer 1308 of cell 1304 and extends down the edge of cell 1304. Bus bar 1314 is adhered to the insulating layer 1312 by any suitable means, such as using a resinous adhesive as previously described. A bead strip of conductive material, such as graphite, as previously described, is placed along the edge of bus bar 1314 and extends down into the interconnection region to provide an electrical contact through the top electrode film layer 1308 that extends over terminal permanent resist line 1310 to bottom electrode layer 1306, thereby providing an electrically conductive path for collecting electrical power generated by cell 1304.

In one embodiment, a module is tested prior to encapsulation for the purpose of ensuring that only quality modules are encapsulated. Such screen testing should, preferably, be simple, fast, and inexpensive. Previously, modules have typically been subjected to testing required to produce a complete I-V plot to test a panel. However, it has been found that a less complex, and less expensive, testing procedure can be used. In particular, a constant voltage can be applied across the module and the current response measured. Preferably, the voltage applied is close to the anticipated maximum power point for the panel. The measured current would then be compared to a threshold current that the module must meet or exceed to pass the screening test. Assuming the module passes the screening test, it could then be prepared for encapsulation and could be encapsulated according to any known encapsulation technique. If the module fails screen testing, it could be set aside for further processing or for disposal.

Following screen testing, a module is ready for encapsulation. The module can be encapsulated by any method which provides adequate protection of the module from deterioration during operation in an outside environment.

Preferably, encapsulation involves a back cover covering the active side of the module and which is sealed around the border regions, as previously described. Also, there is preferably an interior space between the back cover and the module where materials, such as desiccants can be placed near the active area of the module to adsorb and/or absorb water that may invade into the encapsulated space over time, and which could be detrimental to operation of the module.

Figure 22:
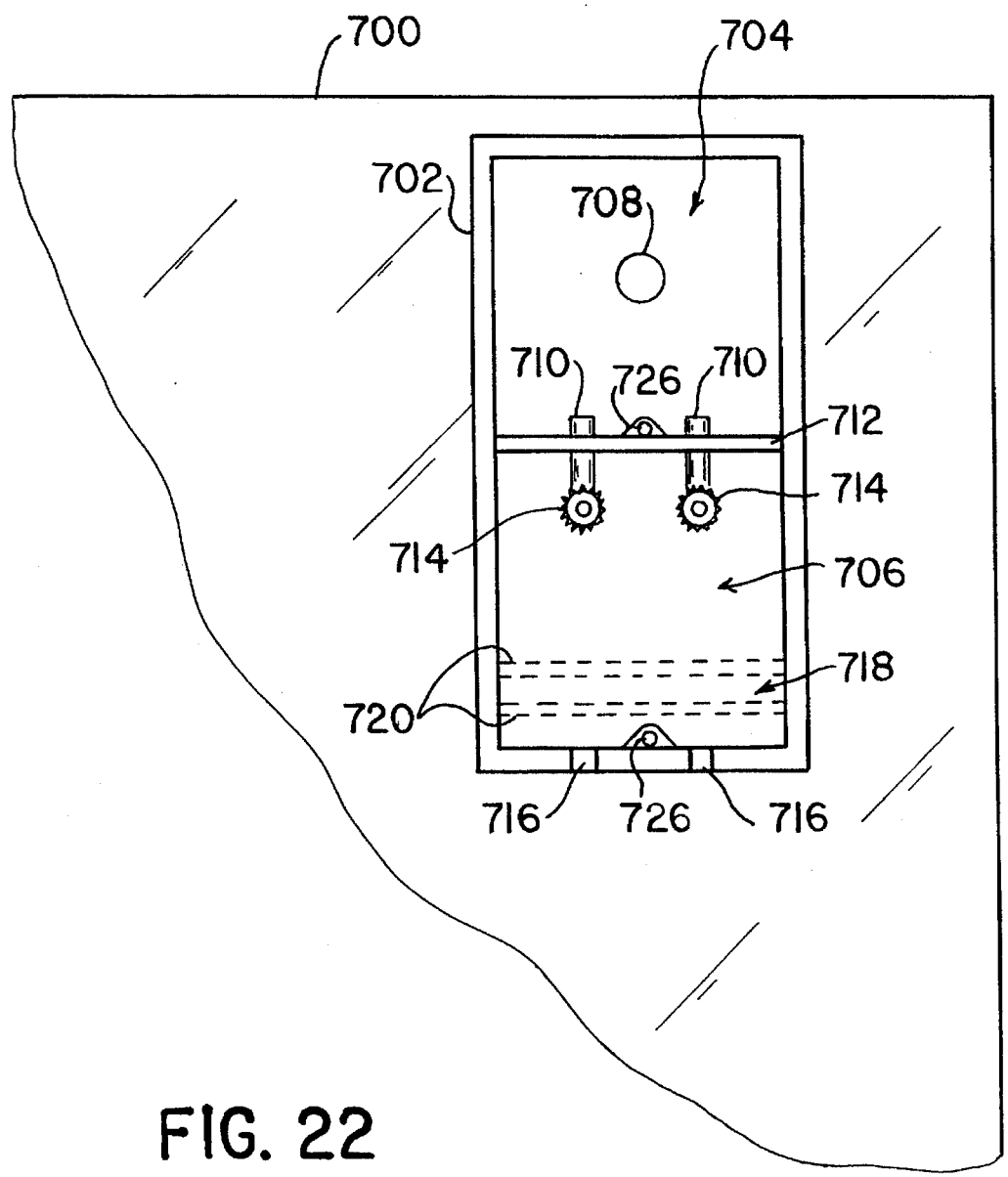
FIG. 22 is a top view of one embodiment of a junction box.

In one embodiment, the present invention provides for sealing around electrical leads exiting an encapsulated module and for providing connection to the module through a junction box. FIG. 22 shows a top view of a portion of a back cover 700 that would cover all the active areas of an encapsulated photovoltaic module. The top side of back cover 700 shown in FIG. 22 is the surface that would face away from the active areas on a substrate during encapsulation, and the bottom side would face toward the active areas on a substrate during encapsulation. Preferably, the back cover is made of glass. Shown attached to the top side of the back cover 700 is a junction box 702 which has two internal compartments 704 and 706. Compartment 704 is open on both the front side of the junction box, which faces away from the back cover, and the back side of the junction box, which faces the back cover. Region 704 is placed over a hole 708 in the back cover, through which electrical leads may exit the encapsulated module. Hole 708 can be placed in the back cover by any suitable means, including use of a diamond drill bit for a rotating soft metal tube with abrasive media applied in the case of a glass back cover, which is preferred. Electrical leads exiting hole 708 can be connected, for example, by soldering to contacts 710 which extend through isolating wall 712 from compartment 704 into compartment 706 of the junction box.

Compartment 706 is open to the front of the junction box but closed to the back of the junction box, which faces the back cover. Electrical connection to the module can then be made using nut connectors 714 on connector posts in compartment 706. Wires attached using nut connectors 714 can exit the junction box through recess areas 716. The wires may be held in place by a resilient material that may be placed in recess areas 716. A cover plate matching the size and shape of the front of junction box 700 could then be provided to protect the internal area of the junction box from the external environment. The cover plate could be placed over the front side of the junction box and could be fastened in place, for example, with screws into screw holes 726. Preferably, the cover plate is sealed to the junction box using a gasket between the cover plate and the top of the junction box.

Figure 29:
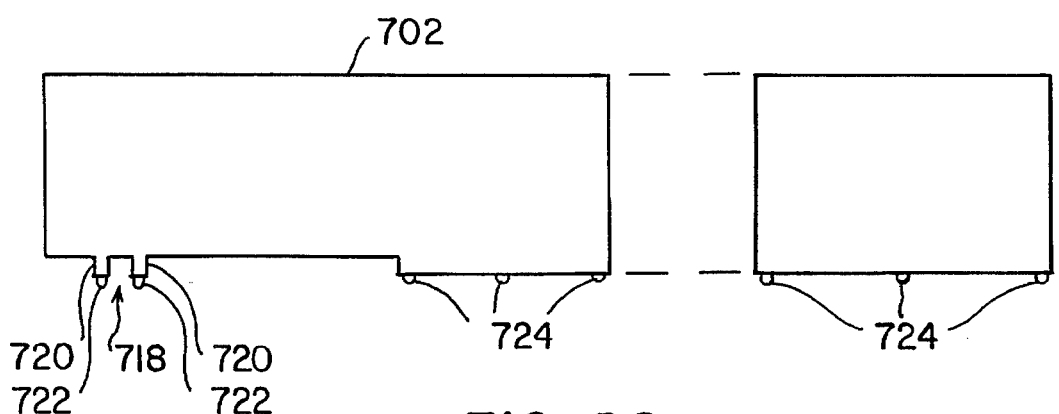
FIG. 29 is a side view and an end view of one embodiment of a junction box.

Junction box 702 can be attached to back cover 700 by using an adhesive, such as a resinous material, placed within an isolated strip area 718 on the back side of the junction box and mating with the back cover. Adhesive strip area 718 is also shown in FIG. 29, which shows side and end views of the junction box. Adhesive strip area 718 is bounded by walls 720 and is sized to accept a strip of adhesive for holding the junction box securely to back cover 700. Protuberances 722, being isolated protuberances, are spaced along walls 720 to maintain an offset between walls 720 and back cover 700. Adhesive in area 718 is then allowed to "squeeze" through spaces formed between the back side of junction box 702 and the top of back cover 700 to enhance the adherence of junction box 702 to back cover 700.

Following contacting of leads exiting hole 708 to contacts 710, hole 708 may be sealed, such as by using a polyisobutylene covered by a foil, such as an aluminum or other metal foil, preferably in the form of a tape, which seals around the exiting leads and the hole 708 by pressure application or, more preferably upon heating and deforming the tape to form a seal. Leads through hole 708 could also be held in place and sealed using a plug, such as of impermeable ceramic, metal, glass or other material, to fill hole 708 around the exiting leads. Integrity of a seal to hole 708 can be improved by filling compartment 704 with a suitable pottant, such as a polyurethane based pottant. Preferably, the pottant has low permeability to moisture and more preferably is impermeable to moisture. During potting, the junction box is held in place by adhesive applied in space 718, as described. Isolated protuberances 724 located on the back side of the wall surrounding area 704 of junction box 702 provide for a space between the top of back cover 700 and the back of junction box 702. Pottant is "squeezed" into this space to improve adherence of junction box 702 to back cover 700 and to improve a moisture impermeable seal around hole 708. Following potting, a cover plate can be placed over junction box 702 and held in place by screws into threaded screw holes 726, as previously described.

Figure 23:
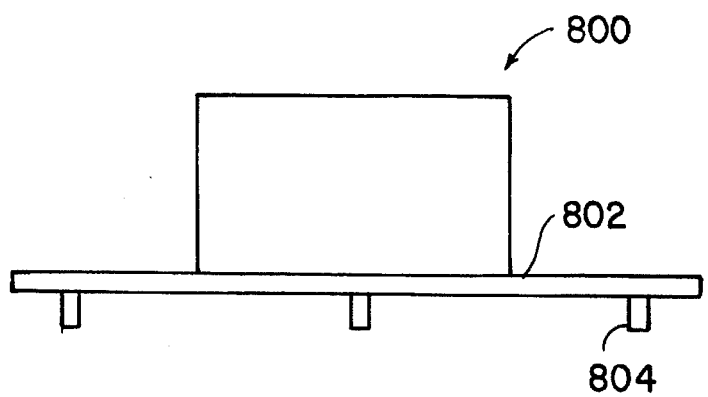
FIG. 23 is an elevation view of another embodiment of a junction box.

FIG. 23 shows an end view of another possible feature that could be included in a junction box design. Junction box 800, could be as previously described, but with a flange-like portion 802 extending around the perimeter of the junction box on the back side of the junction box that would face a back cover. Protuberances 804 on the back side of the junction box, which would be placed against the back cover such that the flange-like portion 802 would be raised off of the back cover. When potting the junction box, as previously described, pottant could then travel under and fill the space below the flange-like portion 802 to provide additional adhesion to hold the junction box to the back cover and also to provide for additional sealing. In one embodiment, the junction box contains only one internal compartment and the junction box could be entirely filled with pottant to seal the entire interior space of the junction box as well as to provide sealing under flange-like portion 802. Using such a single compartment design, all of the interior space of the junction box could be filled with water impermeable pottant, thereby sealing within the potted space all electrical leads into the junction box from the module and out of the junction box for external connection, as well as a hole through the back cover as described. Such sealing of contacts within the junction box with pottant could eliminate the need, and the expense, for using a cover plate over the junction box.

Using a junction box with an area open on the back to a back cover has been found to be particularly advantageous for assisting in sealing an encapsulation of a module, and especially for sealing a hole in the back cover through which electrical leads may exit the interior space of the module to allow for electrical connection to the module. Filling the open area of a junction box covering such a hole with a water impermeable pottant has been found to be very effective in providing a water tight seal, especially in conjunction with a sealing tape over the hole, as previously discussed.

Prior to sealing hole 708, however, it is preferred that a desiccant, such as a molecular sieve or zeolite, be added into a vacant interior space between the back cover and the panel that is accessible through hole 708. The desiccant can be made of any material capable of absorbing moisture that may invade the interior space of the encapsulated module during operation. Preferably, the desiccant comprises a zeolite having pore sizes from about 3 angsttoms to about 10 angstroms in size. The desiccant should be selected based on the vapor pressure of water at the normal operating cell temperature of the module plus 20° C. with a water loading of 2.5 to 7.5 weight percent.

In one embodiment, desiccant can be preloaded with oxygen along with preloading of the internal space in the encapsulated module. Over time, as moisture invades the module, such moisture will displace oxygen out of the molecular sieve, and there will be a prolonged release of oxygen during the life of the module.

Such preloading of the module with oxygen for prolonged feed into the interior space of an encapsulated module has been found to be particularly beneficial in that in the absence of such oxygen, a performance degradation of cadmium telluride photovoltaic cells is experienced as oxygen surrounding cadmium telluride grain boundaries diffuse out of the cadmium telluride layer and into the internal space of the module. By providing an internal supply of oxygen, such degradation effects are reduced. In one preferred embodiment, the oxygen can be preloaded at a high temperature so that upon cooling, a vacuum is formed in the internal space relative to atmospheric pressure.

Other materials could also be preloaded into the internal space of an encapsulated modules. In one embodiment, a gas, such as carbon dioxide, can be added into the interior space along with a molecular sieve at an elevated temperature. Upon cooling of the module, contraction of the gas and/or adsorption of the gas by the molecular sieve could be used to create a vacuum pressure in the module, which could be useful for collapsing an encapsulation back wall such as might be made of a metal foil, if desired.

In one embodiment, oxygen is preloaded into an internal encapsulated space to provide a high concentration of oxygen in the internal space to prevent oxygen from a p-type cadmium telluride layer from diffusing away from that film layer. As noted previously, adsorbed oxygen on the cadmium telluride appears to have a passivating effect. Such oxygen can be preloaded by, for example, preloading a desiccant as previously described.

In one embodiment, desiccant can be used to adsorb and deactivate impurities in addition to absorbing water. Such impurities could be, for example, hydrocarbons or other organic vapors emitted within the interior space of the encapsulated module during operation. Such impurities can be adsorbed into, for example, a zeolite having a proper pore size. In one preferred embodiment, at least two different zeolites are placed into the interior space of the encapsulated module. A first zeolite has a pore size, such as approximately 3 angstroms, for preferentially adsorbing water. A second zeolite would have a larger pore space that would be more conducive to adsorbing larger impurity molecules, such as organic vapors. Such a second zeolite might have a pore size, for example, of approximately 10 angstroms.

In one embodiment, film layers, including high conductivity and low conductivity tin oxide layers, and cadmium sulfide layers, can be deposited by spray deposition, such as by spray pyrolysis, using a spray head that traverses laterally across a substrate as the substrate moves longitudinally in a direction perpendicular to the direction of the spray head traverse. It has been found, however, that production of photovoltaic panels can be improved, and particularly can be improved in the deposition of film layers by spray deposition, by providing a spray head that traverses laterally across the substrate at a variable speed, rather than at a fixed speed as is usually done.

In one embodiment, the traversing head moves laterally across the substrate, with the velocity of lateral movement relative to the substrate being dependent upon the lateral position of the spray head over the substrate. Preferably, the spray head moves at a slower lateral velocity nearer the edges of the underlying substrate then the lateral velocity of the head near the center of the underlying substrate. Such a variable speed traverse allows depositing a film layer with reduced overspray and with enhanced throughput for a given spray system.

Figure 24:
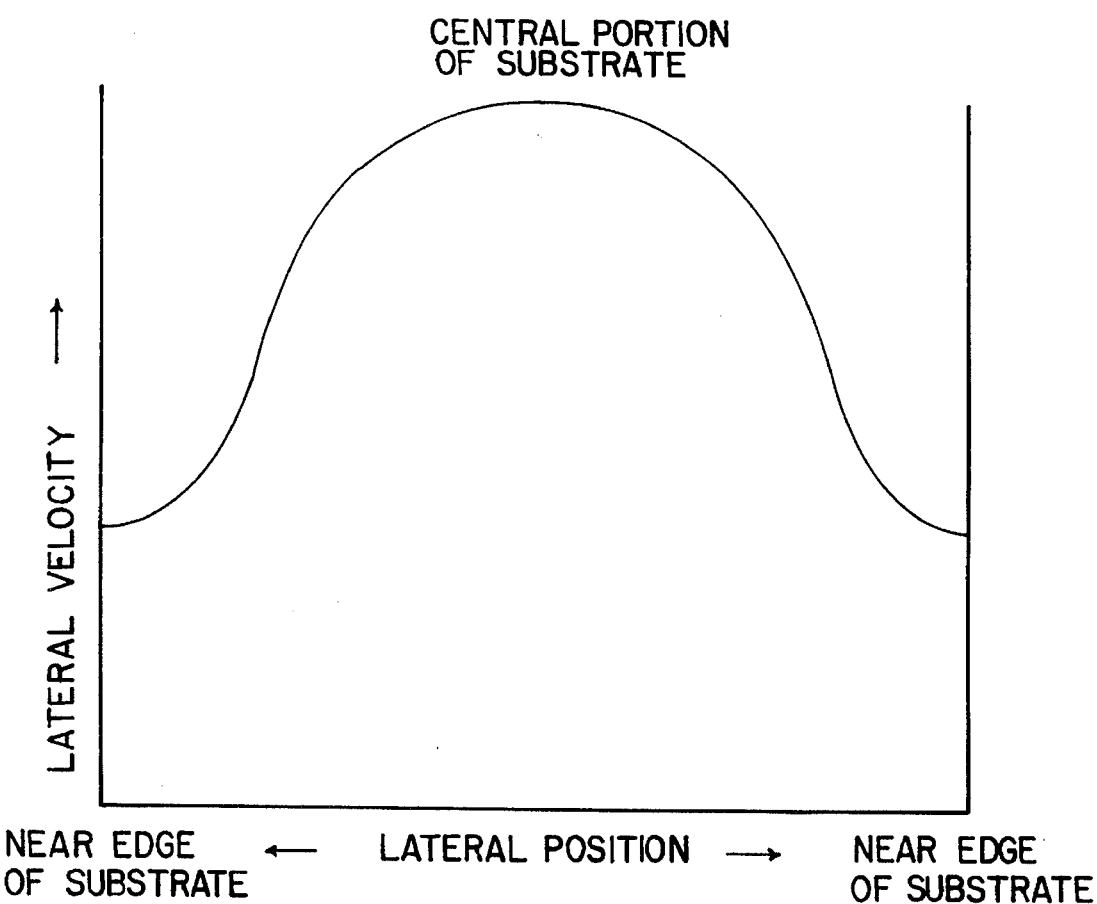
FIG. 24 is a plot of a velocity profile for a variable speed traverse of a spray head.

FIG. 24 shows a plot of a traversing head lateral velocity versus lateral position over the substrate according to one embodiment of the invention. The actual velocity at any given point, and the maximum and minimum velocities, will depend upon the rate of travel of the substrate passing under the spray head, the type of material being sprayed, the volume of material exiting the spray nozzle, and various other parameters such as temperature, reaction rate of spray pyrolysis, etc.

Such a variable speed traverse has been found to be particularly effective in depositing tin oxide layers, either high conductivity or low conductivity. One particular advantage of the variable speed traverse in the manufacturing context, as noted, is that less spray material is lost to overspray at the edges of the substrate. This is important in reducing manufacturing costs and also provides an advantage in that there are fewer materials to be recycled and/or to be disposed of as waste.

The variable speed of the traverse can be accomplished, for example, by propelling the spray head using a variable speed motor, with input to and positioned output of the motor dependant upon an electrical signal received from a processing unit programmed with a velocity profile.

In one embodiment, multiple narrow, linear, elongate portions of substrates are processed using single or multiple processing tools and/or single or multiple longitudinal processing passes along a substrate, such as to effect physical or chemical alteration of a processed area or areas. Such processing could include, for example, depositing pre-pre-resist lines, pre-resist lines, and/or permanent-resist lines. Such processing could also include removing material from processed areas, such as, for example, making division cuts by sandblasting or using lasers. Such division cuts could include a first division sandblast cut, a laser isolation cut, and a second division sandblast cut, all as previously described.

Figure 25:
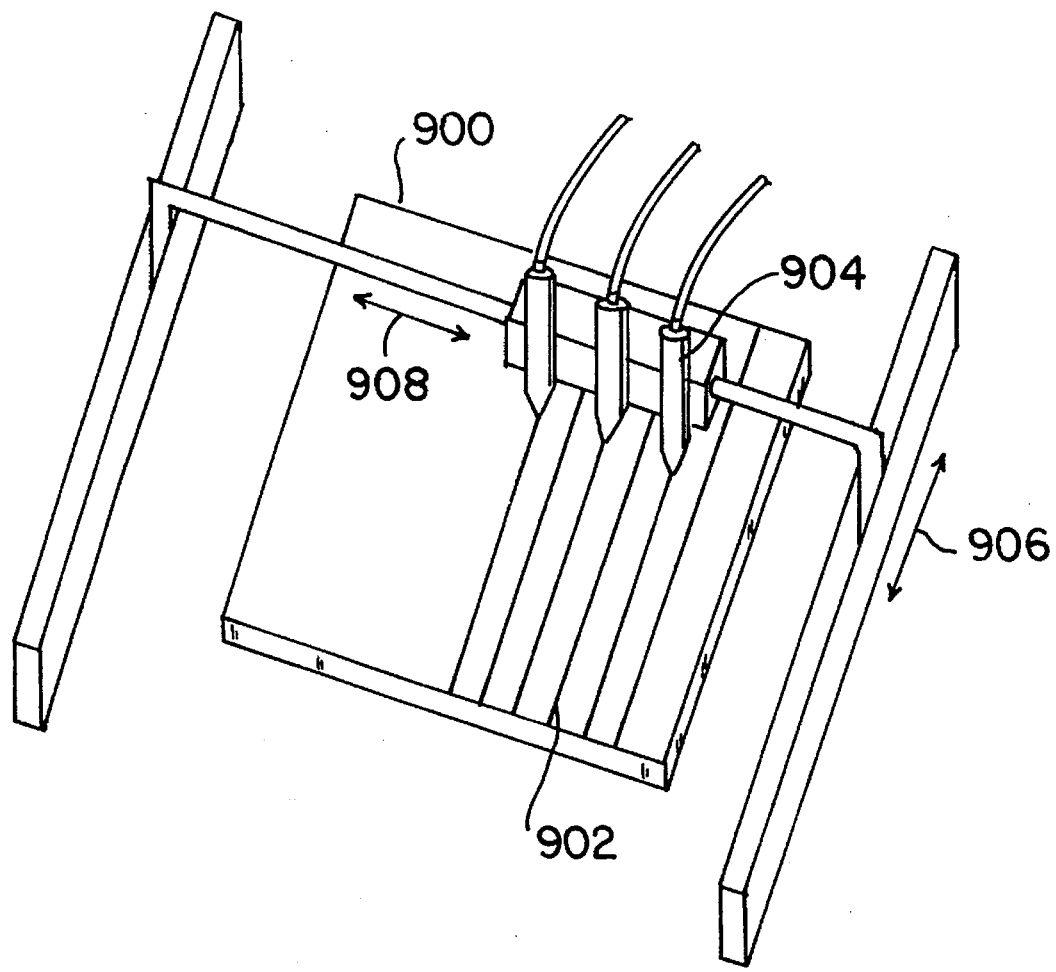
FIG. 25 is a perspective view of tools used for processing narrow, longitudinal regions of a substrate.

Referring to FIG. 25, one embodiment of the present invention will be described. A substrate 900, which is held stationary, and which may have one or more film layers placed thereon, as previously described, is processed by performing some processing operation on elongate narrow linear portions, or lines, 902 using processing tools 904, which could be, for example lasers, sandblast heads, or deposition heads, such as those extruding resist materials through small diameter tubes or needle-like tips.

Although FIG. 25 shows a bank of three processing tools arranged together, a bank of any number of processing heads could be used. Alternatively, one tool could be used alone that has one or multiple processing heads or portions for processing one or more longitudinal strips at a time. In one embodiment, a bank of six evenly spaced processing tools are used.

Processing tools 904 could contact the substrate, but preferably are positioned at some distance off of the substrate. During processing of linear portions 902, processing heads are moved in a longitudinal direction as shown by arrow 906, preferably from one longitudinal edge of the substrate to the other longitudinal edge, thereby processing linear portions 902 as shown. As noted, multiple processing tools arranged in a bank are moved as a unit to process multiple linear areas 902. However, it is possible that only one processing head could be used alone, if desired.

Following one processing pass along longitudinal direction 906, the tools 904 are translated in a transverse direction as shown by arrow 908 for processing additional linear portions 902. In this fashion, processing heads are repositioned laterally across the substrate to process additional longitudinal strips 902.

It will be noted that processing tools 904 are translatable in both the longitudinal direction 906 and in the transverse, or lateral, direction 908, thereby allowing for precise processing of longitudinal strips 902 across the substrate without moving the substrate. Such processing of a stationary substrate provides for better control of precise processing than having a moving substrate with heads fixed in either, or both, the longitudinal or lateral directions.

Preferably, the processing of lines 902 and the lateral movement across the substrate occurs automatically, and is controlled by an electronic processor which determines the location of processing and the processing sequence. With an automatic loader and unloader for loading substrates onto and unloading substrates off of a stationary platform for such processing, the processing of multiple lines 902 across the substrate can be incorporated as part of a semicontinuous or a continuous process of manufacture. Processing tools 904 can be attached to and driven by any appropriate driver means for moving such tools 904 in the longitudinal direction 906 and the lateral direction 908.

In one embodiment, materials are sprayed onto a substrate during formation of a film layer during manufacture of a photovoltaic device using a spray head and spray mixture delivery system that prevents materials to be sprayed from coming in contact with metal surfaces, or reduces such contact, which metal surfaces could be corroded or which could otherwise introduce contaminants into the stream to be sprayed. Commercially available nozzles generally have internal metal surfaces which contact spray fluids during spraying operations. Spray mixtures used for deposition of several film layers, such as deposition of tin oxide layers and cadmium sulfide layers, are corrosive and tend to corrode metal surfaces, thereby introducing contaminants into the spray stream.

Figure 26:
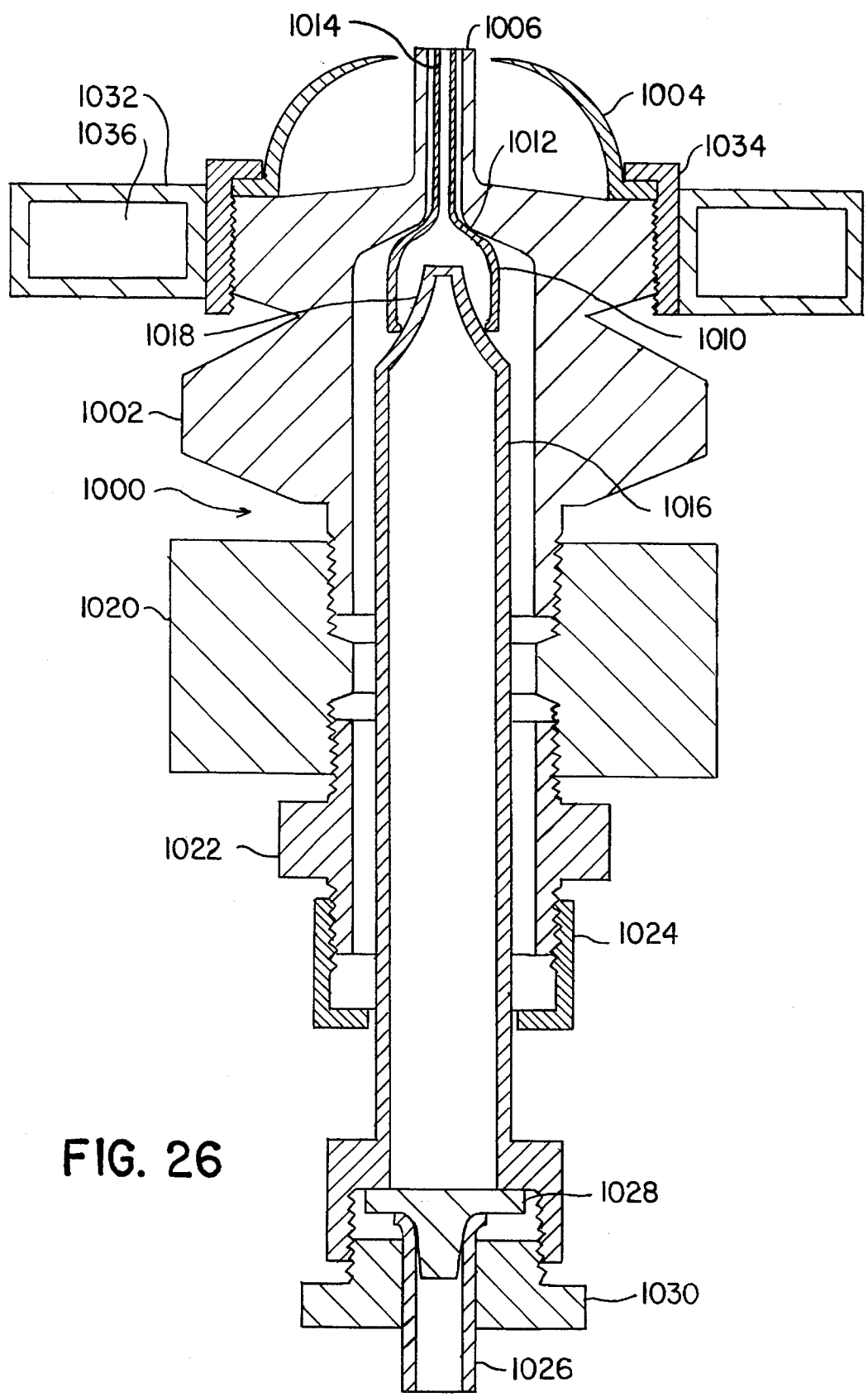
FIG. 26 is a cross-section of a spray nozzle assembly.

One embodiment of a spray nozzle assembly useful in the present invention is shown in FIG. 26. Spray nozzle assembly 1000 has a nozzle body 1002 made of a metal, such as a high strength steel alloy, and an air cap 1004 through which compressed air is passed to atomize and to propel fluid ejected from the nozzle tip 1006 through the opening in the air cap 1008 to effect deposition. A plastic nozzle insert 1010 is inserted into the nozzle body 1002 to mate at shoulder 1012. The plastic nozzle insert 1010 can be made of any suitable plastic and can be a device, such as an intravenous delivery tube, with a small diameter portion 1014 from which spray fluid may be expelled during spraying operations.

Spray nozzle assembly 1000 also has a plastic delivery portion 1016 for feeding spray fluid into plastic nozzle insert 1010. Plastic delivery portion 1016 may be made of any suitable plastic and is similar to a delivery bottle used in intravenous applications, having a tapered insert portion 1018 that inserts into plastic nozzle insert 1010, thereby sealing against plastic insert 1010 during the delivery of fluid.

Threaded into one end of nozzle body 1002 is a coupling 1020, preferably made of metal, and to which is attached a plastic nipple 1022 with a plastic compression fitting 1024 at one end for sealing around the outside of plastic delivery portion 1016. A non-metallic, and preferably plastic, spray delivery conduit 1026 delivers spray mix to plastic delivery portion 1016, for ultimate expulsion from the spray nozzle assembly for deposition on a substrate. Delivery tube 1026 is attached to and sealed with plastic delivery portion 1016, such as with a ferrule fitting having an insert portion 1028 placed in the end of delivery conduit 1026, the walls of which are compressed against the insert portion 1028 by lock-down fitting 1030. Delivery conduit 1026, insert portion 1028, and lock-down fitting 1030 are all preferably non-metallic, and more preferably are all made of plastic.

Using a nozzle assembly, such as shown in FIG. 26, and also using a non-metallic delivery system, including, for example, plastic delivery tubes, spray mixtures may be deposited on substrates without having contact with metal surfaces, from which contaminants may enter the spray mixture, during the spraying operation.

In one embodiment, the present invention provides a process for controlling the temperature of a spray nozzle during deposition, to either heat or cool the spray nozzle as required. In one embodiment, the spray nozzle is cooled, thereby avoiding problems of overheating of a spray nozzle during deposition. Such overheating is particularly a problem during deposition of window layers such as tin oxide and cadmium sulfide, because radiant heating from below the substrate can heat the nozzle to excessive temperatures.

Referring again to FIG. 26, nozzle assembly 1000 has an annular cooling fluid circulating portion 1032 that is attached, such as by welding or soldering, to screw flange 1034 which holds air cap 1004 in place. Cooling fluid circulating portion 1032, is preferably made of metal, such as brass or steel. Cooling fluid can be introduced into annular circulating space 1036 to heat, or preferably to cool, the nozzle during operation.

Figure 27:
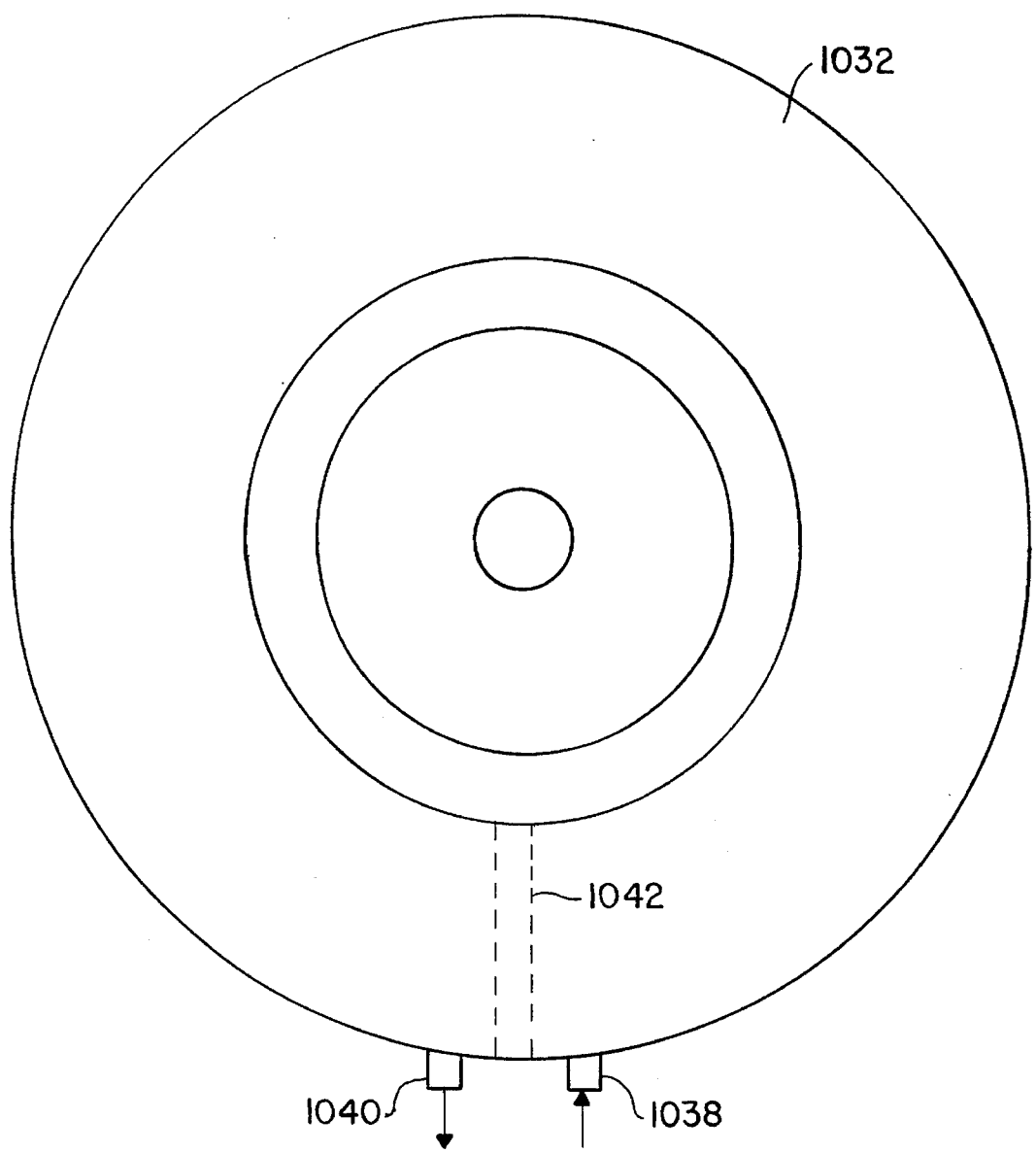
FIG. 27 is atop view of an air cap having means for circulating fluid around the spray nozzle.

FIG. 27 shows a top view of air cap 1004 having annular cooling fluid circulating portion 1032 attached thereto. Cooling fluid, such as cooling water, can be introduced into an annular circulating space of cooling fluid circulating portion 1032 through fluid entry port 1038 and withdrawn through fluid exit port 1040. An interior dividing wall 1042 ensures that cooling fluid circulates through the annular space inside the cooling annular circulating space in the proper manner.

Figure 28:
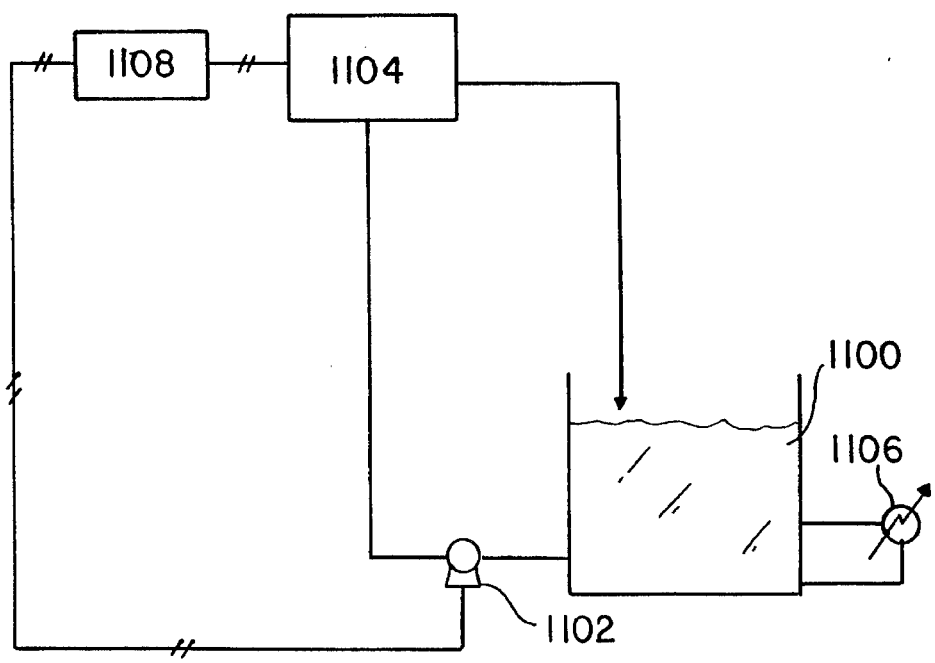
FIG. 28 is a schematic showing a heat exchange circuit for removing heat from a spray nozzle.

In one embodiment, cooling fluid is circulated to a heat exchange mechanism near the tip of a spray nozzle to transfer heat to or remove heat from a spray nozzle during operation. FIG. 28 shows one embodiment. A reservoir 1100 of cooling fluid, such as water, is provided. Such cooling fluid can be delivered via variable speed pump 1102 to a heat exchanger 1104 for exchanging heat to cool a spray nozzle. Following heat exchange in heat exchanger 1104, cooling fluid can be returned to reservoir 1100. Cooling fluid may be withdrawn from reservoir 1100 and cooled, if necessary, in heat exchanger 1106 and returned to reservoir 1100. A temperature sensor may be inserted into heat exchanger 1104 to monitor temperature near the nozzle, if desired. Based on temperature readings, such as by thermocouple, processor 1108 can process temperature information and transmit a control signal to variable speed pump 1102 to vary the rate of flow of circulating cooling fluid for heat exchange purposes. A sufficiently large reservoir of cooling fluid will typically maintain a constant temperature using only ambient cooling, and for many applications, a constant velocity pump will suffice.

In one embodiment, pressure surges or pulsations can be reduced in spray fluid delivered to a spray nozzle during deposition of a film layer, such as a tin oxide or cadmium sulfide layer, by providing a pressure compliance in the fluid feed line to the nozzle. Such a compliance allows for the use of a variety of low cost, positive displacement, metering pumps, and allows the avoidance of expensive double-sided diaphragm pumps and other non-pulsating metering pumps.

Such pulsation damping is accomplished through the use of a compliance, such as use of lengths of highly resilient and elastic tubing which can expand and contract with pump pulsations, and/or by the use of a cloistered air space in fluid communication with the pressurized feed line, and which cloistered air is compressed to absorb the shock of pump pulsations. These compliance means, however, must be accompanied by some restriction in the line which causes some threshold level of pressure drop prior to the spray nozzle, such that pulsations are forced to be absorbed by the compliance means upstream of the threshold pressure drop. For example, a small diameter orifice could be placed in the line between the compliance means and the spray nozzle.

In one embodiment, the conductivity, and therefore the carrier concentration, of a low conductivity tin oxide layer can be affected through heat treatment. Therefore, it is possible to attain the desired conductivity in a low conductivity tin oxide layer, as previously discussed, through heat treatment, either with or without the aid of dopant materials, as previously discussed.

In one embodiment, a low conductivity tin oxide layer can be formed by deposition and reaction of stannic chloride, such as by spray pyrolysis or gas deposition. It has been found that low temperature deposition, such as deposition temperatures below about 400° C., result in higher resistivity, and therefore lower conductivity, than deposition at high temperatures, such as those above about 520° C. Furthermore, the conductivity of the deposited material can thereafter be reduced further by subsequent heat treatment at a higher temperature, preferably above about 500° C., and more preferably above about 550° C. Such heat treatment may be in an oxidizing or in a reducing atmosphere. Preferably, such stannic chloride deposition occurs at about 300° C. to about 400° C., and more preferably at about 350° C. Subsequent heat treatment, if used, preferably occurs at from about 500° C. to about 600° C., and more preferably at about 550° C. for approximately 1 hour. In one embodiment, the low deposition temperature may be followed by a subsequent heat treatment. Such a process has been found to result in a low conductivity tin oxide layer that meets the requirements of the present invention, as previously discussed.

In another embodiment, a low conductivity tin oxide layer can be formed by spray pyrolysis from undoped stannous chloride by increasing the temperature of deposition otherwise used for depositing low conductivity tin oxide with dopant, such as cadmium dopant as previously discussed, by at least about 25° C., and preferably by at least about 50° C. In one embodiment, the deposition temperature for forming undoped low conductivity tin oxide is above about 450° C., preferably above about 475° C., and most preferably from about 460° C. to about 500° C. Such high temperature deposition may result in substantially reduced conductivities suitable for use as a low conductivity tin oxide film layer according to the present invention, as previously discussed.

In combination with adjustment of resistivity through deposition temperature and/or subsequent heat treatment, dopant can be added to additionally promote the desired conductivity. However, adjusting conductivity using heat treatment is desirable to avoid the cost, complexities, and limitations of identifying and using dopants.

In one embodiment of the present invention, the quality and sharpness of sandblasting cuts can be improved through proper qualification of blasting materials, particle size, and particle shape. Through such a process, it is possible to use sandblasting for applications, such as for performing an isolation cut with silicon carbide material as previously discussed.

In one embodiment, the size grains are first determined that are required for a particular blasting operation. Size distribution of particles is also specified. Such particle size and size distributions are than ensured by careful classification of particles to the proper mesh sizes. In one embodiment, the shape of the particles is determined for specific applications, for example, to remove particularly hard layers, such as removing tin oxide layers, it may be preferable to use sharp or angular particles as opposed to rounded particles. For removing softer material or more friable material, however, rounded particles may provide an advantage in that they do not wear as quickly and do not need to be replaced as quickly. In one embodiment, a material is selected based on the absorbability of water on that material. The ability of a material to adsorb water effects sandblasting operations by limiting the flowability and therefore the precision with which the blast media is fed to a precision tip for sandblasting.

While the invention has thus been described in terms of specific embodiments which are set forth in detail, it should be understood that this discussion and the drawings which form a part of this disclosure should not be understood as limiting this invention. It should be recognized that every aspect and every embodiment of the present invention can be combined in any combination with any other aspect or embodiment. Various alternative embodiments and operating techniques will also become apparent to those skilled in the art in view of this disclosure. The invention should thus be understood to include various embodiments not described herein, and the invention is limited only by reasonable construction of the claims attached hereto in view of this disclosure.

What is claimed:

1. A photovoltaic cell comprising:

an n-type polycrystalline layer;

a p-type polycrystalline layer adjoining the n-type polycrystalline layer and forming a photovoltaic junction therewith, the p-type polycrystalline layer including at least a planar layer portion consisting essentially of relatively large crystals adjoining the n-type polycrystalline layer, wherein the relatively large crystals have a mean diameter of from about 1.5 microns to about 3.0 microns;

the planar layer portion including oxidized impurities to obtain p-type electrical properties for the planar layer portion; and each of the relatively large crystals having a planar surface in substantially planar engagement with an interface surface of the n-type polycrystalline layer.

2. A photovoltaic cell of claim 1, wherein the p-type polycrystalline layer further includes a porous layer portion opposing the n-type layer with respect to the planar layer portion, the porous layer portion consisting essentially of crystals having a mean diameter smaller than the relatively large crystals within the planar layer portion, and the porous layer portion having a porosity greater than the poresity of the planar layer portion.

3. The photovoltaic cell of claim 2, wherein the planar layer portion is formed by an oxidation gradient through the thickness of the p-type layer which retards a recrystallization flux during annealing to initiate nucleation during recrystallization within the planar layer portion of the p-type layer.

4. The photovoltaic cell of claim 2, wherein said porous layer portion comprises cadmium telluride crystals having a mean diameter of from about 0.5 to 2 microns.

5. The photovoltaic cell of claim 2, wherein the porosity of said porous layer portion is from about 20% to about 45%.

6. The photovoltaic cell of claim 1, wherein the p-type layer consists essentially of cadmium telluride crystals.

7. The photovoltaic cell of claim 1, wherein the porosity of the planar layer portion is less than about 30%.

8. The photovoltaic cell of claim 1, wherein said p-type polycrystalline layer includes at least a first portion adjacent said planar layer portion having dissimilar p-type characteristics to said planar layer portion.

9. The photovoltaic cell of claim 8, wherein said first portion has a higher conductivity than said planar layer portion.

10. The photovoltaic cell of claim 8, wherein said first portion has more charge carriers than said planar portion.

11. A photovoltaic cell comprising:

an n-type polycrystalline layer;

a p-type polycrystalline layer adjoining the n-type polycrystalline layer and forming a photovoltaic junction therewith, the p-type polycrystalline layer including at least a planar layer portion consisting essentially of first crystals adjoining the n-type polycrystalline layer;

the planar layer portion including oxidized impurities to obtain p-type electrical properties for the planar layer portion;

each of the first crystals having a planar surface in substantially planar engagement with an interface surface of the n-type polycrystalline layer; and the p-type polycrystalline layer also including a porous layer portion opposing the n-type layer with respect to the planar layer portion, the porous layer portion having a greater porosity than the planar layer portion and the porous layer portion consisting essentially of second crystals;

wherein, the first crystals, of the planar layer portion, have a mean diameter that is larger than the mean diameter of the second crystals, of the porous layer portion.

12. The photovoltaic cell of claim 11, wherein the mean diameter of the first crystals, of the planar layer portion, is from about 1.5 microns to about 3.0 microns and the mean diameter of the second crystals, of the porous layer portion, is from about 0.5 micron to about 2 microns.

13. The photovoltaic cell of claim 11, wherein the porous layer portion has dissimilar p-type characteristics relative to the planar layer portion.

14. The photovoltaic cell of claim 11, wherein the porous layer portion has a higher conductivity than the planar layer portion.

15. The photovoltaic cell of claim 11, wherein the planar layer portion is formed by an oxidation gradient through the thickness of the p-type layer which retards a crystallization flux during annealing to initiate nucleation during recrystallization within the planar layer portion of the p-type layer.

* * * * *